United States Patent [19]
Iwahashi

[11] Patent Number: 6,081,453
[45] Date of Patent: Jun. 27, 2000

[54] NONVOLATILE SEMICONDUCTOR MEMORY DEVICE

[75] Inventor: Hiroshi Iwahashi, Yokohama, Japan

[73] Assignee: Kabushiki Kaisha Toshiba, Kawasaki, Japan

[21] Appl. No.: 09/059,949

[22] Filed: Apr. 14, 1998

[30] Foreign Application Priority Data

Apr. 15, 1997 [JP] Japan ..................................... 9-096894
Oct. 22, 1997 [JP] Japan ..................................... 9-289761
Oct. 28, 1997 [JP] Japan ..................................... 9-295419

[51] Int. Cl.$^7$ .................................................. G11C 16/06
[52] U.S. Cl. ................................ 365/185.22; 365/185.18
[58] Field of Search ......................... 365/185.22, 185.18, 365/185.19, 185.2

[56] References Cited

U.S. PATENT DOCUMENTS

| | | |
|---|---|---|
| 5,068,827 | 11/1991 | Yamada et al. . |
| 5,424,978 | 6/1995 | Wada et al. . |
| 5,523,972 | 6/1996 | Rashid et al. . |
| 5,708,605 | 1/1998 | Sato ..................................... 365/185.18 |
| 5,818,759 | 10/1998 | Kobayashi ........................... 365/185.18 |
| 5,923,585 | 7/1999 | Wong et al. ......................... 365/185.18 |
| 5,949,709 | 9/1999 | Birnie ................................. 365/185.18 |

*Primary Examiner*—Son T. Dinh
*Attorney, Agent, or Firm*—Hogan & Hartson, LLP

[57] ABSTRACT

A nonvolatile semiconductor memory device includes a memory cell having a drain electrically connected to a bit line, a source, a floating gate, and a control gate electrically connected to a word line, a sense amplifier for comparing a plurality of predetermined reference voltages with the bit line voltage to detect data stored in the memory cell and outputting one of first, second, and third outputs, and a logic circuit for determining stored data of two bits on the basis of the logic calculation of the first, second, and third outputs. It is determined whether desired data has been written, based on data read out in a verify-read operation after a write operation, at a time later than that for outputting readout data in a read operation. With this arrangement, the difference in read rate between selected memory cells can be minimized.

27 Claims, 32 Drawing Sheets

| OUTPUT 1 | OUTPUT 2 | OUTPUT 3 | DATA | |
|---|---|---|---|---|
| | | | D1 | D2 |
| 0 | 0 | 0 | 0 | 0 |
| 1 | 0 | 0 | 0 | 1 |
| 1 | 1 | 0 | 1 | 0 |
| 1 | 1 | 1 | 1 | 1 |

| MEMORY CELL Vth | DATA | |
|---|---|---|
| | D1 | D2 |
| Vth1 | 0 | 0 |
| Vth2 | 0 | 1 |
| Vth3 | 1 | 0 |
| Vth4 | 1 | 1 |

Vth1 < Vth2 < Vth3 < Vth4

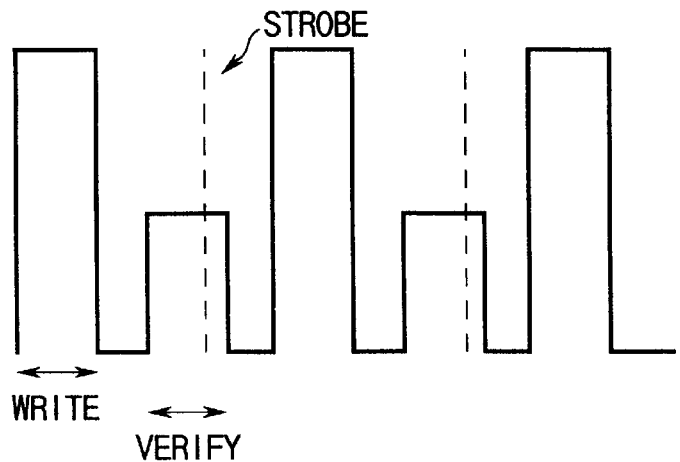
FIG. 7 PRIOR ART
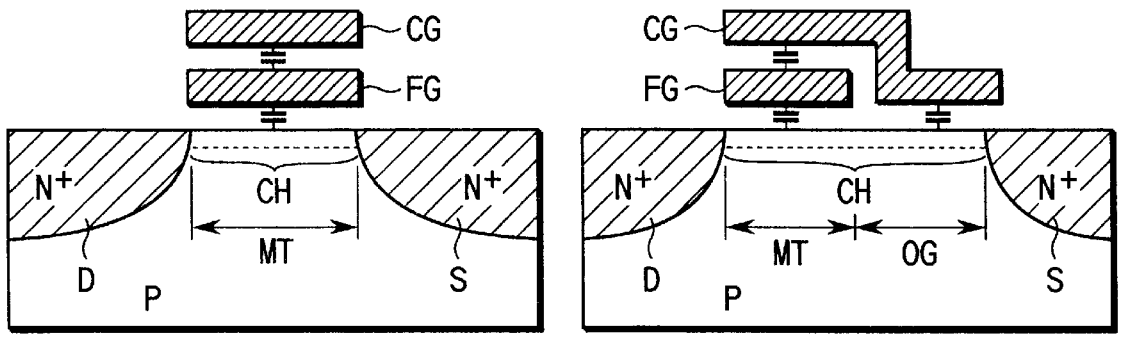
FIG. 8A PRIOR ART
FIG. 8B PRIOR ART
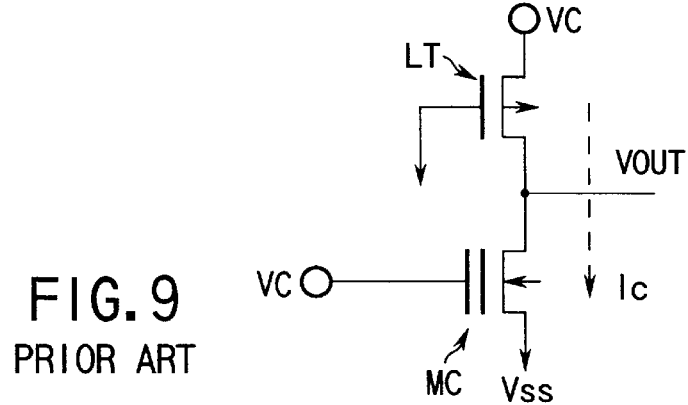
FIG. 9 PRIOR ART

| | OE | /OE | VR | /VR |
|---|---|---|---|---|
| READ | 1 | 0 | 0 | 1 |
| VERIFY | 1 | 0 | 1 | 0 |
| HIGH IMPEDANCE | 0 | 1 | 1 | 0 |

| WRITING GATE VOLTAGE | THRESHOLD LEVEL Vth | DATA | |
|---|---|---|---|
| | | D1 | D2 |
| 0 | Vth1 | 0 | 0 |
| Vpp1 | Vth2 | 0 | 1 |
| Vpp2 | Vth3 | 1 | 0 |
| Vpp3 | Vth4 | 1 | 1 |
Vpp1 < Vpp2 < Vpp3
Vth1 < Vth2 < Vth3 < Vth4
FIG. 20
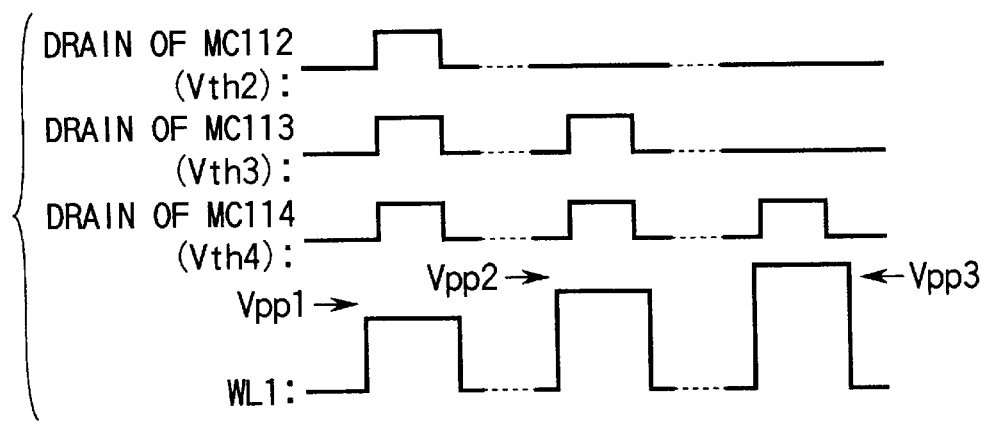
FIG. 22
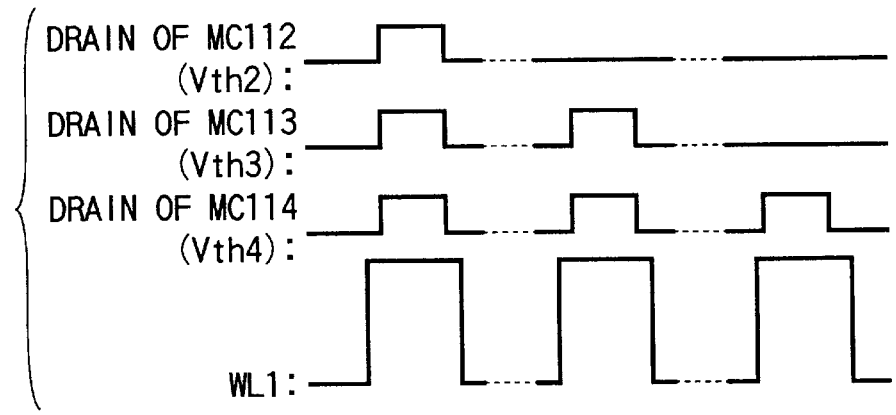
FIG. 23

| WRITING SOURCE VOLTAGE | THRESHOLD LEVEL Vth | DATA | |
|---|---|---|---|
| | | D1 | D2 |
| 0 | Vth1 | 0 | 0 |
| Vs1 | Vth2 | 0 | 1 |
| Vs2 | Vth3 | 1 | 0 |
| Vs3 | Vth4 | 1 | 1 |

Vs3<Vs2<Vs1
Vth1<Vth2<Vth3<Vth4

| | READ | ERASE | WRITE | | |
|---|---|---|---|---|---|
| | | | VS1 | VS2 | VS3 |
| S1 | "1" | "1" | "0" | "0" | "1" |
| S2 | "0" | "0" | "1" | "0" | "0" |
| S3 | "0" | "0" | "0" | "1" | "0" |
| S4 | "1" | "1" | "0" | "0" | "1" |
| S5 | "0" | "0" | "1" | "1" | "0" |
| S6 | "1" | "0" | "0" | "0" | "1" |
| S7 | "0" | "1" | "0" | "0" | "0" |

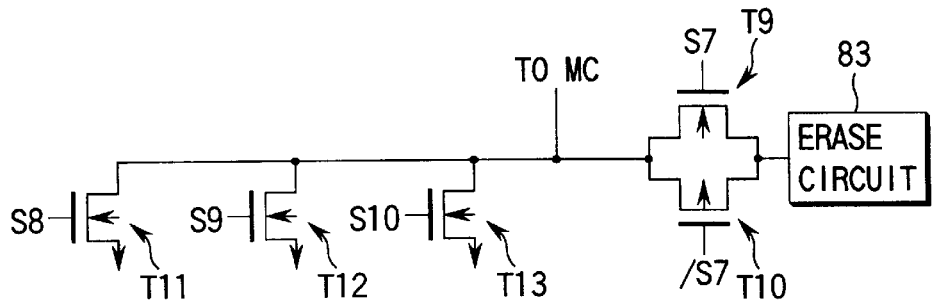
FIG. 31
FIG. 32
|  | READ | ERASE | WRITE | | |
|---|---|---|---|---|---|
|  |  |  | VS1 | VS2 | VS3 |
| S8 | "1" | "0" | "1" | "1" | "1" |
| S9 | "1" | "0" | "0" | "1" | "1" |
| S10 | "1" | "0" | "0" | "0" | "1" |
| S7 | "0" | "1" | "0" | "0" | "0" |
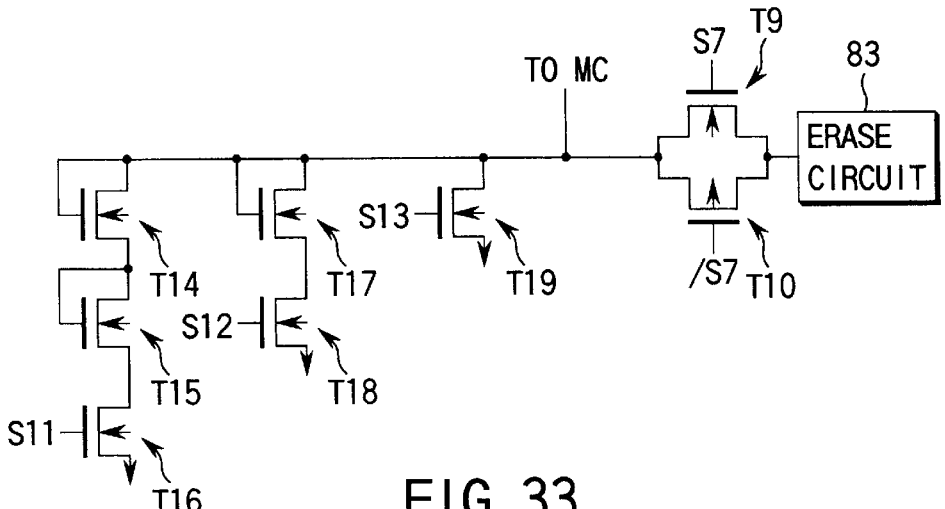
FIG. 33
FIG. 34
|  | READ | ERASE | WRITE | | |
|---|---|---|---|---|---|
|  |  |  | VS1 | VS2 | VS3 |
| S11 | "1" | "0" | "1" | "1" | "1" |
| S12 | "1" | "0" | "0" | "1" | "1" |
| S13 | "1" | "0" | "0" | "0" | "1" |
| S7 | "0" | "1" | "0" | "0" | "0" |

| BIT LINE VOLTAGE | OUTPUT 1 | OUTPUT 2A | OUTPUT 2B | OUTPUT 3A | OUTPUT 3B | OUTPUT 4 | DATA | |
|---|---|---|---|---|---|---|---|---|
| | | | | | | | D1 | D2 |
| 1 | 0 | 0* | 0 | 0 | 0 | 0 | 0 | 0 |
| 2 | 1* | 1 | 0 | 0* | 0 | 0 | 0 | 1 |
| 3 | 1 | 1 | 1* | 1 | 0 | 0* | 1 | 0 |
| 4 | 1 | 1 | 1 | 1 | 1* | 1 | 1 | 1 |

D1=(OUTPUT 3A)·(/OUTPUT 3B)+(OUTPUT 4)
D2=(OUTPUT 2A)·(/OUTPUT 2B)+(OUTPUT 4)

NONVOLATILE SEMICONDUCTOR MEMORY DEVICE

BACKGROUND OF THE INVENTION

The present invention relates to a nonvolatile semiconductor memory device and, more particularly, to a nonvolatile semiconductor memory device which stores multivalued data of a plurality of bits in one memory cell.

This application is based on Japanese Patent Application No. 9-096894, filed Apr. 15, 1977, Japanese Patent Application No. 9-289761, filed Oct. 22, 1997, and Japanese Patent Application No. 9-295419, filed Oct. 28, 1997, the content of which is incorporated herein by reference.

A nonvolatile semiconductor memory device which stores data of a plurality of bits, e.g., two bits in one memory cell is disclosed in, e.g., Japanese Patent Publication (KOKAI) No. 59-121696 proposed by the present inventors. In this prior art, three reference voltages are set, and each of these reference voltages is compared with the bit-line voltage of a memory cell by a sense amplifier to detect the value of the stored data.

FIG. 1 is a circuit diagram schematically showing the arrangement of this nonvolatile semiconductor memory device. FIGS. 2A and 2B are charts showing the relationship between reference voltages and bit line voltages. FIG. 3 is a block diagram schematically showing sense amplifiers. FIG. 4 is a table showing the relationship between sense amplifier outputs and stored data. FIG. 5 is a table showing the relationship between memory cell threshold voltages and stored data.

As shown in FIG. 1, a memory cell array 11 has a plurality of memory cells MC arrayed in a matrix. Each memory cell MC has a drain D, a source S, a floating gate FG, and a control gate CG. The drain D of the memory cell MC is connected to a bit line (column line) BL, the source S is connected to a source line SL, and the control gate CG is connected to a word line (row line) WL. The floating gate FG is formed in, e.g., a gate insulating film for insulting the control gate CG from the channel. Basically, the memory cell MC comprises an insulating gate type FET and changes its threshold voltage in accordance with the charged state of the floating gate FG. The memory cell MC stores data in correspondence with the threshold voltage. The memory cell array 11 shown in FIG. 1 is generally called a NOR type. In the NOR type memory cell array, the plurality of memory cells MC are integrated by connecting each memory cell MC parallel between a bit line BL and a source line SL.

Reference numeral 12 denotes a row decoder; 13, a column decoder; and 14, a column selection transistor. Reference symbol LT denotes a bit line load transistor; CT, a bit line voltage clamp transistor for setting the drain voltage of each memory cell at a predetermined value; and BC, a bias circuit for applying a bias voltage to the gate of the bit line voltage clamp transistor CT.

The memory cell MC having the drain D, the source S, the floating gate FG, and the control gate CG stores data of a plurality of bits (two bits in this example) by changing the charge amount stored in the floating gate FG. The drain D is connected to the bit line BL, the source S is connected to the source line SL, and the control gate CG is connected to the word line WL.

The word line WL selects a row of the memory cell array 11. This selection is done by the row decoder 12. The row decoder 12 decodes a row address signal (not shown) to determine the word line WL to be selected.

In, e.g., a data read mode, the bit line BL transmits, outside the memory cell MC, data in the memory cell MC electrically connected to the selected word line WL as an electrical signal. A column of the memory cell array 11 is designated by the column decoder 13. The column decoder 13 decodes a column address signal (not shown) to determine a column to be designated for a read mode. The bit line BL belonging to the designated column electrically connects the memory cell MC to a data read circuit 15 through the column selector 14. The memory cell MC connected to the data read circuit 15 changes a voltage Vout of an output node 16 of the data read circuit 15 through the bit line BL. The amount of a change in voltage of the output node 16 changes in accordance with the electrical connection state of the memory cell MC, i.e., the amount of a drain current that the memory cell MC can flow. The drain current amount changes in accordance with the threshold voltage of the memory cell MC.

Reference numeral 8 denotes a program means for performing control so as to end a data write mode when it determines, by a verify mode for checking the charge storage state of the floating gate after the write mode, that desired data has been written; otherwise, repeat the write mode and verify mode until it is determined that the desired data has been written. As the program means 8, e.g., a sequence controller is used.

Two-bit data is read out by comparing the data (bit line voltage) read out from the memory cell MC with each of reference voltages 1, 2, and 3 shown in FIG. 2A and identifying the voltage relationship relative to each reference voltage. There are four combinations of 2-bit data. These four data combinations are stored by changing the number of electrons injected into the floating gate of the memory cell to generate four different threshold voltages for the memory cell in correspondence with the injection amount.

More specifically, when the bit line voltage is lower than first reference voltage 1 which is the lowest one of the reference voltages, data "00" is stored (the lowest threshold voltage). If the bit line voltage is higher than third reference voltage 3 which is the highest one of the reference voltages, data "11" is stored (the highest threshold voltage). When the bit line voltage is between first reference voltage 1 and second reference voltage 2, data "01" is stored (the third highest threshold voltage). If the bit line voltage is between second reference voltage 2 and third reference voltage 3, data "10" is stored (the second highest threshold voltage).

The four data combinations are identified by comparing the bit line voltage with reference voltages 1, 2, and 3 by sense amplifiers 1, 2, and 3 for receiving reference voltages 1, 2, and 3, respectively, as shown in FIG. 3.

If the bit line voltage is lower than reference voltages 1, 2, and 3, outputs 1, 2, and 3 from sense amplifiers 1, 2, and 3 are at "0", as shown in FIG. 4. This is detected by a logic circuit (not shown), so D1="0" and D2="0" are output as data stored in the memory cell. Similarly, when the bit line voltage is between reference voltages 1 and 2, output 1 is at "1", and outputs 2 and 3 are at "0", so D1="0" and D2="1" are output. When the bit line voltage is between reference voltages 2 and 3, outputs 1 and 2 are at "1", and output 3 is at "0", so D1="1" and D2="0" are output. When the bit line voltage is higher than third reference voltage 3, all outputs 1, 2, and 3 are at "1", so D1="1" and D2="1" are output. FIG. 5 shows the relationship between the threshold values of the memory cell and stored data.

Data is written in the memory cell by injecting electrons into the floating gate. Before writing the data in the memory cell, data in the memory cell is erased. In a data erase mode, the control gate is set at 0 V, and a high voltage is applied to the source of the memory cell to emit electrons from the floating gate to the source of the memory cell. In a data erase mode, a high voltage is applied from a source potential circuit shown in FIG. 6. In a data read or write mode, a reference voltage, e.g., 0 V is applied from the source potential circuit to the source of the memory cell. The data erase is a kind of data write and corresponds to a state wherein the lowest threshold voltage, i.e., D1="0" and D2="0" are stored.

After this, another data is selectively written in the memory cell where the data is to be stored. To write data in the memory cell, predetermined voltages are applied to the drain and control gate of the memory cell, respectively, and the source is set at 0 V to flow a current to the memory cell, thereby injecting electrons into the floating gate. In this manner, data is written in the memory cell. As shown in FIG. 7, after the data write mode, the data is read out from the memory cell (verify read). The write and read modes are repeated until the output results from sense amplifiers 1 to 3 agree with data to be written. The data write mode is ended upon agreement. Determination whether the data agree with each other may be externally made by reading out the data outside the integration circuit or performed in the integration circuit.

In such a conventional nonvolatile semiconductor memory device, the bit line voltage can be set between, e.g., first reference voltage 1 and second reference voltage 2 in accordance with data to be stored in the memory cell. However, individual memory cells have different write characteristics. Therefore, the bit line voltage after the read mode changes depending on the write characteristics of the memory cell selected for the read mode, and the read rate largely varies depending on the selected memory cell.

More specifically, although each of bit line voltages 2, 3, and 4 is indicated by a line in FIG. 2A, in fact, each of bit line voltages 2, 3, and 4 is distributed on the upper and lower sides of the bit line voltage in accordance with the selected memory cell and has a variation r, as shown in FIG. 2B. The data read rate changes depending on the position of the selected memory cell in the distribution. For example, the read rate in the region (I) largely differs from that in the region (II).

Referring to FIG. 6, I/O 1 to I/O 8 correspond to bits of output data (8 bits), respectively. The source potential circuit is common to the plurality of output bits. Data is written by setting the source of the memory cell at 0 V and applying a high voltage to the control gate and drain of the memory cell to flow a current and inject electrons from the channel region into the floating gate. In the data write mode, data is simultaneously written in the eight memory cells corresponding to the output bits. The injection number of electrons into the floating gate is determined in correspondence with the voltage of the control gate of the memory cell. More specifically, as the control gate voltage becomes higher, the electron injection amount increases. Therefore, in the data write mode, the voltage of the control gate or drain is set in correspondence with the highest threshold voltage after the write mode. To prevent an increase in electron injection amount for a memory cell having a low threshold voltage, the electron injection time is shortened, and the write and verify modes are repeatedly performed, as shown in FIG. 7. To precisely set the threshold voltage at a predetermined value, preferably, the electron injection time is shortened to gradually inject electrons, as a matter of course. However, this requires a long data write time. In addition, to precisely set the threshold voltage of the memory cell, the control gate voltage is changed in correspondence with the threshold voltage to be set, i.e., the data write is started from a memory cell having a low threshold voltage, and then the control gate voltage is raised by a predetermined value to write data in a memory cell having a high threshold voltage. In this case as well, the write mode is performed in correspondence with each threshold voltage to be set, undesirably resulting in an increase in write time.

The sectional structure of the nonvolatile memory cell will be described below.

FIG. 8A shows a memory cell without any offset gate portion. FIG. 8B shows a memory cell having an offset gate for partially controlling the channel with the control gate.

To erase data from these memory cells, the control gate is set at 0 V, and a high voltage is applied to the drain or source for the memory cell shown in FIG. 8A, or the drain for the memory cell in FIG. 8B, thereby emitting electrons from the floating gate.

In the memory cell shown in FIG. 8A, control becomes complex because the memory cell cannot have a negative threshold voltage. However, in the memory cell with an offset gate shown in FIG. 8B, the transistor portion having a channel region to be controlled by the floating gate may have a negative threshold voltage, so control for the erase is simplified.

However, as for the memory cell size, the memory cell shown in FIG. 8A is more advantageous in reducing its size than that shown in FIG. 8B.

A general data write and erase (a kind of data write) for the above-described nonvolatile memory cell will be described next.

In the data write mode, predetermined voltages are applied to the drain and control gate of the memory cell, respectively, and the source is set at OV to flow a current to the memory cell and inject electrons into the floating gate. In the data write mode, data is read from the memory cell after the write (verify) mode, and the write and read modes are repeatedly performed until the output results from first to third sense amplifiers 1 to 3 agree with data to be written. The write mode is stopped upon agreement. Whether the data agree with each other may be determined outside the chip by reading out the data or determined in the memory chip. In both cases, detection is performed a predetermined time (strobe) after the start of the data read mode.

Before the data write mode, a data erase mode is performed. In the data erase mode, the control gate of the memory cell is set at 0 V, and a high voltage is applied to the drain or source to emit electrons from the floating gate to the source or drain. The data erase state corresponds to a lowest threshold voltage Vth1, i.e., a state wherein data "00" in FIG. 4 is stored. In the data erase mode, a verify mode is performed after the erase mode to detect whether the bit line voltage is lower than first reference voltage 1 by a sense amplifier. The erase and verify modes are repeatedly performed, and the erase mode is ended upon reaching a predetermined threshold voltage.

The data read mode of the above-described conventional nonvolatile memory cell will be described next with reference to FIGS. 9 and 10.

For the descriptive convenience, FIG. 9 shows only the memory cell MC and the load transistor LT connected to the memory cell MC in FIG. 1.

Actually, the memory cells MC are arrayed in a matrix, and the column selector transistor for selecting a column, the bias circuit BC for setting the drain voltage of the memory cell at a predetermined value, and the like are connected between the memory cell MC and the load transistor LT.

FIG. 10 is a chart schematically showing a current flowing to the memory cell MC and a current flowing to the load transistor. The voltage (output voltage) Vout at the connection point between the memory cell and the load transistor in FIG. 9 is plotted along the abscissa, and the currents flowing to the load transistor and the memory cell are plotted along the ordinate. The current flowing to the memory cell when the memory cell is selected is indicated by the solid lines, and the current flowing to the load transistor is indicated by the broken line.

Memory cell currents are shown in correspondence with threshold voltages Vth1 to Vth3 of the memory cell. When the memory cell has a threshold voltage Vth4, no current flows even when the memory cell is selected.

Intersections between the solid lines and the broken line represent the voltages Vout corresponding to the threshold voltages Vth1 to Vth3. At the threshold voltage Vth4, the voltage Vout equals a power supply voltage Vc because the memory cell is OFF.

However, as shown in FIG. 2A, four different bit line voltages are generated, and three reference voltages 1 to 3 are set among four bit line voltages 1 to 4 corresponding to the four threshold voltages Vth1 to Vth4 of the memory cell. In this case, as compared to the prior art in which two bit line voltages are generated to store 1-bit data in one memory cell, the difference between the bit line voltage and the reference voltage becomes small. This decreases the read margin, and also results in a decrease in margin for noise such as a power supply variation.

In the nonvolatile semiconductor memory device having such nonvolatile memory cells arranged in a matrix, the bit line voltage can be set between, e.g., reference voltages 1 and 2 in accordance with data to be stored in the memory cell.

However, since the write characteristics of the memory cell change depending on each memory cell, the bit line voltage between reference voltages 1 and 2 or between reference voltages 2 and 3 changes depending on the selected memory cell. Therefore, conventionally, the read rate changes depending on the selected memory cell.

More specifically, although the bit line voltage is indicated by one line in FIG. 2A, in fact, e.g., bit line voltage 2 varies with a certain distribution on the upper and lower sides of the line of bit line voltage 2 shown in FIG. 2B in accordance with the selected memory cell. Therefore, the read rate changes (varies) depending on the position of the selected memory cell in the distribution.

In addition, when the bit line voltage between reference voltages 1 and 2 or between reference voltages 2 and 3 is close to any one of the reference voltages, the read margin for the closer reference voltage becomes small.

FIG. 11 shows the distribution of the memory cell threshold voltages.

Even when the memory cell threshold voltage is to be set at one of Vth1 to Vth4, the threshold voltage varies with a certain distribution for the threshold voltage to be set because of the variation in characteristics of memory cells.

In addition, the distribution itself changes depending on each chip, as indicated by broken lines. Therefore, the read rate or read margin changes in units of chips.

As described above, in the conventional nonvolatile semiconductor memory device, the write characteristics change depending on the memory cell. Therefore, the read rate changes depending on the selected memory cell, and due to this, the read rate or read margin changes in units of chips.

BRIEF SUMMARY OF THE INVENTION

Accordingly, it is an object of the present invention to provide a nonvolatile semiconductor memory device capable of minimizing the difference in read rate among selected memory cells, and a method of verifying write data in the nonvolatile semiconductor memory device.

It is another object of the present invention to provide a nonvolatile semiconductor memory device capable of minimizing the write time for writing data to be stored using a plurality of threshold voltages, and a method of writing data in the nonvolatile semiconductor memory device.

According to the present invention, there is provided a nonvolatile semiconductor memory device comprising: a row line; a column line; a memory cell having a drain which is connected to the column line, a source, a charge storage portion, and a control gate connected to the row line, the memory cell storing data of a plurality of bits by changing an amount of charges to be stored in the charge storage portion;

a sense amplifier for detecting data stored in the memory cell by using a plurality of predetermined reference voltages; and program means for performing, after a data write operation in the memory cell, a verify-read operation to check a charge storage state of the charge storage portion after the write operation, when it is determined that desired data has been written, ending the write operation, and when it is determined that the desired data has not been written, repeating the write operation and the verify-read operation until it is determined that the desired data has been written, wherein determination whether the desired data has been written, which is performed in the verify-read by the program means, is done at time later than time at which data read out from the memory cell is output in a normal read operation.

According to the present invention, there is provided a method of verifying data written in a nonvolatile memory, comprising the following steps of: (a) writing data having a predetermined value in a memory cell; (b) reading out the data written in the memory cell to a bit line; (c) comparing a bit line voltage after the data is read out to the bit line with a reference voltage; (d) determining on the basis of a comparison result whether the data having the predetermined value has been written; and (e) repeating the steps (a) to (d) until the data having the predetermined value has been written, wherein the step (d) is performed after a time for which read data is output in a read operation.

According to the present invention, there is provided another method of verifying data written in a nonvolatile memory, comprising the following steps of: (a) writing data having a predetermined value in a memory cell; (b) reading out the data written in the memory cell to a bit line; (c) comparing a bit line voltage after the data is read out to the bit line with a reference voltage; (d) determining on the basis of a comparison result whether the data having the predetermined value has been written; and (e) repeating the steps (a) to (d) until the data having the predetermined value has been written, wherein a speed for reading the data in the step (b) is lower than that for reading data in a read operation.

According to the present invention, there is provided another nonvolatile semiconductor memory device comprising: a read circuit for reading out data stored in a memory cell to a bit line; a comparator for comparing a bit line voltage after the data is read out to the bit line by the read circuit with a reference voltage; and an output circuit for externally outputting detected data which is based on a comparison result by the comparator, wherein the output circuit has first and second insulating gate FETs connected in series between power supply voltages in an integrated circuit to electrically connect outputs to an external terminal, a speed for charging one of gates of the first and second insulating gate FETs and discharging the other of the gates in accordance with the detected data is set to be lower in a verify-read operation for checking write data after a write operation than that in a read operation, and a time necessary for charging/discharging the external terminal is set to be longer in a verify-read operation for checking the write data than that in a read operation.

According to the present invention, there is provided a method of writing data in a nonvolatile semiconductor memory device having a plurality of memory cells, each memory cell storing data using at least three threshold voltages while discriminating at least first, second, and third data using at least a first reference voltage, and a second reference voltage having a level different from that of the first reference voltage so that the first data is stored using a first threshold voltage, the second data is stored using a second threshold voltage higher than the first threshold voltage, and the third data is stored using a third threshold voltage higher than the second threshold voltage, the method comprising the following steps of: setting the first threshold voltage for a first memory cell to be set at the first threshold voltage; applying a first write voltage to a gate of a second memory cell to be set at the second threshold voltage to set the second threshold voltage for the second memory cell; and applying a second write voltage to a gate of a third memory cell to be set at the third threshold voltage, the second write voltage is higher than the first write voltage by a value corresponding to a difference between the second and third threshold voltages or a difference between the first and second reference voltages, to set the third threshold voltage for the third memory cell.

According to the present invention, there is provided a nonvolatile semiconductor memory device comprising: a memory cell array in which a plurality of memory cells are integrated, each memory cell storing data using at least three threshold voltages so that first data is stored using a first threshold voltage, second data is stored using a second threshold voltage higher than the first threshold voltage, and third data is stored using a third threshold voltage higher than the second threshold voltage; a write circuit for controlling a voltage applied to a column line of the memory cell array on the basis of write data and writing the write data in the memory cell; and a write data detection circuit for detecting whether the write data is the second data or third data, and when the write data is the second data, outputting a control signal for setting a voltage applied to a row line of the memory cell array at a first write voltage, and when the write data is the third data, outputting a control signal for setting the voltage to be applied to the row line at a second write voltage higher than the first write voltage by a difference between the second and third threshold voltages or a difference between the first and second reference voltages.

According to the present invention, there is provided a method of writing data in a nonvolatile semiconductor memory device having a plurality of memory cells in which data are simultaneously written, each memory cell storing data using at least three threshold voltages so that first data is stored using a first threshold voltage, second data is stored using a second threshold voltage higher than the first threshold voltage, and third data is stored using a third threshold voltage higher than the second threshold voltage, the method comprising the following steps of: after the first threshold voltage is set for a first memory cell to be set at the first threshold voltage, applying a first write voltage to a gate of a second memory cell to be set at the second threshold voltage and a gate of a third memory cell to be set at the third threshold voltage to shift threshold voltages of the second and third memory cells in a direction from the first threshold voltage to the second threshold voltage; and after the second threshold voltage is set for the second memory cell, applying a second write voltage to the gate of the third memory cell which is to be set at the third threshold voltage and has a threshold voltage shifted in the direction from the first threshold voltage to the second threshold voltage to set the third threshold voltage for the third memory cell.

According to the present invention, there is provided another nonvolatile semiconductor memory device comprising: a memory cell array in which a plurality of memory cells are integrated, each memory cell storing data using at least three threshold voltages so that first data is stored using a first threshold voltage, second data is stored using a second threshold voltage higher than the first threshold voltage, and third data is stored using a third threshold voltage higher than the second threshold voltage; a plurality of write circuits for controlling a voltage applied to a column line of the memory cell array on the basis of write data and writing the write data in the memory cells; and a write control circuit for detecting, for each of the write data input to the plurality of write circuits, whether the write data is the second data or third data, when at least one second data is included in the write data, outputting a control signal for a row line of the memory cell array at a first write voltage to write the second data, when at least one third data is included in the write data, outputting a control signal for setting the row line of the memory cell array at a second write voltage to write the third data, and when at least one of the second and third data is not included in the write data, outputting a control signal for omitting a write of the absent data.

According to the present invention, there is provided another nonvolatile semiconductor memory device comprising: a memory cell array having row lines and column lines and formed of a plurality of memory cells, each having a drain, a source, a floating gate, and a control gate, and storing data of a plurality of bits by storing different numbers of electrons in the floating gate, the control gates of the memory cells in a row being commonly connected to one of the row lines, and the memory cells in a column being commonly connected to one of the column lines; and source voltage setting means for changing a voltage of the sources of the memory cell array in correspondence with data to be written in a data write operation.

According to the present invention, there is provided another nonvolatile semiconductor memory device comprising: a memory cell array having a plurality of memory cell blocks, each memory cell block including plural memory cells arranged in a matrix, each memory cell including a drain, a source, a floating gate, and a control gate, storing data of a plurality of bits by storing different amounts of electrons in the floating gate, the control gates of memory cells of one row being commonly connected to one of a plurality of row lines, the drains of memory cells of one column being commonly connected to one of a plurality of column lines, and the sources of the memory cells being commonly connected; and source voltage setting means for changing a voltage of the source in correspondence with data to be written in a data write operation, the source voltage setting means being arranged for each memory cell block.

According to the present invention, there is provided another nonvolatile semiconductor memory device comprising: a row line; a column line; a memory cell having a gate connected to the row line and a drain connected to the column line; a load transistor connected to the column line to charge the column line; a sense amplifier unit for comparing a reference voltage with a voltage of the column line in a read operation to detect data stored in the memory cell; and data read means for setting a current supply capability of the load transistor at a first current supply capability to read out data from the memory cell, determining, on the basis of a read result, whether the current supply capability of the load transistor is to be set at a second current supply capability larger than the first current supply capability or a third current supply capability smaller than the first current supply capability, and setting the load transistor at the second or third current supply capability to read out data from the memory cell.

According to the present invention, there is provided another nonvolatile semiconductor memory device comprising: a row line; a column line; a memory cell having a gate connected to the row line and a drain connected to the column line; a load transistor connected to the column line to charge the column line; a sense amplifier unit for comparing a reference voltage with a voltage of the column line in a read operation to detect data stored in the memory cell; and data read means for setting a current supply capability of the load transistor at a predetermined current supply capability to read out data from the memory cell, and changing the current supply capability of the load transistor in accordance with a read result to read out data from the memory cell.

According to the present invention, there is provided another nonvolatile semiconductor memory device comprising: a row line; a column line; a memory cell having a drain connected to the column line, a source, a floating gate, and a control gate connected to the row line, the memory cell storing data of a plurality of bits by changing an amount of charges to be stored in the floating gate; a sense amplifier for detecting data stored in the memory cell by using a plurality of reference voltages in a data read operation; and program means for performing a write operation and a verify-read operation for checking a charge storage state of the floating gate after the write operation, when it is determined that desired data has been written, ending the write operation, and when it is determined that the desired data has not been written, repeating the write operation and the verify-read operation until it is determined that the desired data has been written, wherein the sense amplifier uses, as the plurality of reference voltages, at least a first reference voltage, a second reference voltage, a third reference voltage, a fourth reference voltage, a fifth reference voltage, and a sixth reference voltage which increase in voltage in the order named; in a read operation, data is read out by detecting whether the voltage of the column line is lower than the second reference voltage, between the first and fourth reference voltages, between the third and sixth reference voltages, or higher than the fifth reference voltage, and in the verify-read operation, data is read out by detecting whether the voltage of the column line is between the second and third reference voltages, between the fourth and fifth reference voltages, or higher than the sixth reference voltage.

According to the present invention, there is provided another nonvolatile semiconductor memory device comprising: a row line; a column line; a memory cell having a drain connected to the column line, a source, a floating gate, and a control gate connected to the row line, the memory cell storing data of a plurality of bits by changing an amount of charges to be stored in the floating gate; a sense amplifier for detecting data stored in the memory cell by using a plurality of reference voltages in a read operation; and program means for performing a write operation and a verify-read operation for checking a charge storage state of the floating gate after the write operation, when it is determined that desired data has been written, ending the write operation, and when it is determined that the desired data has not been written, repeating the write operation and the verify-read operation until it is determined that the desired data has been written, wherein the sense amplifier uses, as the plurality of reference voltages, at least a first reference voltage, a second reference voltage, a third reference voltage, a fourth reference voltage, a fifth reference voltage, and a sixth reference voltage which increase in voltage in the order named, and a seventh reference voltage set at a voltage between the first and second reference voltages, an eighth reference voltage set at a voltage between the third and fourth reference voltages, and a ninth reference voltage set at a voltage between the fifth and sixth reference voltages, in a read operation, data is read out by detecting whether the voltage of the column line is lower than the second reference voltage, between the first and fourth reference voltages, between the third and sixth reference voltages, or higher than the fifth reference voltage, and in the verify-read operation, data is read out by detecting whether the voltage of the column line is between the seventh and eighth reference voltages, between the eighth and ninth reference voltages, or higher than the ninth reference voltage.

According to the present invention, there is provided another nonvolatile semiconductor memory device comprising: a row line; a column line; a memory cell having a drain connected to the column line, a source, a floating gate, and a control gate connected to the row line, the memory cell storing data of a plurality of bits by changing an amount of charges to be stored in the floating gate; a sense amplifier for detecting data stored in the memory cell by using a plurality of reference voltages in a read operation; and program means for performing a write operation and a verify-read operation for checking a charge storage state of the floating gate after the write operation, when it is determined that desired data has been written, ending the write operation, and when it is determined that the desired data has not been written, repeating the write operation and the verify operation until it is determined that the desired data has been written, wherein the sense amplifier unit uses, as the plurality of reference voltages, at least a total of four reference voltages such as a first reference voltage, at least second and third reference voltages higher than the first reference voltage, and a fourth reference voltage higher than the second and third reference voltages, in a read operation, data is read out by detecting whether the voltage of the column line is lower than the first reference voltage, between the second and third reference voltages, or higher than the fourth reference voltage, and in the verify operation, data is read out by detecting whether the voltage of the column line is between the second and third reference voltages or higher than the third reference voltage.

According to the present invention, there is provided another nonvolatile semiconductor memory device comprising: a row line; a column line; a memory cell having a drain connected to the column line, a source, a floating gate, and a control gate connected to the row line, the memory cell storing data of a plurality of bits by changing an amount of charges to be stored in the floating gate; a sense amplifier for detecting data stored in the memory cell by using a plurality of reference voltages in a read operation; and voltage setting means for setting the plurality of reference voltages to be supplied to the sense amplifier at a predetermined voltage after manufacturing the nonvolatile semiconductor memory device.

According to the present invention, there is provided another nonvolatile semiconductor memory device comprising: a row line; a column line; a memory cell having a gate connected to the row line and a drain connected to the column line; a sense amplifier for detecting data stored in the memory cell by using a reference voltage in a read operation; and reference voltage setting means for changing the reference voltage in correspondence with the voltage of the column line such that a voltage difference between the reference voltage and the voltage of the column line increases.

According to the present invention, there is provided another nonvolatile semiconductor memory device comprising: a row line; a column line; a memory cell having a drain connected to the column line, a source, a floating gate, and a control gate connected to the row line, the memory cell storing data of a plurality of bits by changing an amount of charges to be stored in the floating gate; a plurality of sense amplifiers for detecting data stored in the memory cell by using a plurality of reference voltages in a read operation; and a switching circuit for switching the reference voltage to be supplied to the sense amplifier between a read operation and in a verify-read operation.

According to the present invention, there is provided another nonvolatile semiconductor memory device comprising: a memory cell array having row lines and column lines and formed of a plurality of memory cells, each having a drain, a source, a charge storage portion, and a control gate, and storing data of a plurality of bits by storing different numbers of electrons in the charge storage portion, the control gates of the memory cells in a same row being commonly connected to one of the row lines, and the memory cells in a same column being commonly connected to one of the column lines; and program means for writing data simultaneously in at least two memory cells connected to the same row line, when two threshold voltages are to be set to the at least two memory cells, the program means first sets a threshold voltage to one of the at least two memory cells corresponding to a lower threshold voltage and then sets a threshold voltage to another one of the at least two memory cells corresponding to a higher threshold voltage, and the program means injects electrons into the charge storage portion of the memory cell corresponding to the higher threshold voltage as well as injects electrons into the charge storage portion of the memory cell corresponding to the lower threshold voltage.

According to the present invention, there is provided another nonvolatile semiconductor memory device comprising: a memory cell array section including plural memory cell arrays, each array having row lines and column lines and formed of a plurality of memory cells, each having a drain, a source, a charge storage portion, and a control gate, and storing data of a plurality of bits by storing different numbers of electrons in the charge storage portion, the control gates of the memory cells in a same row being commonly connected to one of the row lines, and the memory cells in a same column being commonly connected to one of the column lines; plural output circuits, connected to the plural memory cell arrays, for outputting data stored in the memory cell to an external of the memory device; and program means, in response to data written to the memory cell, for writing data simultaneously in memory cells of the plural memory cell arrays, when two threshold voltages are to be set to the memory cells of the plural memory cell arrays, the program means first sets a threshold voltage to the memory cell corresponding to a lower threshold voltage and then sets a threshold voltage to the memory cell corresponding to a higher threshold voltage, and the program means injects electrons into the charge storage portion of the memory cell corresponding to the higher threshold voltage as well as injects electrons into the charge storage portion of the memory cell corresponding to the lower threshold voltage.

According to the nonvolatile semiconductor memory device of the present invention, the difference in read rate among selected memory cells can be minimized.

According to the nonvolatile semiconductor memory device of the present invention, the write time for writing data to be stored using a plurality of threshold voltages can be minimized.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 7 is a chart showing a general method of writing data in a memory cell;

FIG. 8A is a sectional view showing a memory cell without any offset gate portion;

FIG. 8B is a sectional view showing a memory cell having an offset gate portion;

FIG. 9 is a circuit diagram showing only the memory cell and a load transistor shown in FIG. 1;

FIG. 20 is a table showing the relationship between write voltages, threshold voltages, and stored data in a nonvolatile semiconductor memory device according to a third embodiment of the present invention;

FIG. 22 is a chart showing a change in drain voltage and word line voltage of a memory cell in a write mode in the third embodiment;

FIG. 23 is a chart showing a change in drain voltage and word line voltage in the write mode in a modification of the third embodiment;

FIG. 31 is a circuit diagram showing the second example of the source potential circuit in the fourth embodiment;

FIG. 32 is a table showing the logic signal level of the source potential circuit shown in FIG. 31;

FIG. 33 is a circuit diagram showing the third example of the source potential circuit in the fourth embodiment;

FIG. 34 is a table showing the logic signal level of the source potential circuit shown in FIG. 33;

DETAILED DESCRIPTION OF THE INVENTION

A preferred embodiment of a nonvolatile semiconductor memory device according to the present invention will now be described with reference to the accompanying drawings.

First Embodiment

Figure 1:
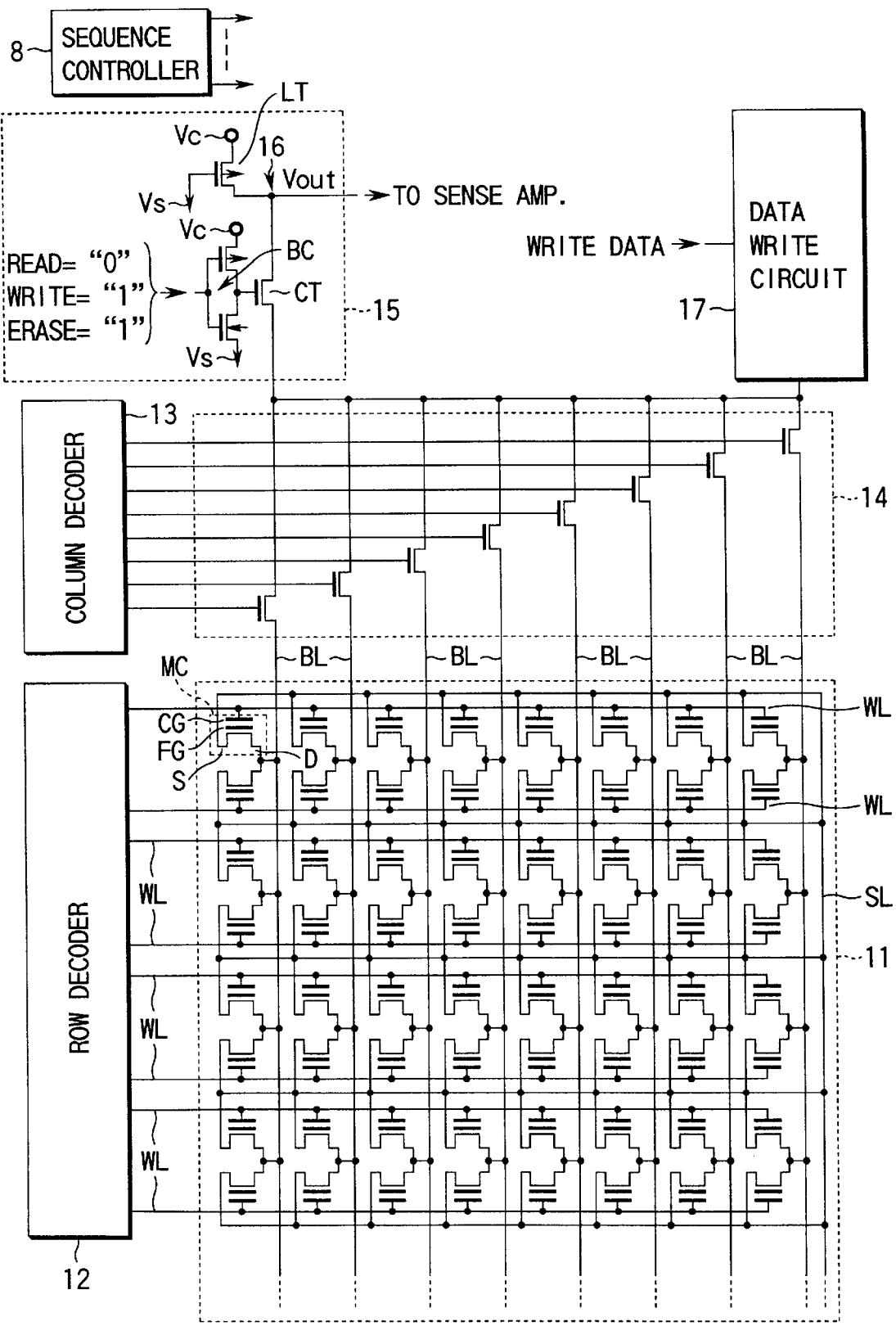
FIG. 1 is a circuit diagram schematically showing the arrangement of a general nonvolatile semiconductor memory device.

The schematic arrangement of a nonvolatile semiconductor memory device according to the first embodiment is the same as that of the prior art shown in FIG. 1, and a detailed description thereof will be omitted.

Figure 12:
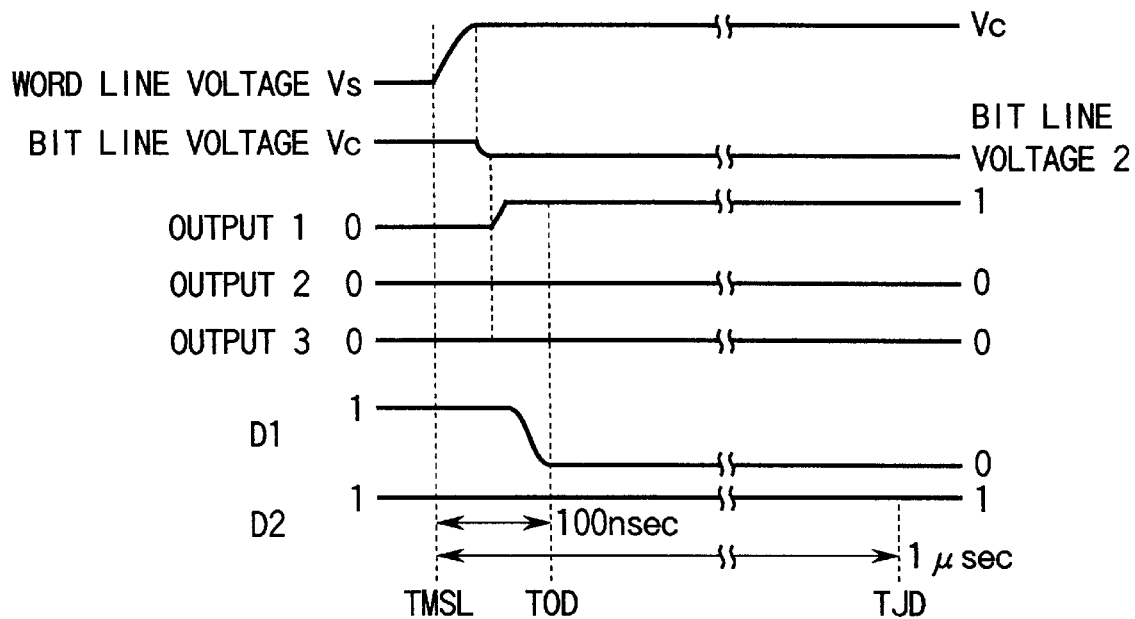
FIG. 12 is a chart showing the operation of a nonvolatile semiconductor memory device according to a first embodiment of the present invention.
Figure 13:
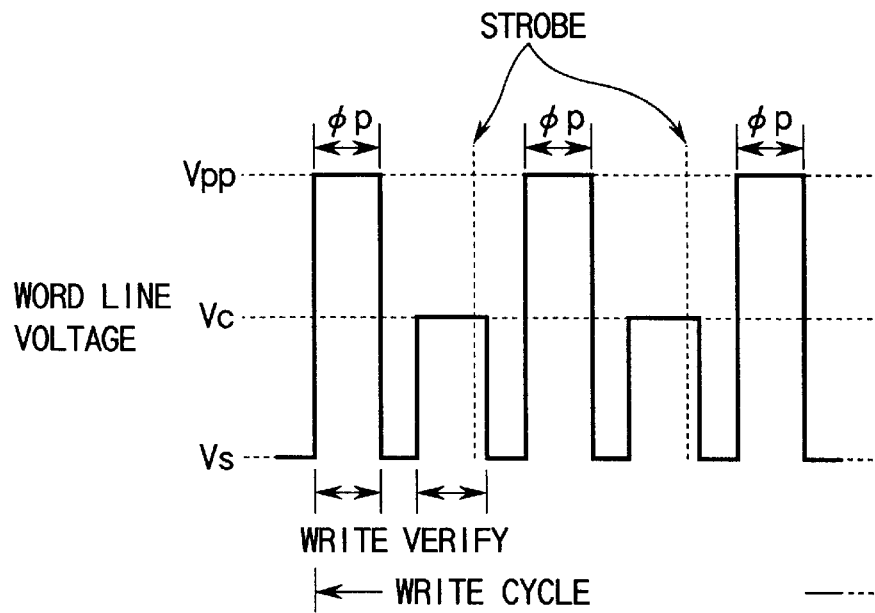
FIG. 13 is a chart showing a change in bit line voltage in the data write in the nonvolatile semiconductor memory device according to the first embodiment.
Figure 14A:
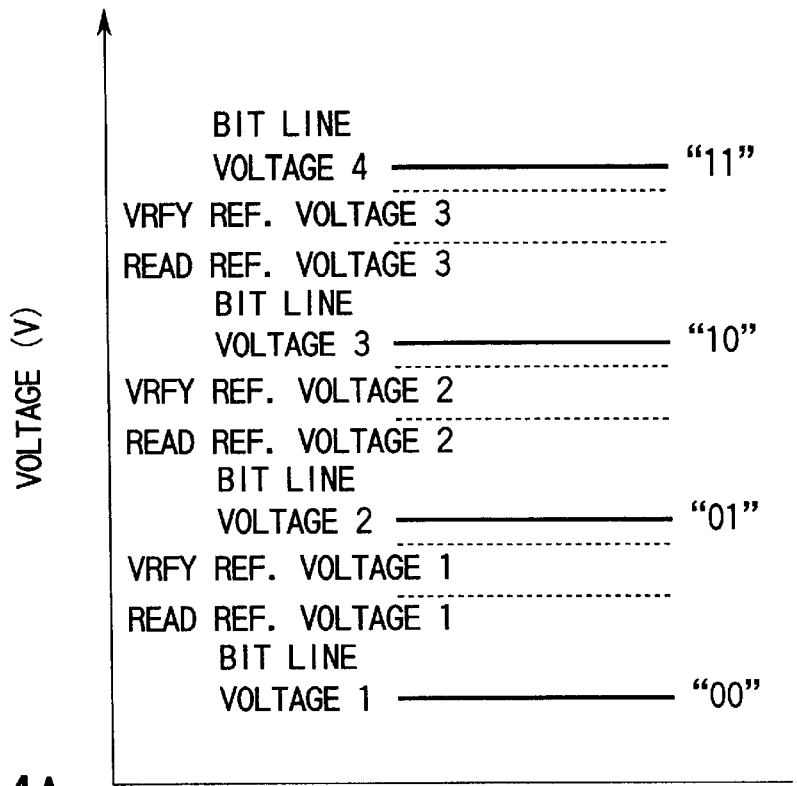
FIGS. 14A and 14B are charts showing the relationship between reference voltages and bit line voltages in the nonvolatile semiconductor memory device according to the first embodiment.
Figure 14B:
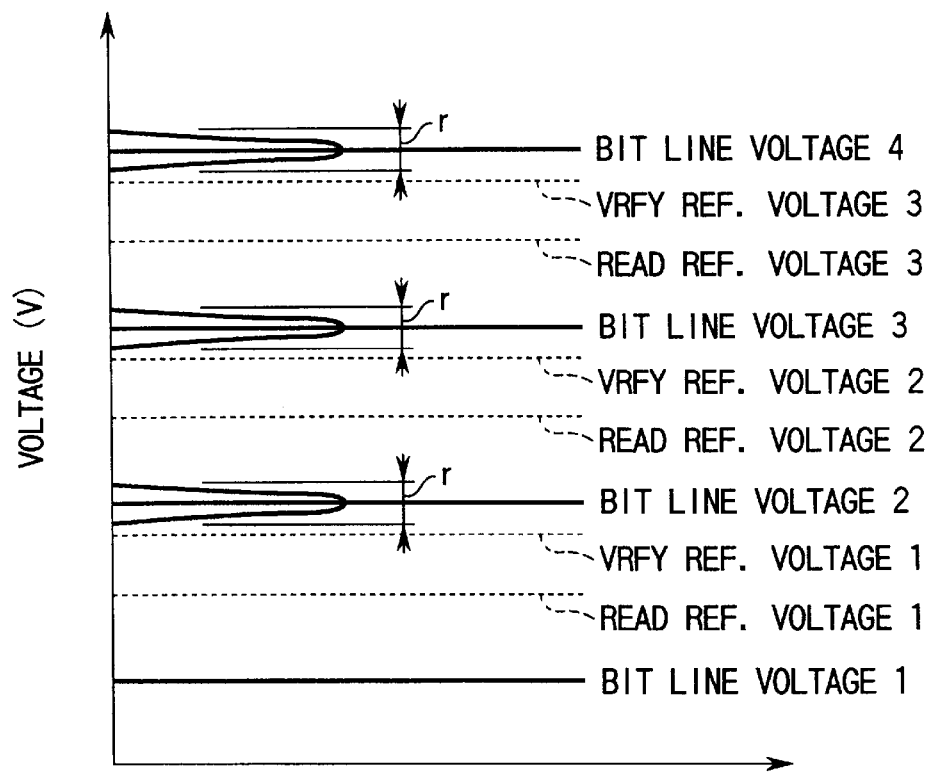
Figure 15:
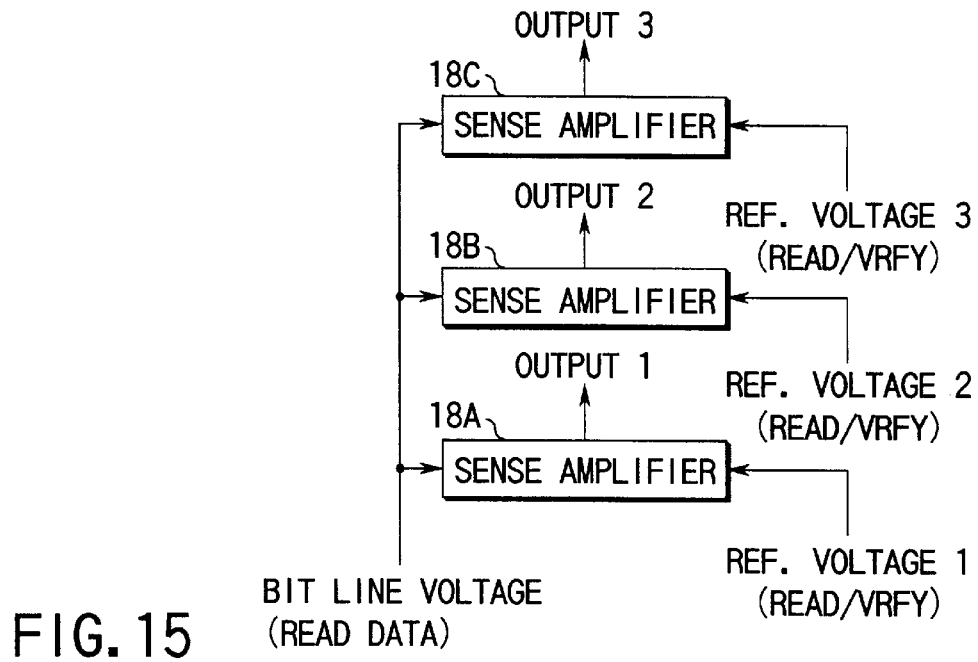
FIG. 15 is a block diagram showing sense amplifiers of the nonvolatile semiconductor memory device according to the first embodiment.

FIG. 12 is a chart showing the operation of the nonvolatile semiconductor memory device according to the first embodiment. FIG. 13 is a chart showing a change in word line voltage in a data write mode in the nonvolatile semiconductor memory device according to the first embodiment. FIGS. 14A and 14B are charts showing the relationship between reference voltages and bit line voltages of the nonvolatile semiconductor memory device according to the first embodiment. FIG. 15 is a block diagram showing sense amplifiers of the nonvolatile semiconductor memory device according to the first embodiment.

In the first embodiment, four different threshold voltages are generated for a memory cell MC so that 2-bit data can be written in one memory cell MC.

Figures 3, 4, 5:
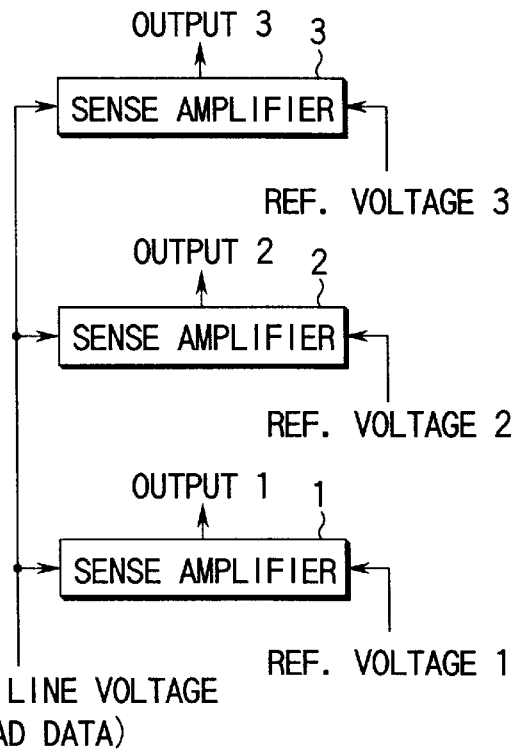
FIG. 3 is a block diagram schematically showing sense amplifiers for detecting data output from the memory device shown in FIG. 1.
FIG. 4 is a table showing the relationship between sense amplifier outputs and stored data.
FIG. 5 is a table showing the relationship between memory cell threshold voltages and stored data.

Read data (bit line voltage) output to an output node 16 is input to each of sense amplifiers 18A, 18B, and 18C shown in FIG. 15. Reference voltages 1, 2, and 3 of different levels each of which also changes between a read mode (a normal read mode) and a verify mode are supplied to the sense amplifiers 18A to 18C, respectively. The sense amplifiers 18A to 18C compare the bit line voltage with reference voltages 1 to 3, respectively. With this operation, the level of the bit line voltage relative to each of the reference voltages (READ reference voltages and VRFY reference voltages) 1 to 3 shown in FIG. 14A is detected. The sense amplifiers 18A to 18C output four combinations of outputs 1, 2, and 3 in accordance with the bit line voltage, as shown in FIG. 4. The 2-bit data is identified by the logic of outputs 1 to 3.

In the first embodiment, reference voltages 1 to 3 are changed between a read mode and a verify mode for checking after the data write mode in the memory cell whether predetermined data has been written.

FIG. 14A shows reference voltages 1 to 3 in the verify as VRFY reference voltages 1 to 3. FIG. 14A also shows reference voltages 1 to 3 in the read as READ reference voltages 1 to 3.

In the first embodiment, as shown in FIG. 14A, VRFY first reference voltage 1 is set at a level lower than the intermediate level between READ reference voltages 1 and 2 by a predetermined value. This can be represented by:

[VRFY first reference voltage 1] = [(READ first reference voltage 1 +

READ second reference voltage 2)/2] − [α]

where α is a predetermined positive value

Like VRFY first reference voltage 1, VRFY second reference voltage 2 is set at a level lower than the intermediate level between READ reference voltages 2 and 3 by a predetermined value. VRFY third reference voltage 3 is set at a level higher than READ third reference voltage 3 by a predetermined value. That is, in the first embodiment, VRFY reference voltages 1 to 3 are set at levels higher than READ reference voltages 1 to 3, respectively.

In the first embodiment, read data determination in the verify mode after the write mode is performed in the integration circuit or outside the circuit by reading out the data from the circuit at a time later than the normal time for outputting the data from the circuit. For example, as shown in FIG. 12, read data is determined in the verify mode at time TJD later than time TOD when data D1 of level "0" is output from the circuit in the read mode. In FIG. 12, data D1 and D2 are "01". This read data determination is done at the strobe timing of a write cycle shown in FIG. 13.

The strobe time is preferably as late as possible. This is because as the strobe time is late, data to be determined is DC-stabilized. However, if the strobe time is too late, the whole write time becomes long. Therefore, the strobe time may be set at an allowable optimum value in consideration of the relationship to the write characteristics of the memory cell. For example, the time from the time TOD to the data determination time TJD may be set to be relatively long. Alternatively, when the memory cell has excellent or improved write characteristics, the time may be shortened accordingly.

Currently, the time TJD is preferably 1 μsec after time TMSL when the memory cell has been selected while the time TOD is 100 nsec after the time TMSL. That is, currently, the time from the time TOD to the time TJD is preferably 900 nsec.

According to the nonvolatile semiconductor memory device of the first embodiment, read date determination in the verify mode after the write mode is performed in the integration circuit or outside the circuit by reading out the data from the circuit at a time later than the normal time for outputting the data from the circuit. Therefore, read data can be determined when the read data is DC-stabilized to some degree. By determining read data when the read data is DC-stabilized, the data can be determined at time when a small difference is generated between the bit line voltage and the reference voltage, i.e., the bit line voltage slightly exceeds the reference voltage. Therefore, as shown in FIG. 14B, a variation r in bit line voltage becomes smaller than that in the prior art, so the variation in read rate between selected memory cells can be minimized.

In the nonvolatile semiconductor memory device according to the first embodiment, which has a minimum variation in read rate, characteristic defects due to the insufficient read rate of the nonvolatile semiconductor memory device can be reduced, so the yield is improved. In addition, the minimum variation in read rate means an increase in read rate of the slowest cell, so the read rate can be further increased.

In the first embodiment, when one write time, e.g., a write pulse width Φp shown in FIG. 13 is made as small as possible to gradually write data, the variation r in bit line voltage between memory cells can be further decreased.

As described above, according to the first embodiment, the difference in read rate between selected memory cells can be made as small as possible.

Other embodiments of the nonvolatile semiconductor memory device according to the present invention will be described. The same portions as those of the first embodiment will be indicated in the same reference numerals and their detailed description will be omitted.

Second Embodiment

In the first embodiment, when it is determined outside the integration circuit chip whether desired data has been written, power supply noise is also preferably taken into consideration. In the first embodiment, to minimize the variation r in bit line voltage in the verify mode, data is determined when the bit line voltage even slightly exceeds the reference voltage. This means that the difference between the bit line voltage and the reference voltage becomes very small.

When data is output from the circuit, a charge/discharge current from an output buffer flows into the power supply line in the integration circuit. When the charge/discharge current flows into the internal power supply line, the power supply voltage in the integration circuit varies. When the internal power supply voltage varies, the bit line voltage and reference voltage change, so e.g., the bit line voltage may be lower than the reference voltage.

If the bit line voltage becomes lower than the reference voltage due to the variation in internal power supply voltage, it is determined that desired data has not been written yet even though it has actually been written, so the write operation is repeated. This is an excess write operation in the memory cell. Therefore, in the first embodiment, the minimized variation r in bit line voltage may be increased again.

In the second embodiment, in consideration of this situation, when determination is to be performed by outputting the data in the verify mode, the power supply voltage is prevented from largely changing in outputting the data.

For this purpose, in the second embodiment, the change in output data in outputting the data is made gradual. More specifically, in the read mode, data is abruptly output from the output buffer to maintain a high-speed data read, and in the verify mode, data is gradually output from the output buffer. With this operation, the variation in power supply in the integration circuit in the verify mode can be minimized.

Figure 16:
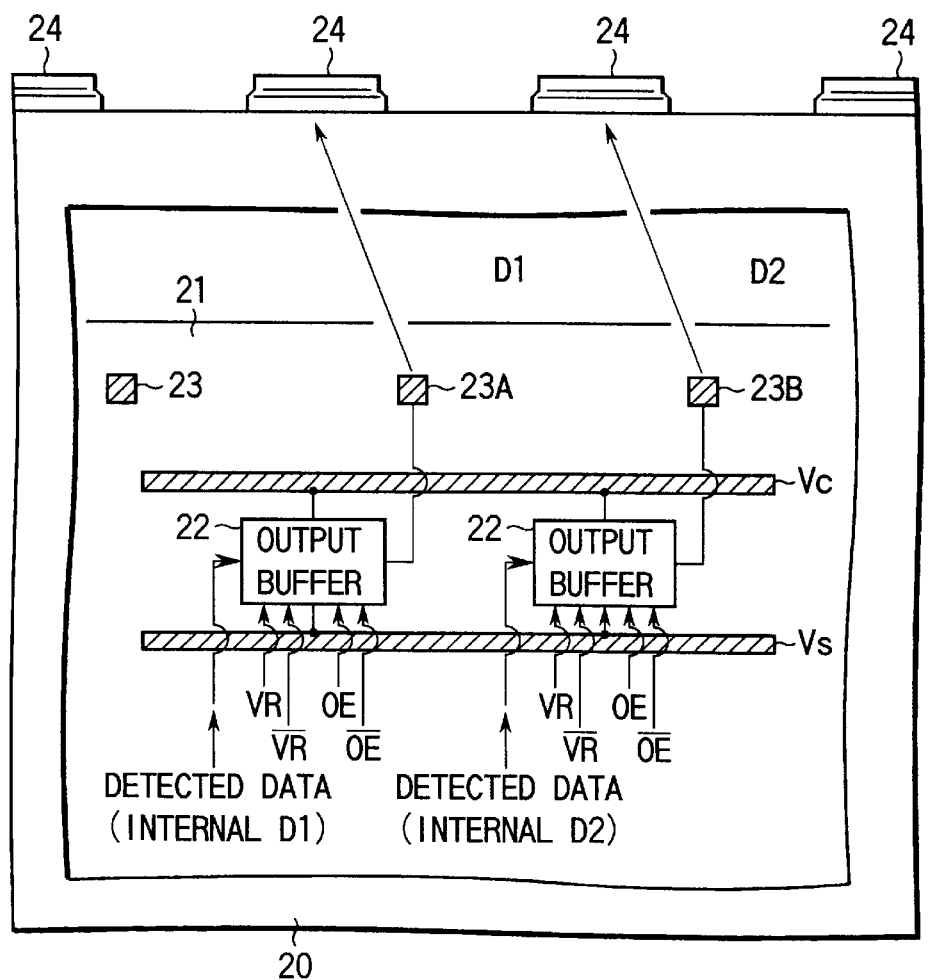
FIG. 16 is a view showing the output buffer of a nonvolatile semiconductor memory device according to a second embodiment of the present invention.
Figures 17, 18:
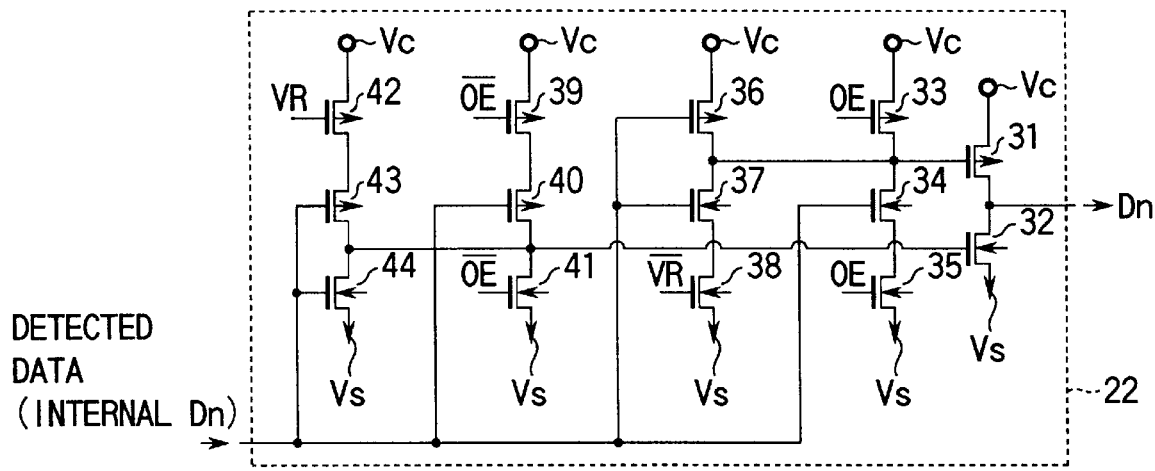
FIG. 17 is a circuit diagram of the output buffer of the second embodiment.
FIG. 18 is a table showing the levels of signals input to the output buffer shown in FIG. 17 in the respective operation modes.

FIG. 16 is a view showing the output buffer of the nonvolatile semiconductor memory device according to the second embodiment of the present invention. FIG. 17 is a circuit diagram of an output buffer 22 shown in FIG. 16. FIG. 18 is a table showing logic levels of signals input to the output buffer 22 shown in FIG. 17 in the respective modes. FIGS. 19A to 19D are charts showing output waveforms in outputting data from the nonvolatile semiconductor memory device according to the second embodiment of the present invention.

The second embodiment will be described below while exemplifying a 2-bit output buffer.

As shown in FIG. 16, a nonvolatile semiconductor memory device chip 21 is encapsulated with, e.g., a package 20. The chip 21 has two output buffers 22 for data D1 and D2. Each of the output buffers 22 receives detected data (internal D1 or D2) and outputs the detected data from the integration circuit chip 20 through a pad 23A or 23B in accordance with verify signals VR and /VR (in this specification, /VR represents the inverted signal of the signal VR) and output enable signals OE and /OE. The detected data are the data D1 and D2 obtained from the levels of outputs 1, 2, and 3 from sense amplifiers 18A to 18C shown in FIG. 15 by a logic circuit (not shown) on the basis of the relationship shown in FIG. 4. In the second embodiment, the data D1 and D2 before the input to the output buffers 22 are called internal D1 and D2 distinguished from the data D1 and D2 output from the output buffers 22.

An example of the output buffer 22 will be described next with reference to FIGS. 17 and 18.

In the example of the output buffer 22 shown in FIG. 17, in the read mode, the signal OE is set at a logic "1", and the inverted signal /OE is set at a logic "0", as shown in FIG. 18. The signal VR is set at a logic "0", and the inverted signal /VR is set at a logic "1". Therefore, a P-channel MOSFET (to be referred to as a PMOS transistor hereinafter) 33 and an N-channel MOSFET (to be referred to as an NMOS transistor hereinafter) 41 shown in FIG. 17 are turned off, and NMOS transistors 35 and 38 and PMOS transistors 39 and 42 are turned on.

If the detected data (internal data) is "1", NMOS transistors 34 and 37 are turned on, and a PMOS transistor 36 is turned off. The gate of a PMOS transistor 31 is discharged to level "0" by the NMOS transistors 34 and 35 and NMOS transistors 37 and 38, so the PMOS transistor 31 is turned on to output the data of level "1". Simultaneously, since the NMOS transistor 44 is turned on, and PMOS transistors 40 and 43 are turned off, the gate of an NMOS transistor 32 is also discharged to level "0", so the NMOS transistor 32 is turned off.

Figure 19A:
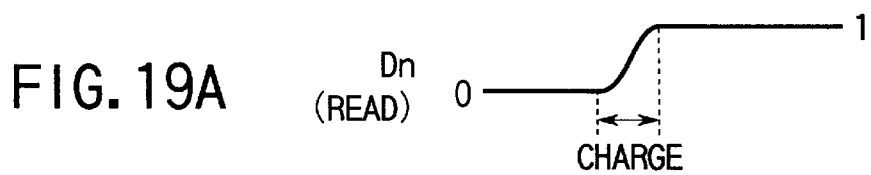
FIGS. 19A to 19D are charts showing output waveforms in outputting data from the nonvolatile semiconductor memory device according to the second embodiment.

As described above, in the output buffer 22 shown in FIG. 17 in the read mode, when the detected data is at level "1", the gate of the PMOS transistor 31 is discharged to level "0" through two current paths formed by the NMOS transistors 34 and 35 and the NMOS transistor 37 and 38. Therefore, the gate of the PMOS transistor 31 abruptly changes to level "0", so the output buffer 22 abruptly charges an external output terminal, e.g., an outer read terminal 24 shown in FIG. 16 through the PMOS transistor 31, as shown in FIG. 19A.

If the detected data is "0", the NMOS transistors 34 and 37 are turned off, and the PMOS transistor 36 is turned on. The gate of the PMOS transistor 31 is charged to level "1" by the PMOS transistor 36, so the PMOS transistor 31 is turned off. Simultaneously, since the NMOS transistor 44 is turned off, and the PMOS transistors 40 and 43 are turned on, the gate of the NMOS transistor 32 is also charged to level "1", so the NMOS transistor 32 is turned on.

Figure 19B:
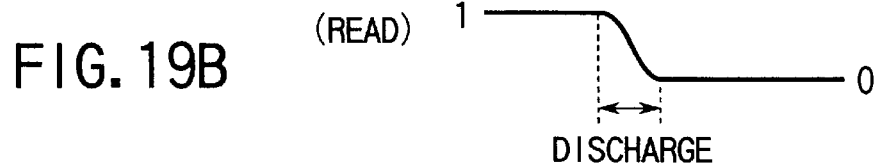

As described above, in the read mode, when the detected data is at level "0", the gate of the NMOS transistor 32 is abruptly charged to level "1" through two current paths formed by the PMOS transistors 39 and 40 and the PMOS transistor 42 and 43. Therefore, the gate of the NMOS transistor 32 abruptly changes to level "1", so the output buffer 22 abruptly discharges the read terminal 24 through the NMOS transistor 32, as shown in FIG. 19B.

In the verify mode, the signal OE is kept at "1", and the signal /OE is kept at "0", although the signal VR is set at "1", and the signal /VR is set at "0". Therefore, the PMOS transistors 33 and 42 and the NMOS transistors 41 and 38 are turned off, and the NMOS transistor 35 and the PMOS transistor 39 are turned on.

In the verify mode, when the detected data is "1", the NMOS transistors 34 and 35 are turned on, and the PMOS transistor 36 is turned off. Since the NMOS transistor 38 is OFF, the gate of the PMOS transistor 31 is discharged to level "0" by the NMOS transistors 34 and 35, so the PMOS transistor 31 is turned on to output data of level "1" from the circuit.

Figure 19C:
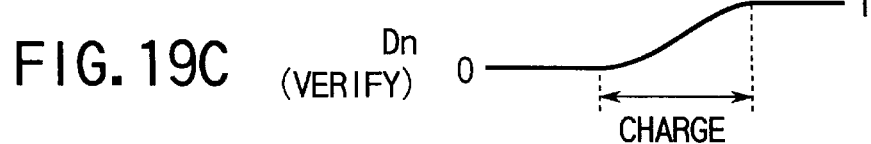

As described above, when the detected data is "1" in the verify mode, the gate of the PMOS transistor 31 is discharged to level "0" through only one current path formed by the NMOS transistors 34 and 35, unlike in the read mode. Therefore, the gate of the PMOS transistor 31 is gradually discharged to level "0", so the ON resistance of the PMOS transistor 31 gradually lowers. Therefore, as shown in FIG. 19C, the read terminal 24 is gradually charged through the PMOS transistor 31.

When the detected data is "0", the NMOS transistor 44 is turned off, and the PMOS transistors 40 and 43 are turned on. Since the PMOS transistor 42 is OFF, the gate of the NMOS transistor 32 is charged to level "1" through the PMOS transistors 39 and 40.

Figure 19D:
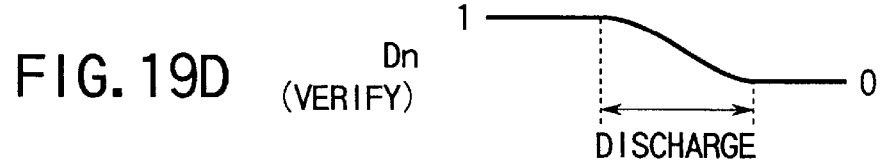

As described above, when the detected data is "0" in the verify mode, the gate of the NMOS transistor 32 is charged to level "1" through only one current path formed by the PMOS transistors 39 and 40, unlike in the read mode. Therefore, the gate of the NMOS transistor 32 is gradually charged to level "1". Therefore, as shown in FIG. 19D, the read terminal 24 is gradually discharged through the NMOS transistor 32.

In the second embodiment, the speed of transistor gate charging/discharging for outputting data from the circuit in the verify mode is lower than that in the read mode. With this arrangement, the output buffer 22 charges/discharges the read terminal 24 at a lower speed in the verify mode than in the read, so the change in current flowing into power supply lines Vs and Vc in charging/discharging the read terminal 24 can be made smaller than that in the read mode. Therefore, the variation in power supply voltage in the integration circuit in the verify mode can be reduced. Even when the difference between the bit line voltage and the reference voltage is small, the sense amplifiers 18A to 18C shown in FIG. 15 can reliably detect data.

As described above, according to the second embodiment as well, the difference in read rate between selected memory cells can be made as small as possible.

The first and second embodiments associated with determination of read data read out in the verify mode are especially effective for a nonvolatile semiconductor memory device having a NOR memory cell array.

Third Embodiment

In the first and second embodiments, when data is to be written in a memory cell, a predetermined write voltage Vpp is applied to the control gate of the memory cell. This voltage Vpp has a predetermined value independently of data to be written, i.e., "01", "10", and "11".

In the third embodiment, when data is to be written in a memory cell, the value of the voltage to be applied to the control gate of the memory cell is changed in accordance with data to be written.

Before a description of the third embodiment, a data write mode and a erase mode for a memory cell will be described with reference to FIGS. 8A and 8B used in the prior art.

To erase data from a memory cell, the voltage of a control gate CG connected to a word line is set at 0 V, and a high voltage is applied to a drain D or a source S for a cell shown in FIG. 8A, or the drain D for a cell shown in FIG. 8B to emit electrons from a floating gate FG.

In the erase mode, in the memory cell shown in FIG. 8A, control becomes complex because a memory transistor portion MT cannot have a negative threshold voltage. At the memory transistor portion MT, the control gate CG is capacitively coupled to a channel CH through the floating gate FG.

To the contrary, in the memory cell with an offset gate OG shown in FIG. 8B, the memory transistor portion MT may have a negative threshold voltage, so control for the erase is simplified as compared with the cell shown in FIG. 8A. The offset gate portion OG is a portion where the control gate CG is capacitively coupled to the channel CH without intervening the floating gate FG, unlike the memory transistor portion MT.

However, the cell shown in FIG. 8A can be formed to be smaller than that shown in FIG. 8B because, e.g., the offset gate portion OG need not be formed.

In both cells shown in FIGS. 8A and 8B having these advantages, the threshold voltage is lowest in the data erase state.

FIG. 4 shows the relationship between the cell threshold voltage and stored data.

As shown in FIG. 4, the data erase state corresponds to a lowest threshold voltage Vth1, i.e., a state wherein data "00" in FIG. 4 is stored.

For both cells shown in FIGS. 8A and 8B, to write data "01", "10", or "11" in the memory cell, predetermined voltages are applied to the drain D and the control gate CG, and the source S is set at 0 V. A current flows to the channel CH, so electrons are injected into the floating gate FG. Electron injection is performed until a corresponding threshold voltage Vth2, Vth3, or Vth4 is obtained.

In the third embodiment, when data "01", "10", or "11" is to be written, at least the value of the voltage to be applied to the control gate CG is changed to Vpp1, Vpp2, or Vpp3 in accordance with the threshold voltage Vth2, Vth3, or Vth4 to be set.

More specifically, when the memory cell threshold voltage is to be set at the second lowest threshold voltage Vth2, the lowest write voltage Vpp1 is applied to the control gate CG of the memory cell to inject electrons into the floating gate FG. After electron injection, verify is performed for a check, as described in the first embodiment. The injection and verify are repeated until the memory cell threshold voltage reaches Vth2. When the memory cell threshold voltage is to be set at the third lowest threshold voltage Vth3, the second lowest write voltage Vpp2 is applied to the control gate CG of the memory cell to inject electrons into the floating gate FG. When the memory cell threshold voltage is to be set at the highest threshold voltage Vth4, the highest write voltage Vpp3 is applied to the control gate CG of the memory cell to inject electrons into the floating gate FG.

When the voltage to be applied to the control gate CG is to be changed in accordance with the threshold voltage Vth2, Vth3, or Vth4, the amount of the change may be made to correspond to the threshold voltage after the write. The reason for this will be described below.

It is substantially the voltage of the floating gate FG that controls the channel CH of the memory cell, i.e., ON/OFF-controls the memory cell. Even when the threshold voltage changes, the voltage of the floating gate FG for turning on the memory cell does not change.

A memory cell, e.g., a memory cell having the threshold voltage Vth1 is turned on when the voltage Vth1 is applied to the control gate CG. Similarly, a memory cell having the threshold voltage Vth2 is turned on when the voltage Vth2 is applied to the control gate CG. This means that the voltage of the floating gate FG upon application of the voltage Vth1 to the control gate CG of the memory cell having the threshold voltage Vth1 is equal to that upon application of the voltage Vth2 to the memory cell having the threshold voltage Vth2.

The floating gate FG is capacitively coupled to the control gate CG. Assuming that the voltage of the floating gate FG is in the neutral state, the voltage of the floating gate FG is a function of the voltage of the control gate CG. Assume that the drain D and the source S are set at 0 V, and the voltage of the control gate CG is VcG. Letting VFG be the voltage of the floating gate FG, the voltage VFG of the floating gate FG, which is defined by capacitive coupling between the floating gate FG and the control gate CG, is given by:

$$VFG = \beta \times VcG$$

where $\beta$ is an arbitrary numerical value between 0 and 1

The voltage of the floating gate FG when the memory cell is turned on is kept constant regardless of the different memory cell threshold voltages.

Consider the memory cell having the threshold voltage Vth2. This memory cell is turned on when the voltage Vth2 is applied to the control gate CG. Letting V2 be the voltage of the floating gate FG, which is lowered in the negative direction by injected electrons, and VFG2 be the voltage of the floating gate FG when the voltage Vth2 is applied to the control gate CG, the voltage VFG2 is given by:

$$VFG2 = Vth2 \times \beta - V2 \qquad (1)$$

Let VFG23 be the voltage of the floating gate FG when the voltage Vth3 is applied to the control gate CG of this memory cell. The voltage VFG23 is given by:

$$VFG23 = Vth3 \times \beta - V2 \qquad (2)$$

For a memory cell having the threshold voltage Vth3, letting V3 be the voltage of the floating gate FG, which is lowered in the negative direction by injected electrons, and VFG3 be the voltage of the floating gate FG when the voltage Vth3 is applied to the control gate CG, the voltage VFG3 is given by:

$$VFG3 = Vth3 \times \beta - V3 \qquad (3)$$

That is, since the memory cell having the threshold voltage Vth2 is turned on when the voltage of the floating gate FG is VFG2 given by equation (1), and the memory cell having the threshold voltage Vth3 is turned on when the voltage of the floating gate FG is VFG3 given by equation (3), equations (1) and (3) equal each other, and equation (4) below holds:

$$Vth3 \times \beta - V3 = Vth2 \times \beta - V2 \qquad (4)$$

The electron injection amount is larger for the memory cell having the threshold voltage Vth3 than that for the memory cell having the threshold voltage Vth2. Therefore, the difference based on the electron injection amounts is represented as follows:

$$V3 - V2 = (Vth3 \times \beta) - (Vth2 \times \beta) \qquad (5)$$
$$= \beta(Vth3 - Vth2)$$

Data is written by applying the voltage Vpp1 to the control gate CG to set the memory cell threshold voltage at Vth2. Let VFG2P be the voltage of the floating gate FG when the voltage Vpp1 is applied after the write mode. The voltage VFG2P is given by:

$$VFG2P = Vpp1 \times \beta - V2 \qquad (6)$$

Electrons are attracted by the positive voltage of the floating gate FG and injected into the floating gate FG. Electron injection into the floating gate FG depends on the level of the voltage of the floating gate FG. When the memory cell threshold voltage is to be set at Vth3, the voltage Vpp2 is applied to the control gate CG. The voltage of the floating gate FG when electron injection is complete can be made equal to that when the memory cell threshold voltage is set at Vth2 by satisfying equation (7) below using equation (6):

$$Vpp2 \times \beta - V3 = VFG2P \qquad (7)$$
$$= Vpp1 \times \beta - V2$$

The voltage Vpp2 for satisfying equation (7) is given by equation (8) below rewritten from equation (7):

$$Vpp2 = Vpp1 + \{(V3 - V2)/\beta\} \qquad (8)$$

That is, the voltage Vpp2 may be made higher than the voltage Vpp1 by $(V3-V2)/\beta$. $(V3-V2)$ corresponds to $\beta(Vth3-Vth2)$, as is apparent from equation (5). Substitution of this value into equation (8) yields:

$$Vpp2 = Vpp1 + (Vth3 - Vth2) \qquad (9)$$

As can be seen from equation (9), a voltage higher by the difference between the threshold voltages to be set may be applied.

Similarly, to set the memory cell threshold voltage at Vth4, the voltage Vpp3 to be applied to the control gate CG of the memory cell may be set to be higher than the voltage Vpp1 applied to set the memory cell threshold voltage Vth2 by a value obtained by subtracting the threshold voltage Vth2 from the threshold voltage Vth4.

When the write voltage is changed in correspondence with data to be written, the voltage states of the floating gate FG after the writes can be made equal. Therefore, when electrons are to be injected into the floating gate FG, the voltage differences between the floating gate FG and the channel CH can be made equal independently of the value of the data to be written.

A voltage higher by the difference between threshold voltages to be set is applied. However, a voltage higher by the difference between reference voltages corresponding to the voltages to be set may be applied. For example, when data "10" of bit line voltage 3 shown in FIG. 14A is to be written, a voltage higher than that applied to the control gate CG in writing data "01" of bit line voltage 2 by the difference between VRFY second reference voltage 2 and VRFY first reference voltage 1 or the difference between READ second reference voltage 2 and READ first reference voltage 1 may be applied.

The arrangement of the nonvolatile semiconductor memory device according to the third embodiment will be described next. In the first and second embodiments, the memory cells MC are arrayed in a matrix, as shown in FIG. 1, and data of a plurality of bits is stored in one memory cell MC.

Figure 21:
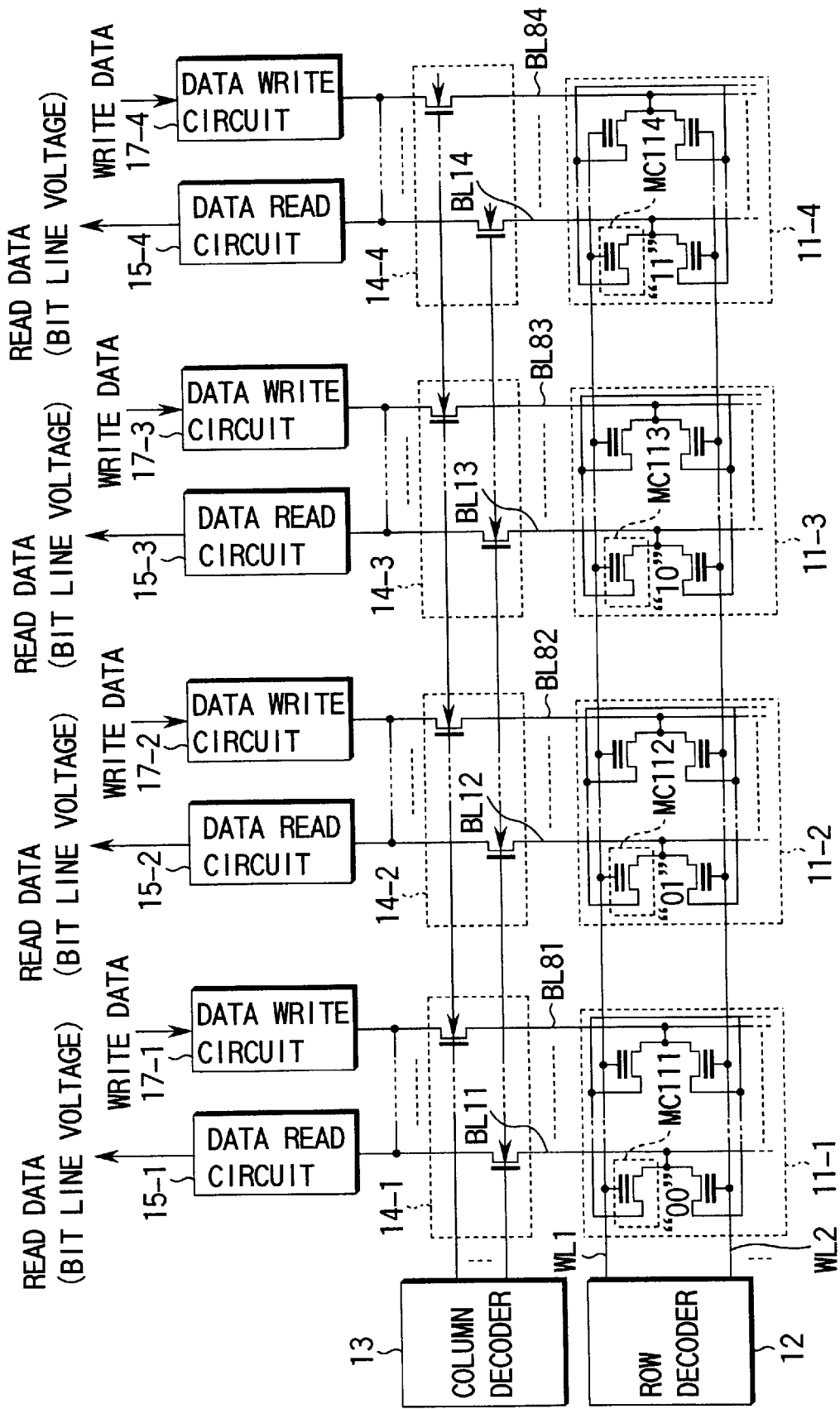
FIG. 21 is a circuit diagram schematically showing the arrangement of the nonvolatile semiconductor memory device according to the third embodiment.

When data is to be written in one memory cell MC connected to one word line (row line) WL, a plurality of memory cell arrays 11 having the arrangement shown in FIG. 1 may be arranged, and the word line (row line) WL may be commonly connected to the plurality of memory cell arrays 11. FIG. 21 shows this arrangement.

As shown in FIG. 21, four memory cell arrays 11-1 to 11-4 are arranged. Word lines WL1, WL2, . . . are commonly connected to the four memory cell arrays 11-1 to 11-4. A total of four column selectors 14 (14-1 to 14-4) are arranged in correspondence with the memory cell arrays 11-1 to 11-4, respectively. Similarly, a total of four data read circuits 15 (15-1 to 15-4) and a total of four data write mode circuits 17 (17-1 to 17-4) are arranged in correspondence with the memory cell arrays 11-1 to 11-4, respectively.

In the arrangement shown in FIG. 21, a plurality of (in this case, four) memory cells MC in which data are to be written are connected to one word line (row line) WL. In the example shown in FIG. 21, when the word line WL1 is selected, data are written in memory cells MC111 to MC114 having control gates connected to the word line WL1 and drains connected to bit lines BL11 to BL14 selected by one column selection signal, respectively.

When a plurality of memory cells MC in which data are to be written are connected to one word line WL, the write operation is started from data "01" set at the second lowest threshold voltage Vth2, and then, data "10" set at the third lowest threshold voltage Vth3, and data "11" set at the highest threshold voltage Vth4 are sequentially written in ascending order of threshold voltages.

In the third embodiment, when electrons are being injected into the floating gate FG of, e.g., the memory cell MC112 to write data "01" in the memory cell MC112 shown in FIG. 21, electrons are also injected into the floating gate FG of the memory cell MC113 in which data "10" is to be written, and the floating gate FG of the memory cell MC114 in which data "11" is to be written, thereby raising the threshold voltages of these memory cells. Therefore, the write voltage is applied not only to the bit line BL12 but also to the bit lines BL13 and BL14 to apply the write voltage to the drains of the memory cells MC112 to MC114. FIG. 22 shows this state.

FIG. 22 is a chart showing changes in drain voltages of memory cells and word line voltages in the write mode of the third embodiment.

As shown in FIG. 22, when data "01" is to be written, i.e., the threshold voltage is to be set at Vth2, the voltage Vpp1 is applied to the word line WL1, and a predetermined write voltage, e.g., a voltage Vc is applied to the drains of the memory cells MC112 to MC114. The verify in writing data "01" may be performed either only in the memory cell MC112 or in the three memory cells MC112 to MC114.

Upon completing the write of data "01", data "10" is written, as shown in FIG. 22. When data "10" is to be written, the voltage Vpp2 is applied to the word line WL1, and a write voltage is applied to the drain of the memory cell MC113 in which data "10" is to be written and the drain of the memory cell MC114 in which data "11" is to be written. No write voltage is applied to the drain of the memory cell MC112 in which data "01" has been written.

Upon completing the write of data "10", data "11" is written. To write data "11", the voltage Vpp3 is applied to the word line WL1, and a write voltage is applied to the drain of the memory cell MC114 in which data "11" is to be written. No write voltage is applied to the drain of the memory cell MC112 in which data "01" has been written and the drain of the memory cell MC113 in which data "10" has been written.

The row decoder 12 includes a voltage generator for generating the above three voltages Vpp1, Vpp2 and Vpp3 and a decoder for supplying one of these voltages Vpp1, Vpp2 and Vpp3 to a selected word line.

According to the third embodiment, the threshold voltages corresponding to data "01", "10", and "11" are sequentially set in ascending order of threshold voltages. In addition, when electrons are being injected into the floating gate of a memory cell having a low threshold voltage, electrons are also injected into the floating gates of memory cells having higher threshold voltages. Therefore, the write time can be shortened as compared to a case is which data "01", "10", and "11" are separately written.

When the same data is to be written in the plurality of memory cells MC connected to one word line WL, e.g., when data "10" is to be written in the memory cells MC112 to MC114, only a corresponding write voltage, i.e., the voltage Vpp2 is applied to the word line WL1.

The third embodiment is not only applied to a write scheme of changing the word line voltage in correspondence with the threshold voltage to be set but also a write scheme without changing the word line voltage as shown in FIG. 23.

FIG. 23 is a chart showing changes in drain voltages of memory cells and word line voltages in the write mode according to a modification of the third embodiment.

As shown in FIG. 23, when data is to be written in a memory cell without changing the voltage to be applied to the control gate in correspondence with the threshold voltage to be set as well, the data write mode is started from the memory cell MC112 set at the second lowest threshold voltage Vth2. At this time, like the waveforms shown in FIG. 22 of the third embodiment, a predetermined write voltage is also applied to the drain of the memory cell MC113 set at the third lowest threshold voltage Vth3 and the drain of the memory cell MC114 set at the highest threshold voltage Vth4 to inject electrons into the floating gates. When the memory cell is to be set at the third lowest threshold voltage Vth3, a predetermined write voltage is also applied to the drain of the memory cell MC114 set at the highest threshold voltage to inject electrons into the floating gate.

In this modification as well, the same effect as in the write described in FIG. 22 can be obtained. It is to be noted that the periods of time during which the voltages Vpp1, Vpp2 and Vpp3 are applied to the word line differ from that shown in FIG. 22.

Figure 24:
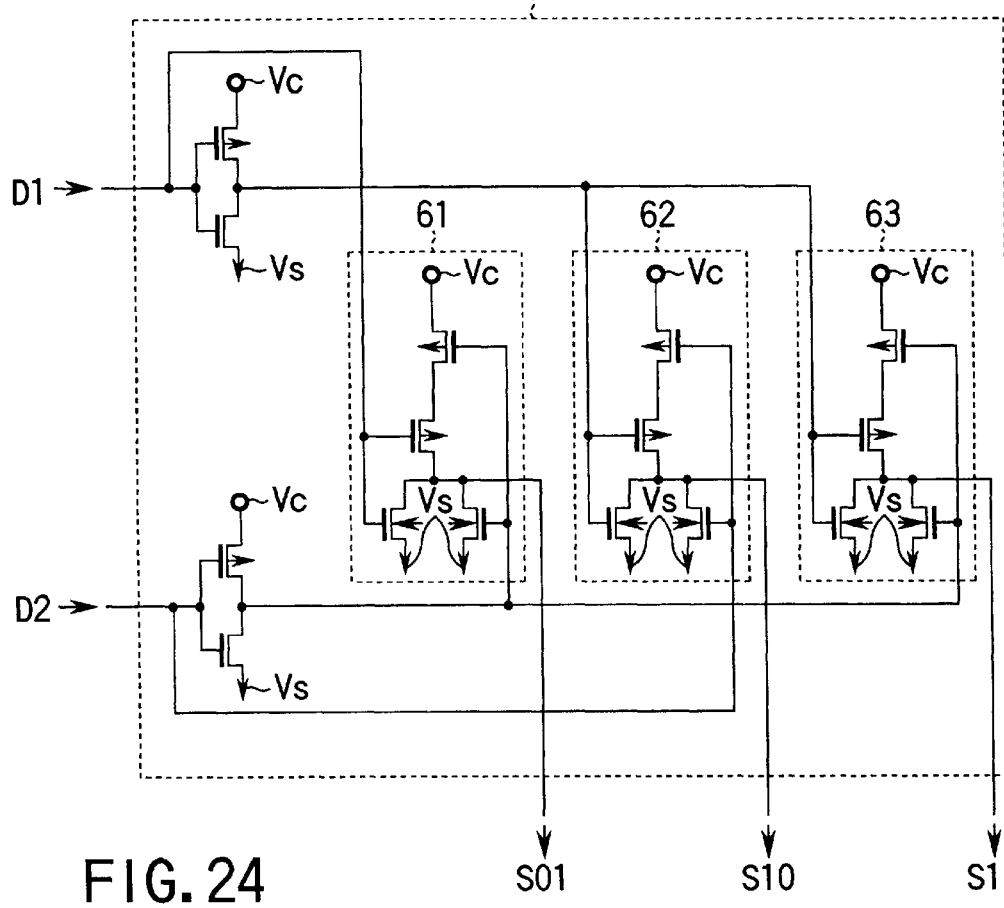
FIG. 24 is a circuit diagram showing the detection circuit of the nonvolatile semiconductor memory device according to the third embodiment.

Whether 2-bit data to be written in a memory cell, e.g., D1 and D2 are "0" and "1", "1" and "0", or "1", and "1" is detected by a circuit as shown in FIG. 24.

FIG. 24 is a circuit diagram of a detection circuit for detecting the type of data to be written in the nonvolatile semiconductor memory device according to the third embodiment.

As shown in FIG. 24, a detection circuit 51 has three NOR gate circuits 61 to 63.

When the data D1 and D2 to be input to the detection circuit 51 are "0" and "1", respectively, two inputs to the NOR gate circuit 61 in the detection circuit 51 are at "0", so an output signal S01 is at "1". At this time, since at least one of two inputs to each of the remaining NOR gate circuits 62 and 63 is at "1", output signals S10 and S11 are at "0".

When the data D1 is "1", and the data D2 is "0", both the two inputs to the NOR gate circuit 62 are at "0", so the output signal S10 is at "1". Since at least one of two inputs to each of the remaining NOR gate circuits 61 and 63 is at "1", the output signals S01 and S11 are at "0".

When both the data D1 and D2 are "1", both the two inputs to the NOR gate circuit 63 are at "0", so the output signal S11 is at "1". Since at least one of two inputs to each of the remaining NOR gate circuits 61 and 62 is at "1", the output signals S01 and S10 are at "0".

As described above, in the detection circuit 51, one of the signals S01, S10, and S11 is set at "1" in accordance with the combination of data to be written in the memory cell.

Assume that the four memory cell arrays 11 are arranged, and the word line (row line) WL to be selected by one row decoder 12 is commonly connected to the memory cell arrays 11-1 to 11-4, as shown in FIG. 21. Data is written in the four memory cells MC, i.e., the memory cells MC1l1 to MC114 connected to one word line WL at maximum.

In this case, when all the four memory cells MC111 to MC114 are to be set at the threshold voltage Vth1 (data "00"), it is unnecessary to apply a voltage to the word line WL1 to write data. For only the threshold voltages Vth2 (data "01") and Vth3 ("10"), only the voltages Vpp1 and Vpp2 need be applied to the word line WL1.

In the third embodiment, data to be written is determined, and a voltage is applied to the memory cell, as needed. For this purpose, four detection circuits 51 shown in FIG. 24 must be prepared, as shown in FIG. 25.

Figure 25:
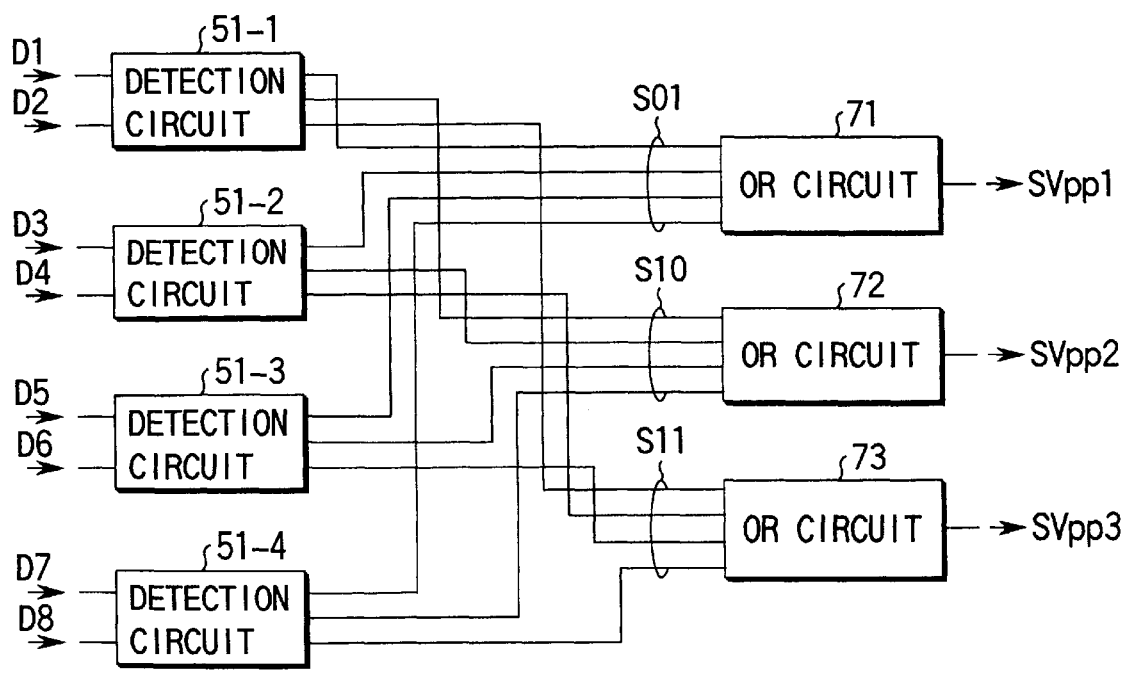
FIG. 25 is a circuit diagram showing the controller of the nonvolatile semiconductor memory device according to the third embodiment.

FIG. 25 is a circuit diagram of a controller in the nonvolatile semiconductor memory device according to the third embodiment, which controls voltage application upon determining data to be written.

Two-bit data (D1 and D2), (D3 and D4), (D5 and D6), and (D7 and D8) to be stored in the four memory cells MC111 to MC114 as shown in FIG. 21 are respectively input to four detection circuits 51-1 to 51-4 in the controller shown in FIG. 25. A total of four signals S01 output from the four detection circuits 51-1 to 51-4 are input to an OR gate circuit 71. Simultaneously, a total of four signals S10 are input to an OR gate circuit 72, and a total of four signals S11 are input to an OR gate circuit 73.

If any one of the four signals S01 is at "1", an output signal Svpp1 from the OR gate circuit 71 is at "1". If all the four signals S01 are at "0", the output signal Svpp1 is at "0".

The output signal Svpp1 of level "1" means the presence of a memory cell having the threshold voltage Vth2. In this case, a write operation for setting the threshold voltage at Vth2 is performed for the selected memory cell.

On the other hand, the output signal Svpp1 of level "0" means the absence of a memory cell having the threshold voltage Vth2. In this case, the write for setting the threshold voltage at Vth2 is omitted, and the process advances to setting of the next threshold voltage.

When any one of the four signals S10 is at "1", an output signal Svpp2 from the OR gate circuit 72 is at "1". If all the four signals S10 are at "0", the output signal Svpp2 is at "0".

The signal Svpp2 of level "1" means the presence of a memory cell having the threshold voltage Vth3. In this case, a write operation for setting the threshold voltage at Vth3 is performed for the selected memory cell.

On the other hand, the signal Svpp2 of level "0" means the absence of a memory cell having the threshold voltage Vth3. In this case, the write operation for setting the threshold voltage at Vth3 is omitted.

When any one of the four signals S11 is at "1", an output signal Svpp3 from the OR gate circuit 73 is at "1". If all the four signals S11 are at "0", the output signal Svpp3 is at "0".

When the signal Svpp3 is at "1", a write operation for setting the threshold voltage at Vth4 is performed for the selected memory cell.

When the signal Svpp3 is at "0", the write operation for setting the threshold voltage at Vth3 is omitted.

As described above, whether the write operation is to be performed is determined on the basis of the level of the signals Svpp1 to Svpp3, i.e., "0" or "1". Since the write operation is omitted in some cases, the write time can be shortened.

In addition, the memory cell is set at a predetermined threshold voltage. Therefore, when electrons are being injected into the floating gate of this memory cell, electrons are simultaneously injected into the floating gates of other memory cells having higher threshold voltages to further shorten the write time.

As described above, according to the third embodiment, the write time for writing data to be stored using a plurality of threshold voltages can be made as short as possible.

The third embodiment is effectively applied not only to a nonvolatile semiconductor memory device having a NOR type memory cell array but also to a nonvolatile semiconductor memory device having a NAND type memory cell array.

Fourth Embodiment

Figure 6:
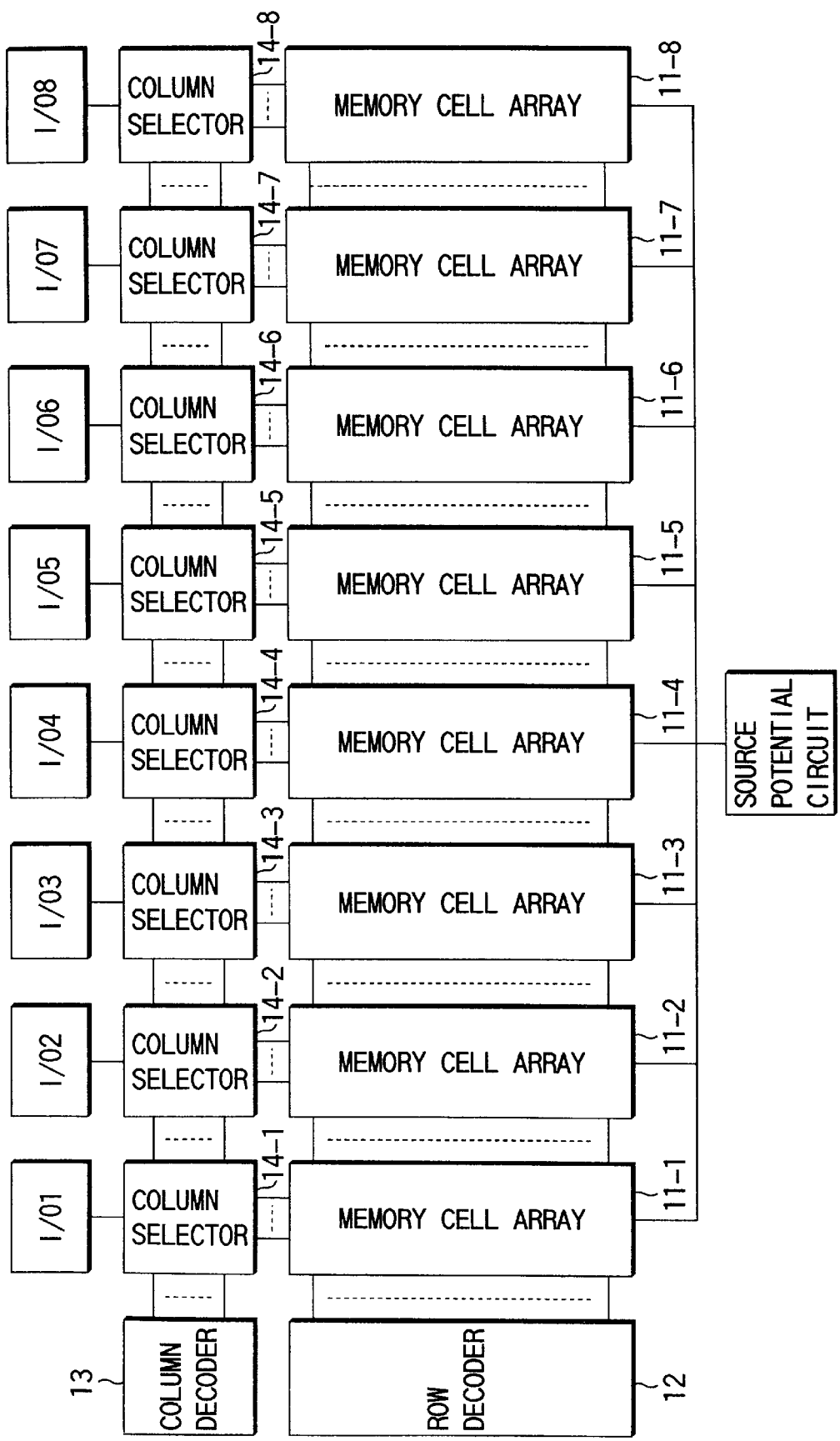
FIG. 6 is a circuit diagram showing a conventional source potential circuit.
Figure 26:
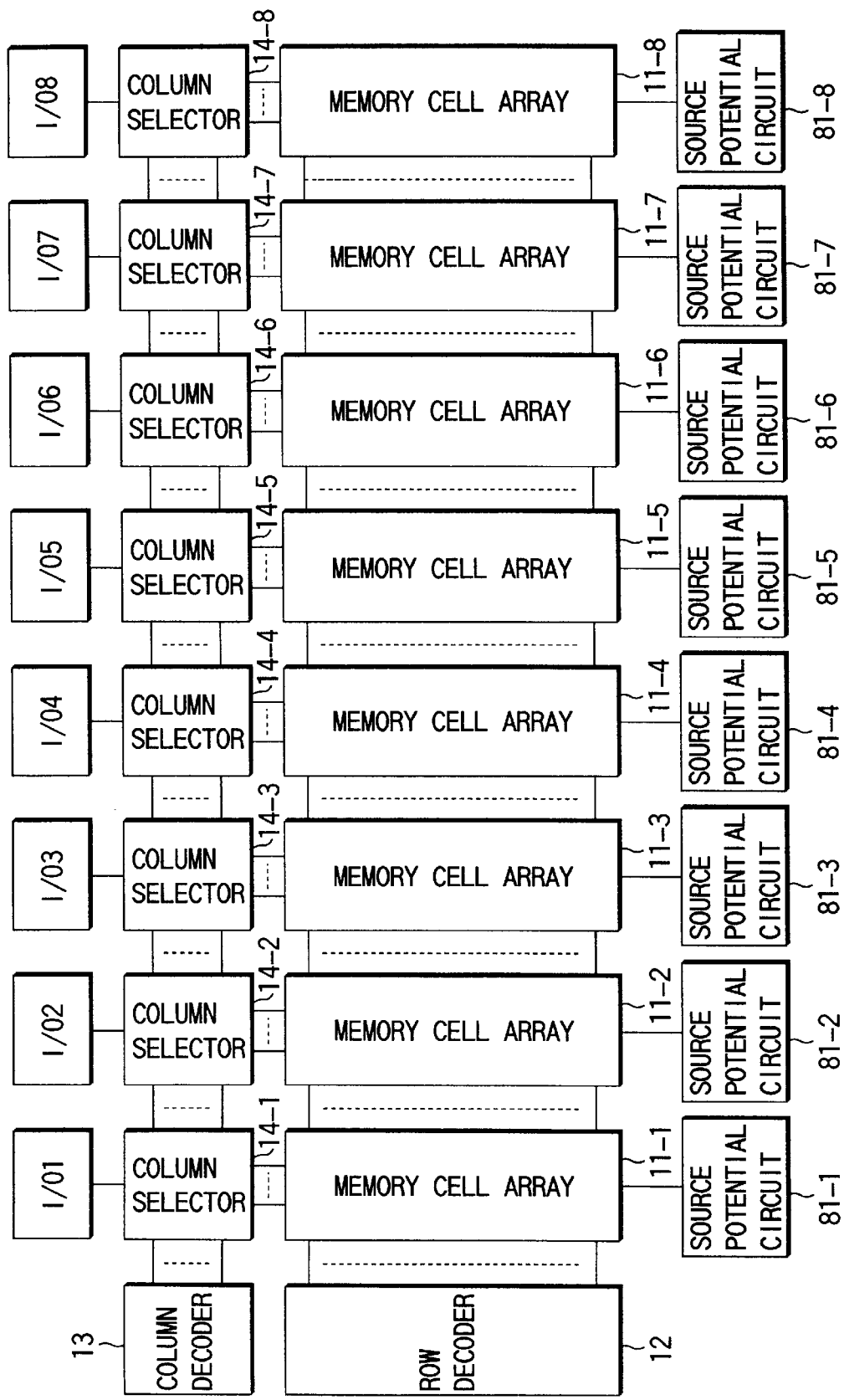
FIG. 26 is a circuit diagram schematically showing the arrangement of a nonvolatile semiconductor memory device according to a fourth embodiment of the present invention.

FIG. 26 shows the schematic arrangement of a nonvolatile semiconductor memory device having an 8-bit output structure according to the fourth embodiment. In the prior art shown in FIG. 6, the source potential circuit for applying a high voltage to the source of a memory cell in a data erase mode and a reference voltage (0 V) in data read and write modes is commonly connected to the eight output bits. In the fourth embodiment, however, source potential circuits 81-1 to 81-8 are arranged in correspondence with output bits (I/O lines), as shown in FIG. 26.

Each of the source potential circuits 81-1 to 81-8 performs the same operation as that of the prior art in the data erase and data read modes but, in the data write mode, applies a voltage corresponding to data to be written to the source of the memory cell. In this embodiment, in the data write mode, predetermined voltages are applied from the independent source potential circuits 81-1 to 81-8 to memory cell arrays 11-1 to 11-8 (each memory cell array has memory cells two-dimensionally arranged in a matrix, as shown in FIG. 1) corresponding to the output bits, respectively. More specifically, the lowest threshold voltage (Vs3 in FIG. 27) is applied to the memory cell array having a memory cell for which the highest threshold voltage (Vth4 in FIG. 27) is to be set, thereby performing the data write operation. To set a lower threshold voltage Vth3 next to the threshold voltage Vth4, a voltage Vs2 higher than the voltage Vs3 by a predetermined value is applied. When a lower threshold voltage Vth2 next to the threshold voltage Vth3 is to be set, a voltage Vs1 higher than the voltage Vs2 by a predetermined value is applied. The source voltage is set at a predetermined value in correspondence with data to be written, and data are simultaneously written in the memory cells. Letting VcG be the voltage of the control gate, (VcG−Vs3)>(VcG−Vs2)>(VcG−Vs1) holds. Therefore, the voltage difference between the source and the control gate of the memory cell can be increased in descending order of threshold voltages. That is, since the write operation is performed while increasing the voltage difference between the source and the control gate of the memory cell in descending order of the amounts of electrons needed be injected into the floating gate, the voltage difference can be optimized in correspondence with the threshold voltage to be set. Since precision of threshold voltage setting is improved, and data can be simultaneously written in the memory cells, the write time can be shortened.

Figures 27, 28:
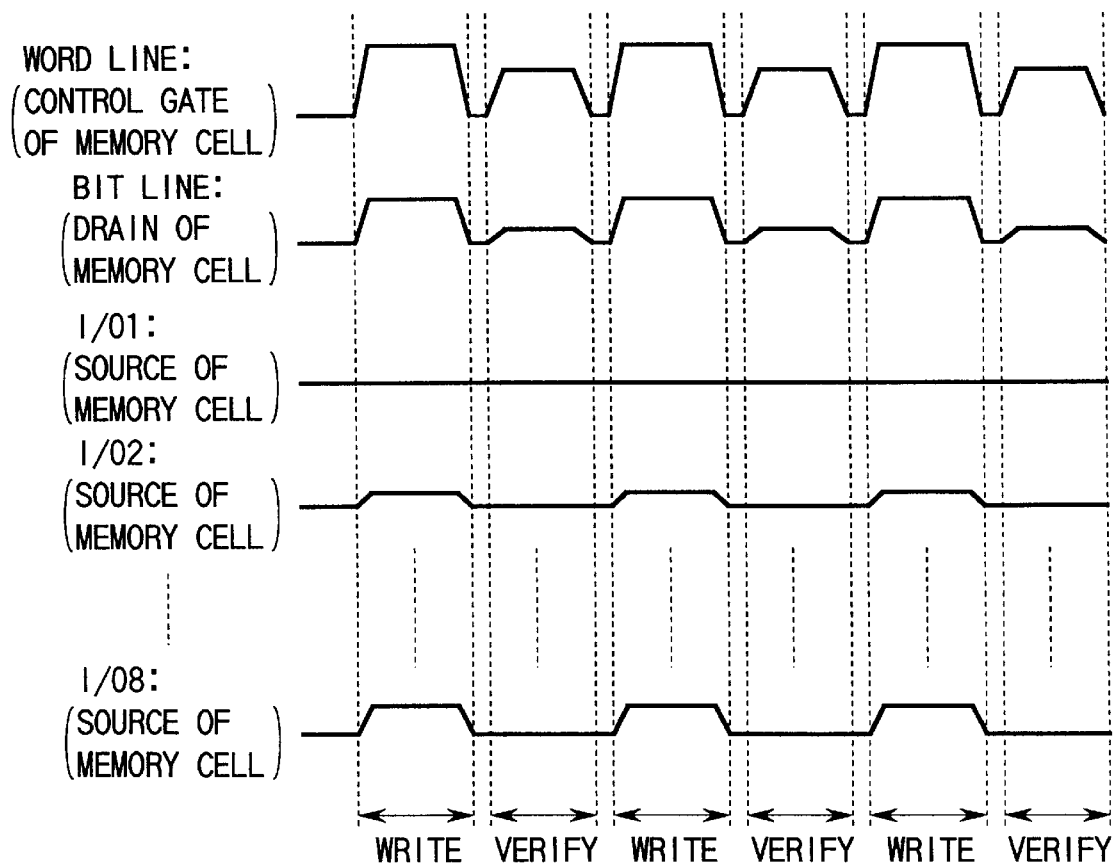
FIG. 27 is a table showing the relationship between stored data, memory cell threshold voltages, and writing source voltages of the memory cell in the fourth embodiment.
FIG. 28 is a chart showing operating waveforms in repeating the data write and verify modes in the fourth embodiment.

FIG. 28 shows a state wherein the write and verify operations are repeatedly performed until the memory cell is set at a predetermined threshold voltage in this embodiment. In the data write mode, the source of the memory cell is set at a predetermined voltage in correspondence with data (threshold voltage) to be written. If it is determined in the verify mode that the memory cell has reached the predetermined threshold voltage, voltage application to the drain of this memory cell is stopped, and the data write operation for other bits corresponding to the memory cells not reaching predetermined threshold voltages is continued.

A specific arrangement of the source potential circuit 81 will be described next.

Figures 29, 30:
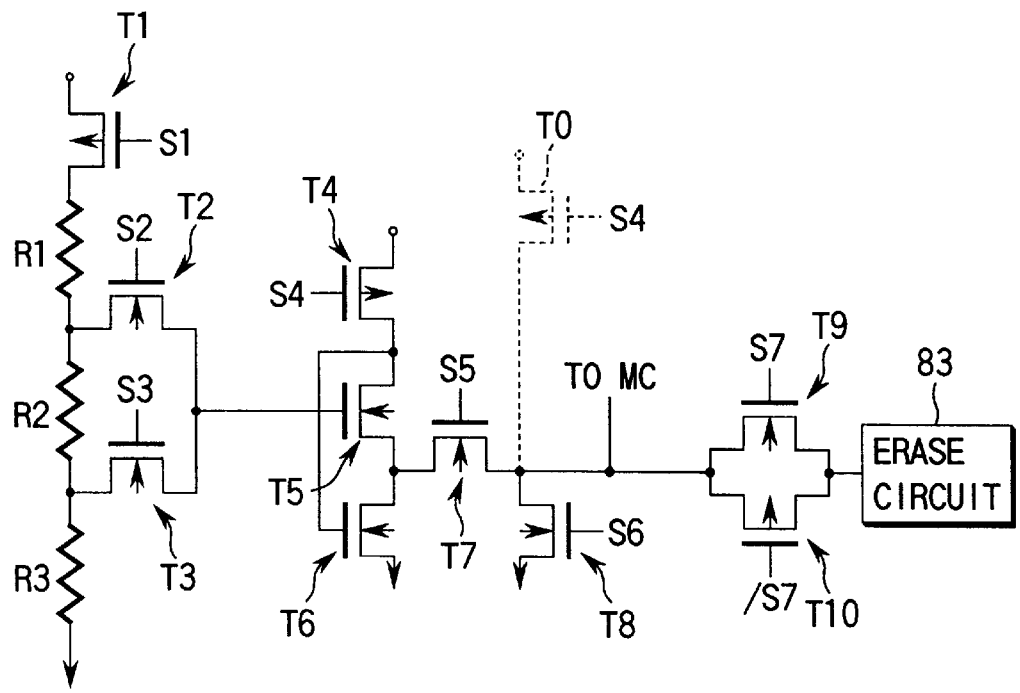
FIG. 29 is a circuit diagram showing the first example of a source potential circuit in the fourth embodiment.
FIG. 30 is a table showing the logic signal level of the source potential circuit shown in FIG. 29.

FIG. 29 shows the first example of the source potential circuit 81. FIG. 30 shows the logic level of signals. In the data write mode, a signal S7 is set at "0", and an inverted signal /S7 of the signal S7 is set at "1" to turn off an N-channel transistor T9 and a P-channel transistor T10, thereby disconnecting an erase circuit 83 from a memory cell MC. To set the source voltage of the memory cell MC at a highest voltage VS1, a signal S1 is set at "0" to turn on a P-channel transistor T1. In addition, a signal S2 is set at "1", and a signal. S3 is set at "0" to turn on a transistor T2 and off a transistor T3. Therefore, the voltage at the connection point between resistors R1 and R2 is applied to the gate of a transistor T5 through the transistor T2. In addition, a signal S4 is set at "0" to turn on a P-channel transistor T4. A signal S5 is set at "1", and a signal S6 is set at "0" to turn on a transistor T7 and off a transistor T8. Therefore, the source of the memory cell is connected to the connection point between the transistors T5 and T6 through the transistor T7.

To write data in the memory cell, a current is flowed through the memory cell so the memory cell is discharged to the reference voltage through the transistors T7 and T6. When the current flows, the voltage of the drain of the transistor T6, i.e., the source of the memory cell increases due to the resistance of the transistor T6. As the voltage approaches a voltage obtained by subtracting the threshold voltage of the transistor T5 from the voltage at the connection point between the resistors R1 and R2, the transistor T5 is close to the OFF state. Therefore, the voltage at the connection point of the transistors T4 and T5, i.e., the gate voltage of the transistor T6 increases to flow a current to the transistor T6 in a larger amount. Therefore, the source voltage of the memory cell is stabilized at a voltage slightly lower than the voltage obtained by subtracting the threshold voltage of the transistor T5 from the voltage at the connection point between the resistors R1 and R2.

When the source voltage of the memory cell is to be set at a second highest voltage VS2, the signal S2 is set at "0", and the signal S3 is set at "1" to turn off the transistor T2 and on the transistor T3. Therefore, the voltage at the connection point between the resister R2 and R3, which is lower than the voltage at the connection point between the resisters R1 and R2, is applied to the gate of the transistor T5 through the transistor T3. Therefore, the source voltage of the memory cell is stabilized at a voltage slightly lower than a voltage obtained by subtracting the threshold voltage of the transistor T5 from the voltage at the connection point between the resistors R2 and R3.

To set the source voltage of the memory cell at a lowest voltage VS3, the signal S5 is set at "0", and the signal S6 is set at "1". The transistor T7 is turned off, and the transistor T8 is turned on. If the resistance value of the transistor T8 in the ON state is made substantially small, a voltage close to the reference voltage can be obtained as VS3. Note that when the signals S1 and S4 are set at "1" to turn off the transistors T1 and T4, the current consumption can be reduced.

In the data read mode, the signals SI and S4 are set at "1" to turn off the P-channel transistors T1 and T4. In addition, the signal S5 is set at "0", and the signal S6 is set at "1" to turn off the transistor T7 and on the transistor T8, thereby connecting the source of the memory cell to the reference voltage through the transistor T8.

In the data erase mode, the signals S5 and S6 are set at "0" to turn off the transistors T7 and T8. The signal S7 is set at "1", and the signal /S7 is set at "0" to turn on the transistors T9 and T10. With this operation, a high voltage output from the erase circuit is applied to the source of the memory cell through the transistors T9 and T10 to erase data.

Although a P-channel transistor T0 having a gate to which the signal S4 is input, which is indicated by broken lines, need not be particularly arranged, when this transistor is turned on in setting the source voltage of the memory cell at VS1 or VS2, the source voltage of the memory cell is further stabilized. More specifically, when electrons are injected into the floating gate of the memory cell, the current flowing to the memory cell changes. If the P-channel transistor T0 is arranged to supply a current from this transistor, the current flowing to the reference voltage through the transistors T6 and T7 increases. Therefore, the ratio of a change in the whole current to that in current flowing to the memory cell becomes small.

FIGS. 31 and 32 show the second example of the source potential circuit 81. In this example, the resistance value of a transistor connected between the memory cell and the reference voltage is changed in correspondence with the memory cell threshold voltage to be set, thereby setting the source voltage of the memory cell. Note than the transistors T9 and T10 are the same as those shown in FIG. 29, and they are OFF in the data write mode and read mode.

As shown in FIG. 32, when the source voltage of the memory cell is to be set at the highest voltage VS1, a signal SB is set at "1", and signals S9 and S10 are set at "0". Of transistors T11 to T13, only the transistor T11 is turned on. Because of the current flowing from the memory cell to the reference voltage through the transistor T11, the voltage difference generated between the drain and the source of the transistor T11 becomes VS1.

To set the second highest voltage VS2, the signals S8 and S9 are set at "1" to turn on the transistors T11 and T12. When the transistor T12 is turned on, the resistance value between the source of the memory cell and the reference voltage becomes smaller, so the source voltage of the memory cell lowers by this value.

When the threshold voltage is to be set at the lowest voltage VS3, all the signals S8 to S10 are set at "1" to turn on the transistors T11 to T13, the source of the memory cell is set at the lowest voltage.

In the data read mode as well, all the transistors T11 to T13 are turned on to set the source voltage of the memory cell at the lowest voltage, thereby reading data. In the data erase mode, the transistors T11 to T13 are turned off, and a high voltage from the erase circuit 83 is applied to the source of the memory cell through the transistors T9 and T10 which are ON in the data erase mode, thereby erasing data.

FIGS. 33 and 34 show the third example of the source potential circuit 81. In this example, the source voltage of the memory cell is set in correspondence with data to be written in the memory cell, i.e., the memory cell threshold voltage to be set using the threshold voltage of a transistor. In this example as well, the transistors T9 and T10 are the same as those shown in FIG. 29, and they are OFF in the data write mode and read mode.

As shown in FIG. 34, when the source voltage of the memory cell is to be set at the highest voltage VS1, a signal S11 is set at "1", and signals S12 and S13 are set at "0". Transistors T18 and T19 are turned off, and a transistor T16 is turned on to connect the source voltage of the memory cell to the reference voltage through transistors T14 and T15, each of which has a gate and a drain connected to each other, so the threshold voltage is set almost at the sum value of the threshold voltages of the transistors T14 and T15.

To set the second highest voltage VS2, the signals S11 and S12 are set at "1" to turn on the transistors T16 and T18. Since the source of the memory cell is connected to the reference voltage through the transistor T17 having a gate and a drain connected to each other, the source voltage of the memory cell is set almost at the threshold voltage of the transistor T17. Since the sum of the threshold voltages of the transistors T14 and T15 is higher than the threshold voltage of the transistor T17, the transistors T14 and T15 do not substantially operate. Therefore, the signal S11 may be set at "0" to turn off the transistor T16.

To set the lowest voltage VS3, all the signals S11 to S13 are set at "1" to turn on the transistors T16, T18, and T19. The transistor T19 is turned on to set the source of the memory cell almost at the reference voltage. Therefore, the source of the memory cell is set at the lowest voltage. At this time, since the transistors T14, T15, and T17 do not substantially operate, the signals S11 and S12 may be set at "0" to turn off the transistors T16 and T18.

In the data read, all the transistors T16, S18, and S19 may be turned on. However, since the transistors T14, T15, and T17 do not substantially operate, as described above, only the transistor T19 may be turned on to read data. In the data erase mode, the transistors T16, T18, and T19 are turned off to apply a high voltage from the erase circuit 83 to the source of the memory cell through the transistors T9 and T10 which are ON in the data erase mode, thereby erasing data.

Figure 35:
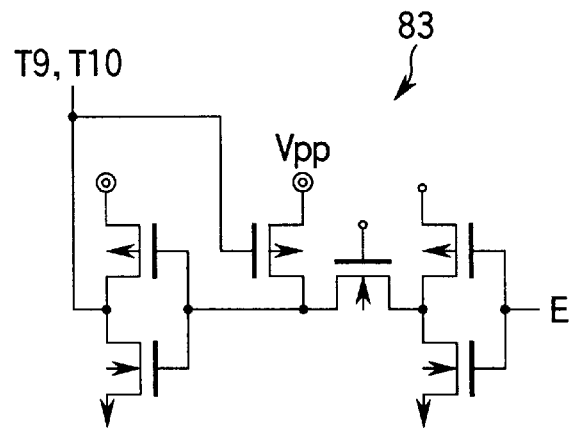
FIG. 35 is a circuit diagram showing an example of an erase circuit incorporated in the source potential circuit in the fourth embodiment.

FIG. 35 shows an example of the erase circuit 83. The erase circuit 83 is conventionally directly connected to the source of the memory cell. However, in this embodiment, the erase circuit 83 is connected to the source of the memory cell through the transistors T9 and T10. In the data erase mode, a signal E is set at "1" to output a high voltage Vpp to the memory cell, thereby erasing data. In the data read and write modes, the signal E is set at "0", so the output from the erase circuit 83 is connected to the reference voltage. In the data erase mode as well, the verify operation is performed after the erase operation. If data is not sufficiently erased, the erase operation is performed again. The erase and verify operations are repeated, and when a predetermined threshold voltage reaches, the erase operation is ended.

Figure 36:
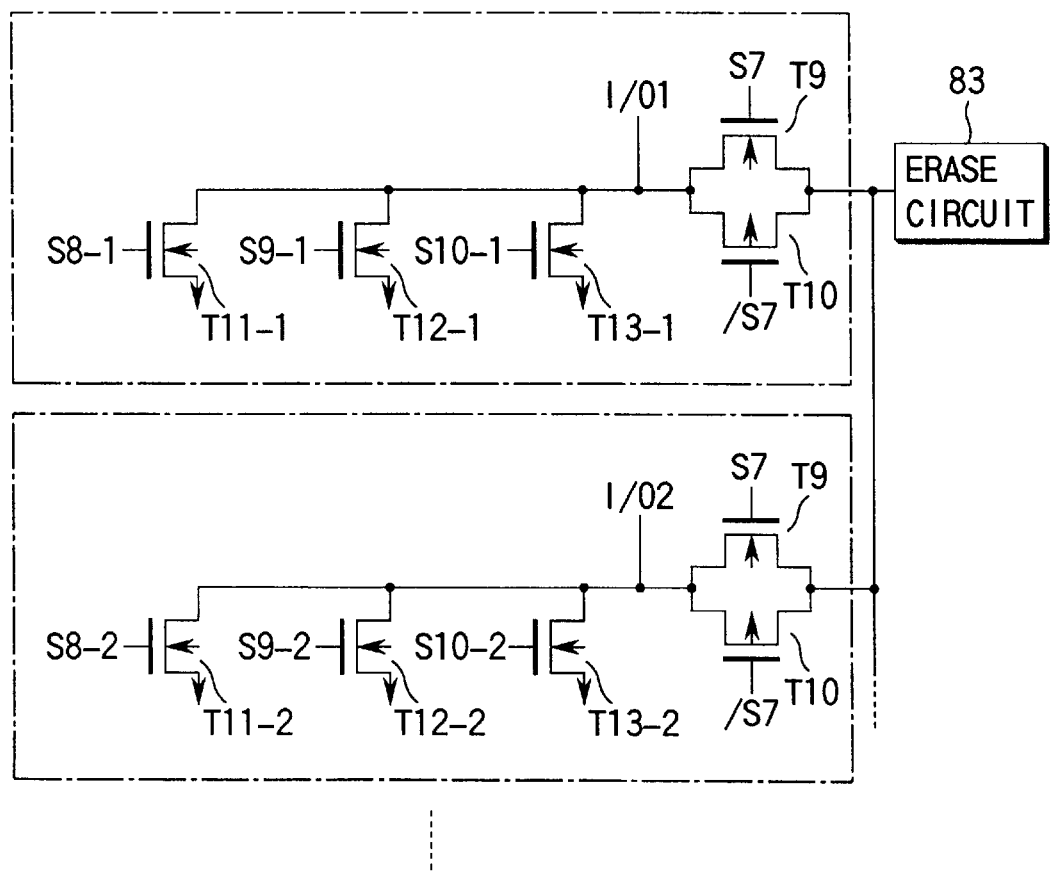
FIG. 36 is a circuit diagram showing the modification of the fourth embodiment.

In this embodiment, each of the source potential circuits 81 arranged in correspondence with the memory cell arrays of output bits incorporates the erase circuit 83. However, the erase circuit 83 may be shared by the source potential circuits 81. FIG. 36 is a circuit diagram of this arrangement. FIG. 36 shows an application to the source potential circuit shown in FIG. 31. Portions indicated by alternate long and short dashed lines are the source potential circuits 81-1 to 81-8 connected to the memory cell arrays corresponding to I/O 1 to I/O 8, and one erase circuit 83 is commonly connected to the source potential circuits 81-1 to 81-8. Note that S8-1, S9-1, S10-1, ... correspond to the signals S8, S9, and S10 in FIG. 31, respectively. The signals S8-1, S9-1, and S10-1 are determined in correspondence with data to be written in I/O 1, and signals S8-2, S9-2, and S10-2 are determined in correspondence with data to be written in I/O 2.

As described above, according to the fourth embodiment, a nonvolatile semiconductor memory device capable of shortening the time for writing data in the memory cell and, even when data of a plurality of bits is stored in one memory cell, precisely setting the threshold voltage can be obtained.

In the above embodiments in which each memory cell stores two-bit data, it is possible to assign the same address to two-bit data or respective addresses to each bit of data.

Figure 61:
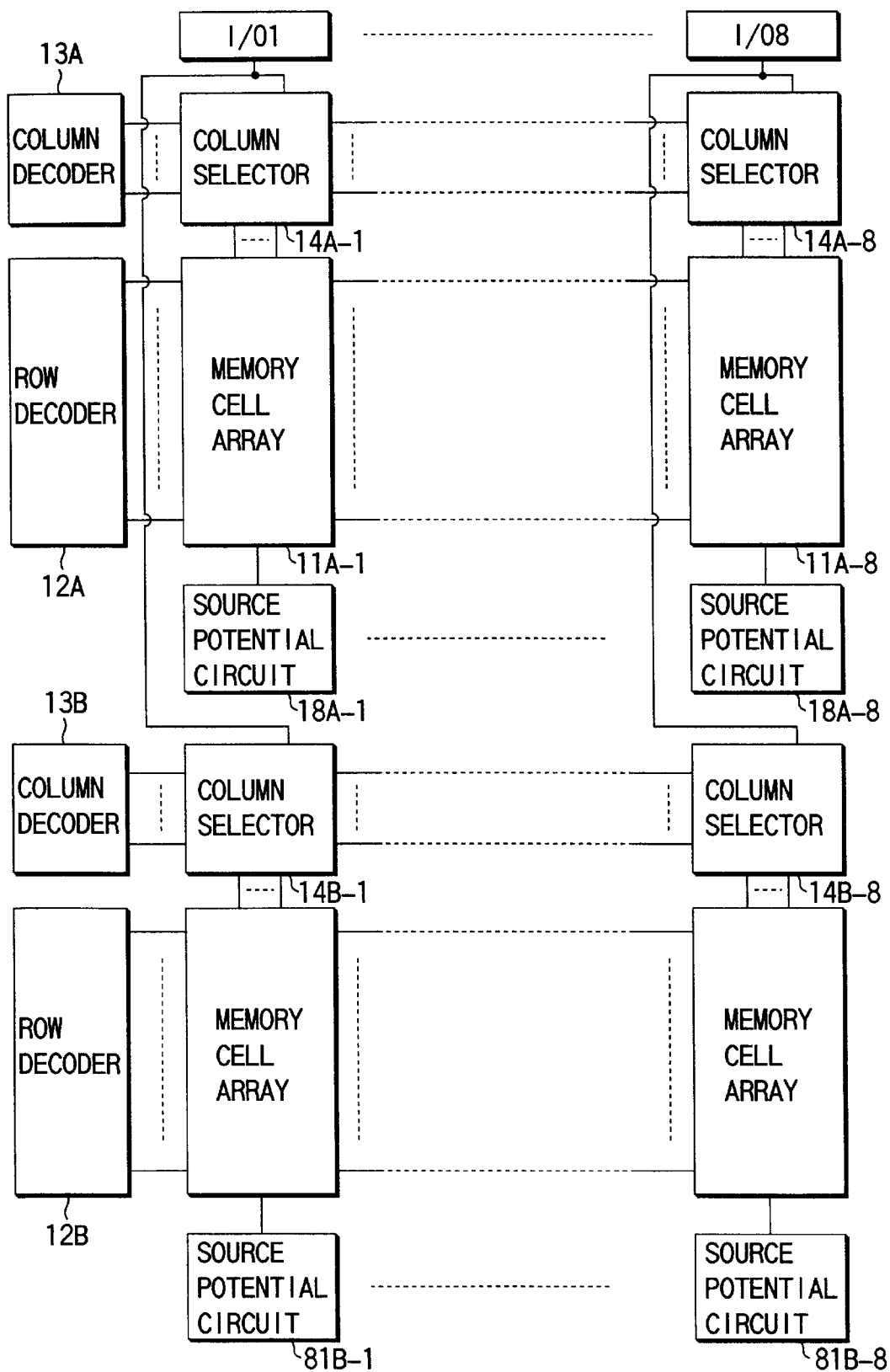
FIG. 61 is a block diagram showing a modification of the fourth embodiment.

FIG. 26 shows the example in which one memory cell array is connected to one I/O. The above embodiment can be modified such that plural memory cell arrays are connected to one I/O, as shown in FIG. 61. Eight memory cell arrays 11-1 to 11-8 form a memory cell array section. One of the memory cell array sections is selected by the column decoder. Each output bit I/O 1 to I/O 8 reads data from the corresponding memory cell arrays 11-1 to 11-8 in the selected memory cell array section.

Fifth Embodiment

Figure 10:
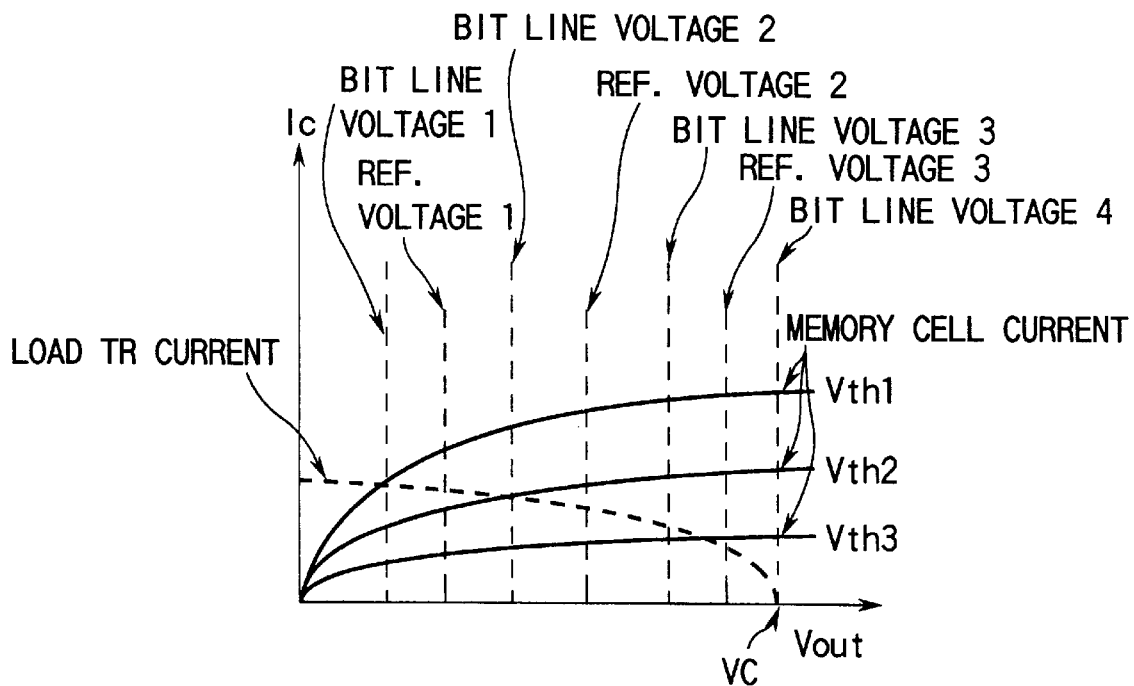
FIG. 10 is a chart showing the relationship between an output voltage Vout at the connection point between the memory cell and the load transistor in FIG. 9 and the currents flowing to the memory cell and load transistor when the memory cell is selected.

The fifth embodiment is an improvement of the conventional reading method which has been described with reference to FIG. 10. The entire arrangement of a nonvolatile semiconductor memory device according to the fifth embodiment is the same as that shown in FIG. 1, and the device has a memory cell array having memory cells as shown in, e.g., FIG. 8A arranged in a matrix.

Figure 37:
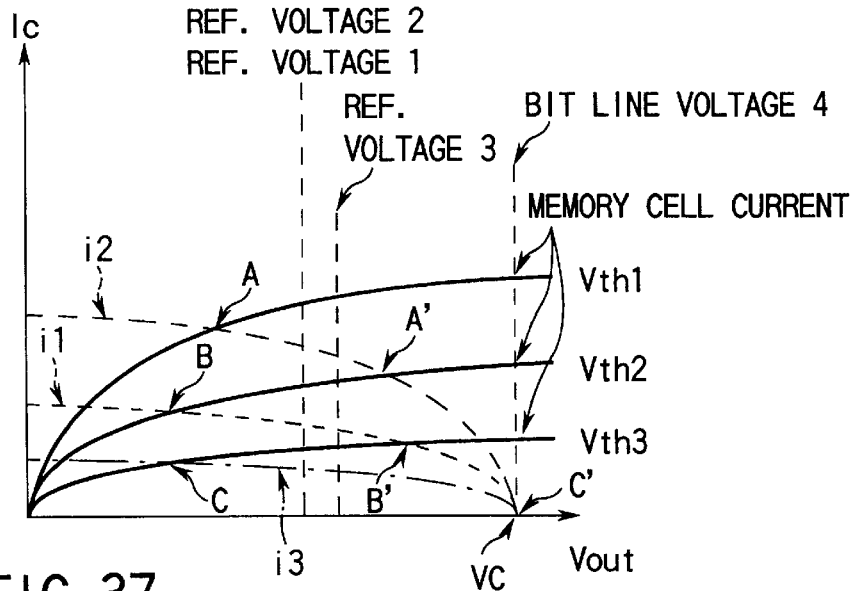
FIG. 37 is a chart showing the relationship between an output voltage at the connection point between a memory cell and a load transistor and currents flowing to the memory cell and the load transistor when the memory cell is selected in the fifth embodiment of the present invention.

FIG. 37 is a chart schematically showing the relationship between a voltage (output voltage) Vout at a connection point 16 between a memory cell MC and a load transistor LT in FIG. 1 and a current (solid line) flowing to the memory cell and a current (broken line, and alternate long and short dashed line) flowing to the load transistor LT when the memory cell MC is selected. A current i1 indicates the first load transistor current, i2 indicates the sum of the first and second load transistor currents, and i3 indicates the sum of the first, second and third load transistor currents. An intersection A corresponds to the bit line voltage 1. An intersection A' corresponds to the bit line voltage 2. An intersection B corresponds to the bit line voltage 2. An intersection B' corresponds to the bit line voltage 3. An intersection C corresponds to the bit line voltage 3. An intersection C' corresponds to the bit line voltage 4.

The data read operation of this embodiment will be briefly described with reference to FIGS. 37 and 5.

In this embodiment, of 2-bit data (D1 and D2), the upper bit data D1 is read out first. More specifically, second reference voltage 2 is compared with the bit line voltage to detect whether the threshold voltage of the memory cell is equal to or lower than Vth2 or higher than Vth3. If the memory cell threshold voltage is equal to or lower than Vth2, the data D1 is "0". If the threshold voltage is equal to or higher than Vth3, the data D1 is "1".

As described above, it is detected first whether the memory cell threshold voltage is equal to or lower than Vth2 or higher than Vth3. With this arrangement, the characteristics of the load transistor can be determined such that the voltage difference between an intersection B of the memory cell current at the threshold voltage Vth2 and a first load transistor current i1 and an intersection B' of the memory cell current at the threshold voltage Vth3 and the first load transistor current i1 shown in FIG. 37 becomes large. Since the difference between the reference voltage and the bit line voltage can be increased, the read margin can be made large.

In this embodiment, after data has been read out in the above-described manner, the readout data is latched. If the readout data is "0", the threshold voltage of the memory cell is Vth1 or Vth2. The current supply capability of the load transistor is set to be large to increase the voltage difference between an intersection A of the memory cell current at the threshold voltage Vth1 and the sum of the first and second load transistor currents i2 and an intersection A' of the memory cell current at the threshold voltage Vth1 and the sum of the first and second load transistor currents i2 shown in FIG. 37. The read margin can also be made larger as compared to the prior art. In this case, the readout data may be latched. However, when the load transistor is kept turned on, the data need not be latched.

When the data read out using second reference voltage 2 is "1", the threshold voltage of the memory cell is Vth3 or Vth4. The current supply capability of the load transistor is set to be small to increase the voltage difference between an intersection C of the memory cell current at the threshold voltage Vth3 and the sum of the first, second and third load transistor currents i3 and an intersection C' of the memory cell current at the threshold voltage Vth4 and the sum of the first, second and third load transistor currents i3 shown in FIG. 37. The read margin can also be made larger as compared to the prior art.

As described above, according to this embodiment, data stored in the memory cell can be divisionally read out in two steps, and the capability of the load transistor at that time can be changed and optimized in correspondence with the threshold voltage of the memory cell, so the read margin can be increased.

A specific arrangement capable of realizing this reading method will be described below. In this embodiment, the sense amplifier unit use three sense amplifiers 1, 2, and 3 and three reference voltages 1, 2, and 3, as shown in FIG. 3. As the load transistor LT in FIG. 1, three (first to third) load transistors L1, L2, and L3 each comprising a PMOS transistor are used, as shown in FIG. 38.

Figure 38:
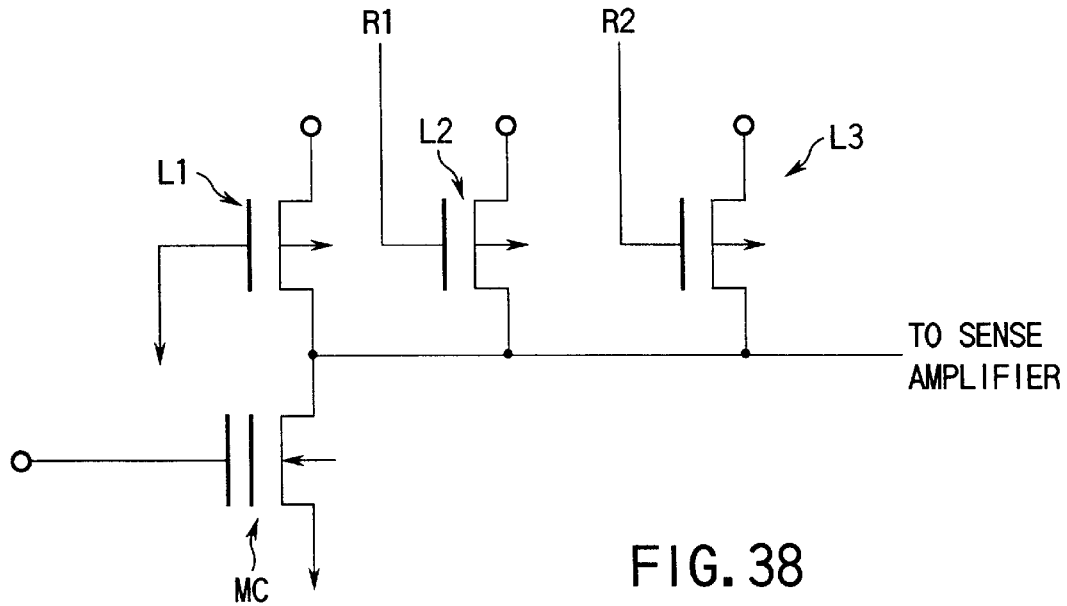
FIG. 38 is a circuit diagram showing the memory cell and the load transistor according to the fifth embodiment.

FIG. 38 shows only the memory cell MC and the load transistors L1 to L3 connected to the memory cell MC in this embodiment. Actually, as shown in FIG. 1, the memory cells MC are arrayed in a matrix, and a transistor 14 for selecting a column, and the like are connected between the memory cell MC and the load transistor LT. However, this is not directly associated with the read operation of this embodiment, and a detailed description thereof will be omitted.

The gate of the first load transistor L1 is connected to the ground voltage. A control signal R1 is supplied to the gate of the second load transistor L2, and a control signal R2 is supplied to the gate of the third load transistor L3.

Figure 39:
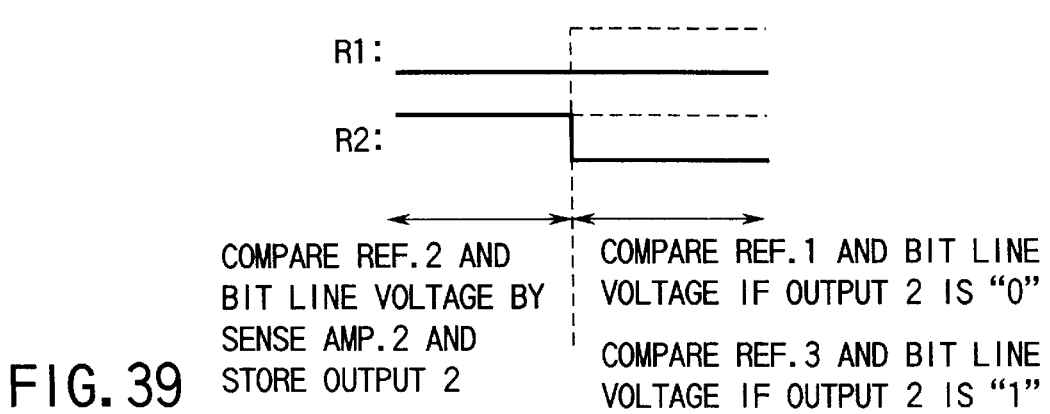
FIG. 39 is a timing chart showing examples of control signals R1 and R2 used in the fifth embodiment.

FIG. 39 shows examples of the control signals R1 and R2 used in the circuit shown in FIG. 38.

The read operation of this embodiment will be described next.

In the first data read operation from the memory cell MC, the signal R1 is set at "0", and the signal R2 is set at "1" to turn on the second load transistor L2 and off the third load transistor L3. The first load transistor L1 and the second load transistor L2 serve as load transistors for the memory cell MC.

If data read out in the first read is "0", the signal R2 is set at "0" to turn on the third load transistor L3, too (i.e., the three load transistors L1 to L3 are used as the load transistors for the memory cell). With this operation, the current supply capability of the load transistor is increased, and the second read operation is performed.

If the data read out in the first read operation is "1", the signal R1 is set at "1" to turn off the second load transistor L2 and the third load transistor L3 (i.e., only the first load transistor L1 is used as the load transistor LT for the memory cell). With this operation, the current supply capability of the load transistor is decreased, and the second read operation is performed.

As is apparent from FIG. 37, the first to third reference voltages can be made equal depending on setting of the load transistor, so the plurality of reference voltages need not be generated.

As described above, according to the fifth embodiment, when at least 2-bit data is stored in one memory cell, the data read operation is divisionally performed in at least two steps. Since the current supply capability of the load transistor for the memory cell can be optimized for each read, control can be performed to increase the voltage difference between the reference voltage to be supplied to the sense amplifier and the bit line voltage, so the read margin can be increased.

Sixth Embodiment

In the sixth embodiment, three load transistors L1 to L3 are used as a load transistor LT shown in FIG. 1, as shown in FIG. 38, as in the fifth embodiment.

Figure 40:
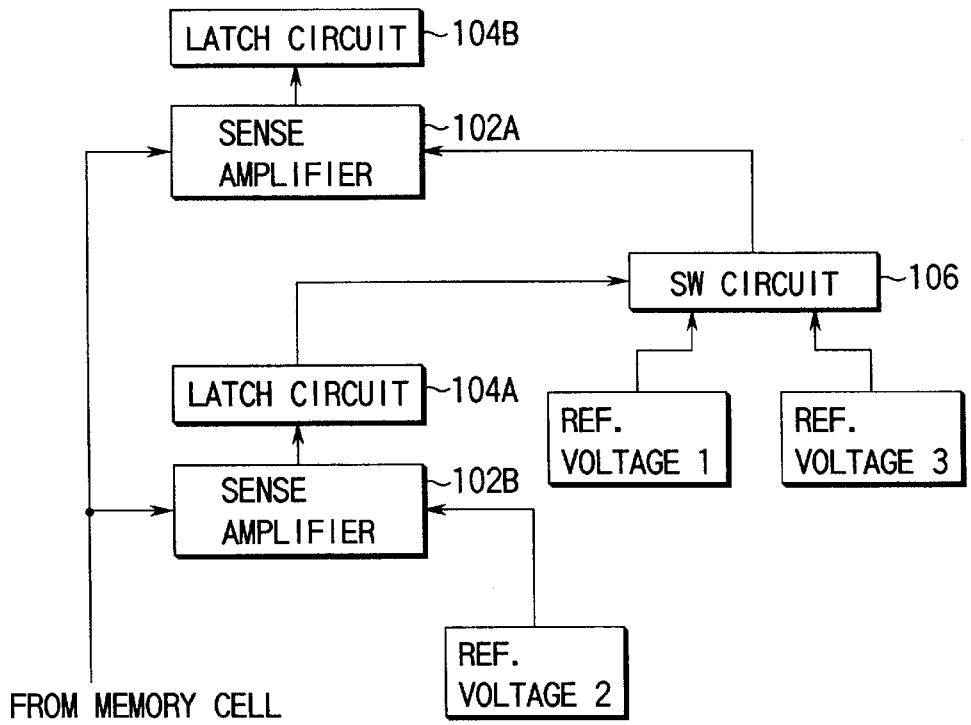
FIG. 40 is a block diagram showing the sense amplifier unit of a read system according to a sixth embodiment of the present invention.

The sense amplifier unit of the sixth embodiment uses two sense amplifiers 102A and 102B, three reference voltages 1, 2, and 3, two latch circuits 104A and 104B, and one switching circuit 106, as shown in FIG. 40.

The sense amplifier 102B compares the bit line voltage with second reference voltage 2 to read out data. The latch circuit 104A latches the data read out by the sense amplifier 102B. The switching circuit 106 selects reference voltage 1 or 3 in accordance with the logic level of the latch data in the latch circuit 104A.

The sense amplifier 102A compares the bit line voltage with reference voltage 1 or 3 selected by the switching circuit 106 to read out data. The latch circuit 104B latches the data read out by the sense amplifier 102A.

The read operation of the sixth embodiment will be briefly described next.

In the first read operation, second reference voltage 2 is compared with the bit line voltage using the sense amplifier 102B to read out data, and the readout data is latched by the latch circuit 104A. The switching circuit 106 is switched on the basis of the readout data to supply a corresponding one of reference voltages 1 and 3 to the sense amplifier 102A, and the readout data is latched by the latch circuit 104B.

With this arrangement, two sense amplifiers suffices. Therefore, the area of sense amplifiers can be reduced, and simultaneously, the current consumption at the sense amplifier unit can be decreased.

Figure 41:
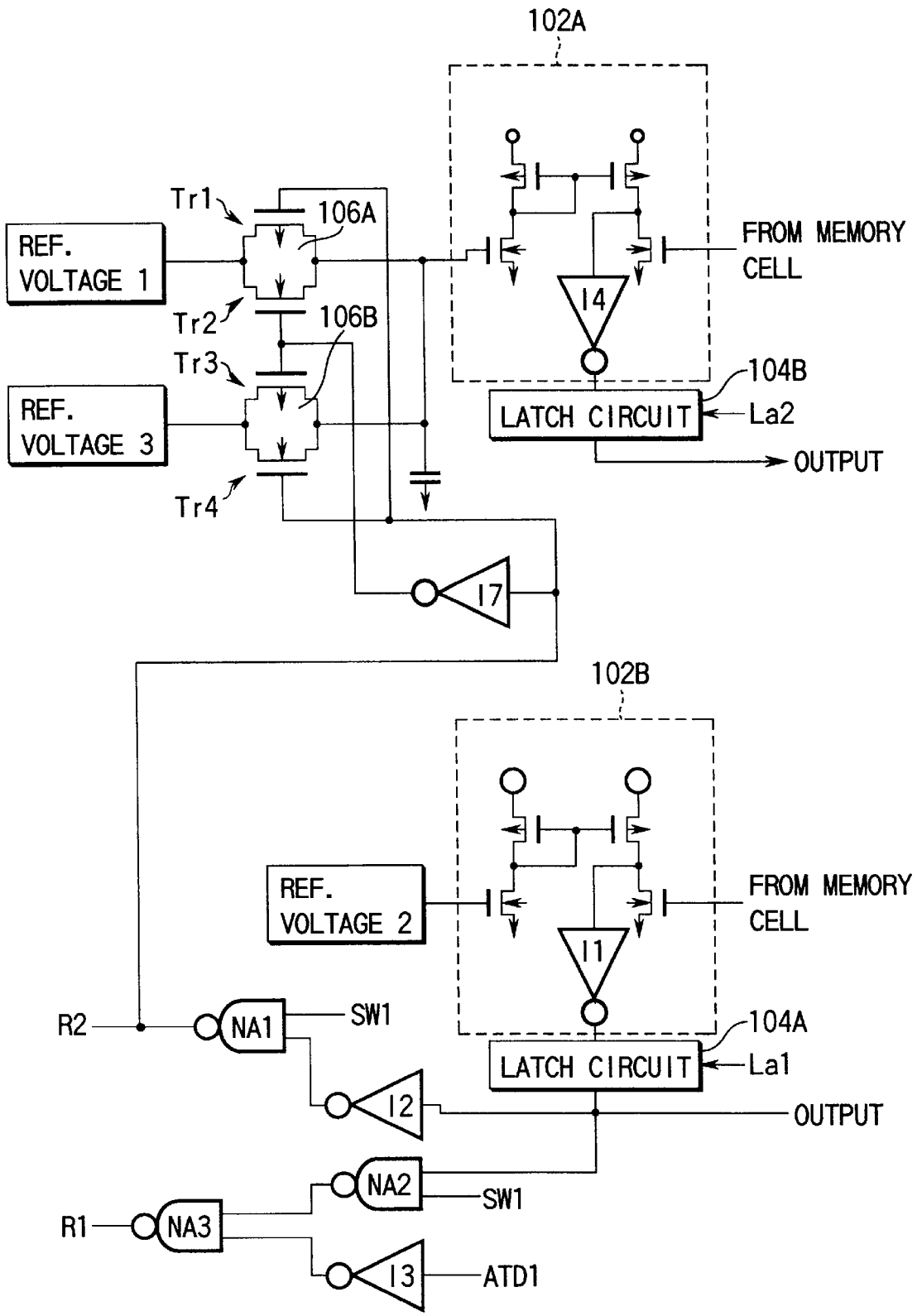
FIG. 41 is a circuit diagram showing a specific example of FIG. 40.

FIG. 41 shows a specific example of the circuit shown in FIG. 40.

Each of the sense amplifiers 102A and 102B has a differential type voltage comparator constituted by a pair of NMOS transistors having gates to which the bit line voltage and reference voltage are input, respectively, and a PMOS current mirror circuit connected as a load for these NMOS transistors.

The sense amplifier 102B inputs its output obtained upon comparing the bit line voltage with second reference voltage 2 by the voltage comparator to the latch circuit 104A through an inverter I1. The latch circuit 104A latches the input in accordance with a latch signal La1, and the latched data is input to one terminal of a first NAND circuit NA1 through an inverter I2. The first NAND circuit NA1 receives a signal SW1 as the other input and outputs a signal R2.

The latch data in the latch circuit 104A is also input to one terminal of a second NAND circuit NA2. The second NAND circuit NA2 receives the signal SW1 as the other input and outputs a signal to one terminal of a third NAND circuit NA3. The third NAND circuit NA3 receives a signal ATD1 through an inverter I3 as the other input and outputs a signal R1.

First reference voltage 1 is input to one terminal of a first switching circuit 106A comprising a PMOS transistor Tr1 and an NMOS transistor Tr2. Third reference voltage 3 is input to one terminal of a second switching circuit 106B comprising a PMOS transistor Tr3 and an NMOS transistor Tr4. The first and second switching circuits 106A and 106B are complementarily ON/OFF-controlled in accordance with the signal R2 and a signal obtained by inverting the signal R2 by an inverter I7. In this embodiment, when the signal R2 is at level "0", the first switching circuit 106A is turned on. When the signal R2 is at level "1", the second switching circuit 106B is turned on.

The sense amplifier 102A receives reference voltage 1 or 3 from the other terminal of the first switching circuit 106A or second switching circuit 106B, and outputs a signal obtained by comparing the bit line voltage with reference voltage 1 or 3 by the voltage comparator to the latch circuit 104B through an inverter I4. The latch circuit 104B latches the input in accordance with a latch signal La2.

Figure 42:
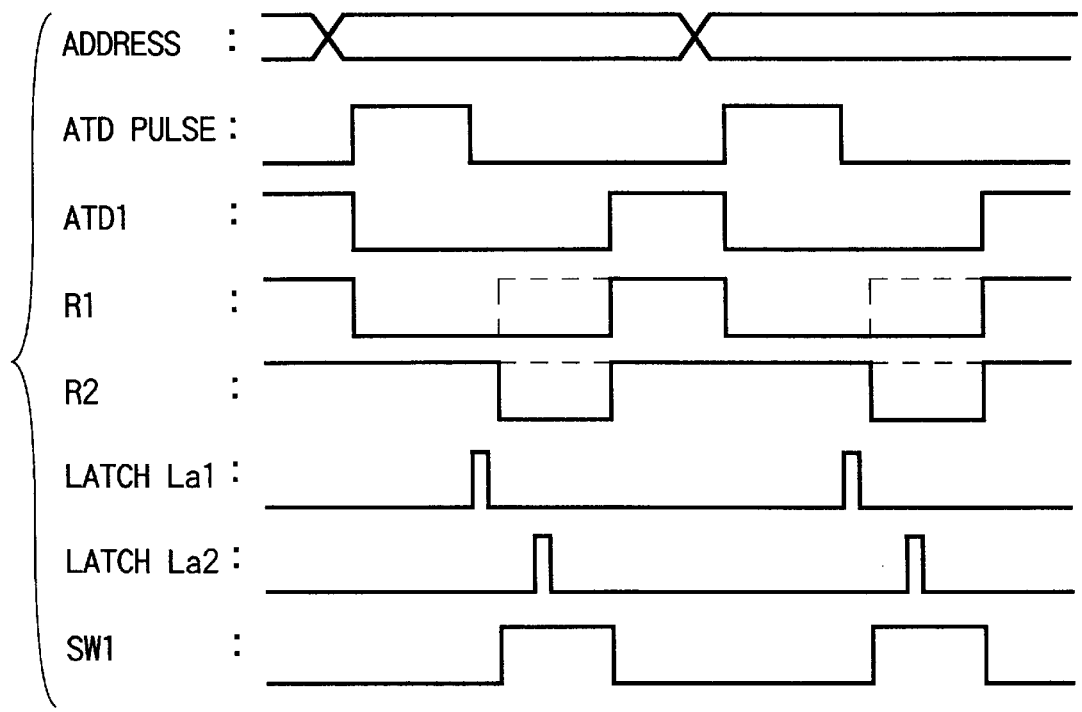
FIG. 42 is a chart showing signal waveforms so as to explain the operation of the circuit shown in FIG. 41.

FIG. 42 is a chart showing signal waveforms so as to explain the operation of the circuit shown in FIG. 41. The read operation of the sixth embodiment will be described in detail with reference to FIG. 42.

Referring to FIG. 42, a signal ATD is a pulse signal generated upon detecting a change in address input signal. The signal ATD1 changes from level "1" to level "0" in response to the change in signal ATD.

The signal SW1 is set at level "0". As is apparent from the circuit shown in FIG. 41, when the signal ATD1 changes to level "0", the signal R1 is set at "0", and the signal R2 is set at "1". The second load transistor L2 shown in FIG. 38 is turned on, so data is read out while the two load transistors L1 and L2 in FIG. 38 serve as the load transistor for a memory cell MC.

When a predetermined time from the change in signal ATD1 has elapsed, the latch signal La1 changes to level "1", so the data detected by the sense amplifier 102B using second reference voltage 2 is stored in the latch circuit 104A.

After a predetermined time, the latch signal La1 changes to "0", so the data stored in the latch circuit 104A is held until the latch signal La1 changes to level "1" again. After this, the signal SW1 changes to "1".

If the data from the memory cell, which is latched by the latch circuit 104A, is "0", both the signals R1 and R2 are set at "0" to turn on both the second and third load transistors L2 and L3. Data is read out from the memory cell again in this state.

Since the signal R2 is at "0", the first switching circuit is turned on to supply first reference voltage 1 to the sense amplifier 102A. Data is read out by the sense amplifier 102A using first reference voltage 1.

When the signal SW1 has changed, and data has been read out correctly a predetermined time after the change in signal SW1, the latch signal La2 changes to "1" so the data read out by the sense amplifier 102A is latched by the latch circuit 104B.

The outputs from the latch circuits 104A and 104B are read out as data stored in the memory cell. If the data from the memory cell, which is latched by the latch circuit 104A, is "1", both the signals R1 and R2 are set at "1", as indicated by broken lines in FIG. 42, to turn off both the second and third load transistors L2 and L3. Data is read out from the memory cell again in this state.

Since the signal R2 is at "1", the second switching circuit is turned on to supply third reference voltage 3 to the sense amplifier 102A. Data is read out by the sense amplifier 102A using third reference voltage 3.

When the signal SW1 has changed, and data has been read out correctly a predetermined time after the change in signal SW1, the latch signal La2 changes to "1", so the data read out by the sense amplifier 102A is latched by the latch circuit 104B.

After this, the latch signal changes to "0", so the data is held by the latch circuit 104B. Subsequently, the signal SW1 changes to "0", and at the same time, all the signals ATD1, R1, and R2 change to "1". The address changes, and the data read from a new memory cell is waited for.

As described above, according to the sixth embodiment as well, when at least 2-bit data is stored in one memory cell, the data read operation is divisionally performed in at least two steps. Since the current supply capability of the load transistor for the memory cell can be optimized for each read operation, control can be performed to increase the voltage difference between the reference voltage to be supplied to the sense amplifier and the bit line voltage, so the read margin can be increased.

Seventh Embodiment

In the seventh embodiment, three load transistors L1 to L3 are used as load transistors shown in FIG. 1, as shown in FIG. 38, as in the fifth embodiment.

Figure 43:
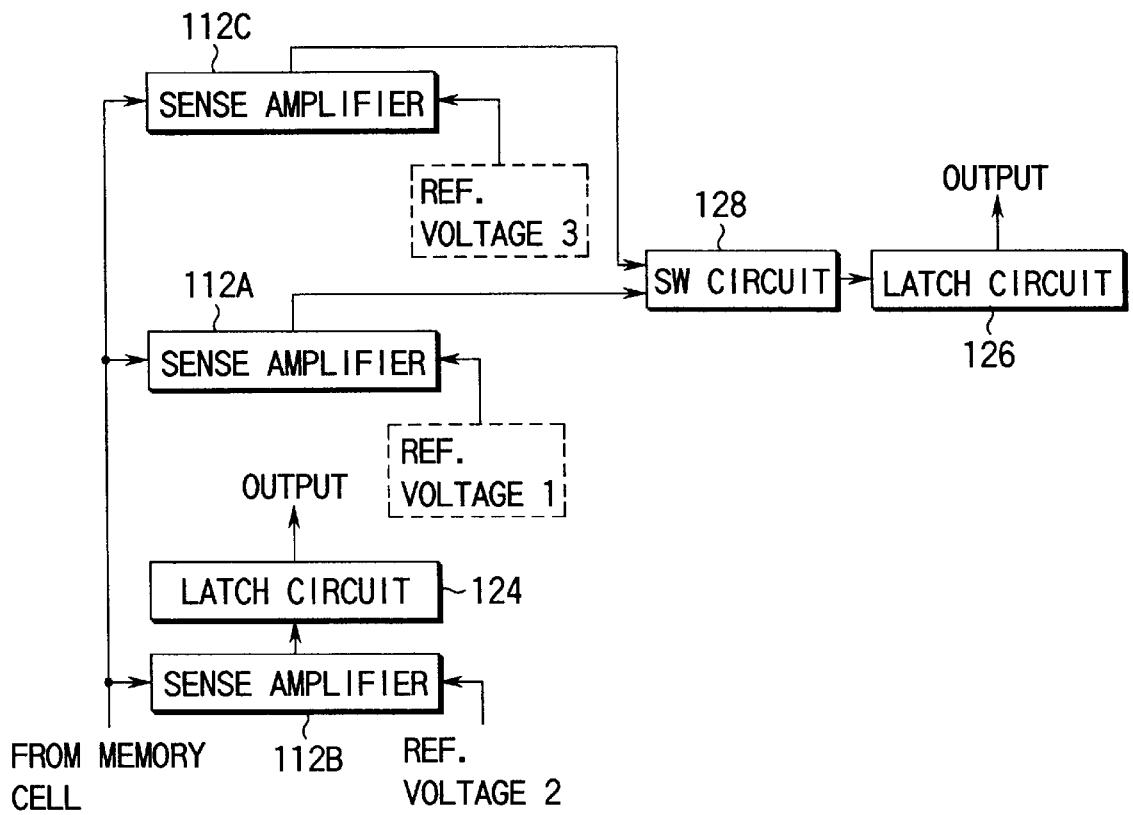
FIG. 43 is a block diagram showing the sense amplifier unit of a read system according to a seventh embodiment of the present invention.

The sense amplifier unit of the seventh embodiment uses three sense amplifiers 112A, 112B, and 112C, three reference voltages 1, 2, and 3, two latch circuits 124 and 126, and one switching circuit 128, as shown in FIG. 43.

The sense amplifier 112A compares the bit line voltage with first reference voltage 1 to read out data. The sense amplifier 112B compares the bit line voltage with second reference voltage 2 to read out data. The latch circuit 124 latches data read out by the sense amplifier 112B. The sense amplifier 112C compares the bit line voltage with third reference voltage 3 to read out data. The switching circuit 128 selects the output from the sense amplifier 112A or the sense amplifier 112C on the basis of the data in the latch circuit 124. The latch circuit 126 latches the data selected by the switching circuit 128.

The read operation of the seventh embodiment will be described next.

A signal R1 is set at "0" to turn on the second load transistor L2. Using the two load transistors L1 and L2 shown in FIG. 38 as the load transistors for a memory cell MC, the bit line voltage and second reference voltage 2 are compared by the sense amplifier 112B to read out data.

In the second read operation, on the basis of the data in the latch circuit, which has been read out by the sense amplifier 112B, both the signals R1 and R2 are set at "0" or "1". The bit line voltages and reference voltages 1 and 3 are compared by the sense amplifiers 112A and 112C to read out data.

The switching circuit 128 is switched on the basis of the data in the latch circuit 124, which has been read out by the sense amplifier 112B, to determine transfer of the data from the sense amplifier 112A or sense amplifier 112C to the latch circuit 126, so that correct data is latched.

As described above, according to the seventh embodiment as well, when at least 2-bit data is stored in one memory cell, the data read operation is divisionally performed in at least two steps. Since the current supply capability of the load transistor for the memory cell can be optimized for each read operation, control can be performed to increase the voltage difference between the reference voltage to be supplied to the sense amplifier and the bit line voltage, so the read margin can be increased.

Eighth Embodiment

In the eighth embodiment, three load transistors L1 to L3 are used as load transistors shown in FIG. 1, as shown in FIG. 38, as in the fifth embodiment.

Figure 44:
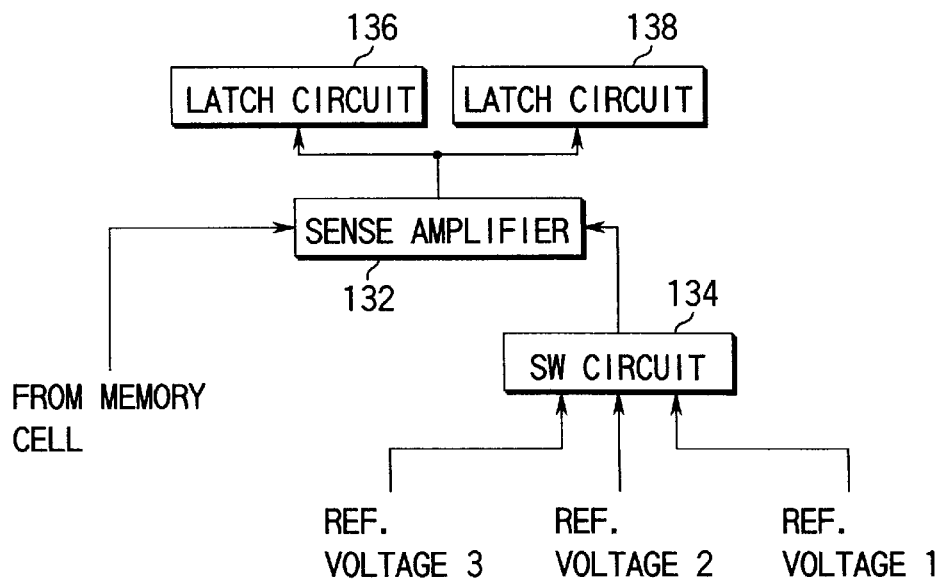
FIG. 44 is a block diagram showing the sense amplifier unit of a read system according to an eighth embodiment of the present invention.

The sense amplifier unit of the eighth embodiment uses one sense amplifier 132, three reference voltages 1, 2, and 3, one switching circuit 134, and two latch circuits 136 and 138, as shown in FIG. 44.

The switching circuit 134 selects one of the reference voltages 1, 2, and 3. The sense amplifier 132 compares the bit line voltage with the reference voltage selected by the switching circuit 134 to read out data. The latch circuits 136 and 138 latch the output from the sense amplifier 132.

The read operation of the eighth embodiment will be described next.

In the first read operation, as in the seventh embodiment, a signal R1 is set at "0" to turn on the second load transistor L2, and simultaneously, the switching circuit 134 is switching-controlled to supply second reference voltage 2 to the sense amplifier 132 so the bit line voltage is compared with second reference voltage 2 to read out data. The readout data is latched by the latch circuit 136.

In the second read operation, on the basis of the data in the latch circuit 136, which has been read out by the sense amplifier 132, both the signals R1 and R2 are set at "0" or "1". In response to this, reference voltage 1 or 3 is selected by the switching circuit 134 and supplied to the sense amplifier 132. The sense amplifier 132 compares reference voltage 1 or 3 with the bit line voltage to read out data. The readout data is latched by the latch circuit 138.

The outputs from the latch circuits 136 and 138 correspond to 2-bit data stored in the memory cell.

According to this arrangement, only one sense amplifier suffices, so the current consumption can be reduced. In addition, since the number of devices to be used decreases, the area of the device can be reduced, so the chip size can also be reduced.

As described above, according to the eighth embodiment, when at least 2-bit data is stored in one memory cell, the data read operation is divisionally performed in at least two steps. Since the current supply capability of the load transistor for the memory cell can be optimized for each read, control can be performed to increase the voltage difference between the reference voltage to be supplied to the sense amplifier and the bit line voltage, so the read margin can be increased.

In the fifth to eighth embodiments, 2-bit data is stored in one memory cell, and the data read operation is performed in two steps. Even when two or more bit data are stored in one memory cell, and the data read operation is performed in three or more steps, the arrangement and read control procedure of each of the above embodiments can be applied.

For example, when eight 3-bit data are to be stored in one memory cell in correspondence with eight threshold voltages Vth1 to Vth8, a plurality of sense amplifiers and e.g., seven reference voltages 1 to 7 are used. The threshold voltages increase from Vth1 to Vth8, so Vth1<Vth2<Vth3<Vth4<Vth5<Vth6<Vth7<Vth8 holds. Assuming that the three data bits are D1, D2, and D3, Vth1 corresponds to D1="0", D2="0", and D3="0"; Vth2, D1="0", D2="0", and D3="1"; Vth3, D1="0", D2="1", and D3="0"; Vth4, D1="0", D2="1", and D3="1"; Vth5, D1="1", D2="0", and D3="0"; Vth6, D1="1", D2="0", and D3="1"; Vth7, D1="1", D2="1", and D3="0"; and Vth8, D1="1", D2="1", and D3="1".

Reference voltages 1 to 7 also increase in this order: first reference voltage 1<second reference voltage 2<third reference voltage 3<fourth reference voltage 4<reference voltage 5<reference voltage 6<reference voltage 7. First reference voltage 1 is set between the bit line voltage at the memory cell threshold voltage Vth1 and that at the memory cell threshold voltage Vth2. Second reference voltage 2 is set between the bit line voltage at the memory cell threshold voltage Vth2 and that at the memory cell threshold voltage Vth3. Third reference voltage 3 is set between the bit line voltage at the memory cell threshold voltage Vth3 and that at the memory cell threshold voltage Vth4. Fourth reference voltage 4 is set between the bit line voltage at the memory cell threshold voltage Vth4 and that at the memory cell threshold voltage Vth5. Reference voltage 5 is set between the bit line voltage at the memory cell threshold voltage Vth5 and that at the memory cell threshold voltage Vth6. Reference voltage 6 is set between the bit line voltage at the memory cell threshold voltage Vth6 and that at the memory cell threshold voltage Vth7. Reference voltage 7 is set between the bit line voltage at the memory cell threshold voltage Vth7 and that at the memory cell threshold voltage Vth8.

In the first data read operation from the memory cell, data is detected using fourth reference voltage 4.

If the data read out in the first read operation is "0", D1 is "0". Next, the current supply capability of the load transistor is increased, and the second read operation is performed using second reference voltage 2. If the data read out in the first read operation is "1", D1 is "1". In this case, the current supply capability of the load transistor is decreased, and the second read operation is performed using reference voltage 6.

If the data read out in the first read operation is "0", and the data read out in the second read operation is "0", D2 is "0". The current supply capability of the load transistor is increased, and the third read operation is performed using first reference voltage 1. If the data read out in the third read operation is "0", D3 is "0"; otherwise, D3 is "1". If the data read out in the second read operation is "1", D2 is "1". The current supply capability of the load transistor is decreased, and the third read operation is performed using third reference voltage 3.

If the data read out in the third read operation is "0", D3 is "0"; otherwise, D3 is "1".

If the data read out in the first read operation is "1", and the data read out in the second read operation is "0", D2 is "0". The current supply capability of the load transistor is increased, and the third read operation is performed using reference voltage 5. If the data read out in the third read operation is "0", D3 is "0"; otherwise, D3 is "1". If the data read out in the first read operation is "1", and the data read out in the second read operation is "1", D2 is "1". The current supply capability of the load transistor is decreased, and the third read operation is performed using reference voltage 7. If the data read out in the third read operation is "0", D3 is "0"; otherwise, D3 is "1".

Ninth Embodiment

The ninth embodiment is also an improvement of the conventional reading method which has been described with reference to FIG. 10. The entire arrangement of a nonvolatile semiconductor memory device according to the ninth embodiment is the same as that shown in FIG. 1, and the device has a memory cell array having memory cells as shown in, e.g., FIG. 8A arranged in a matrix.

Figure 45:
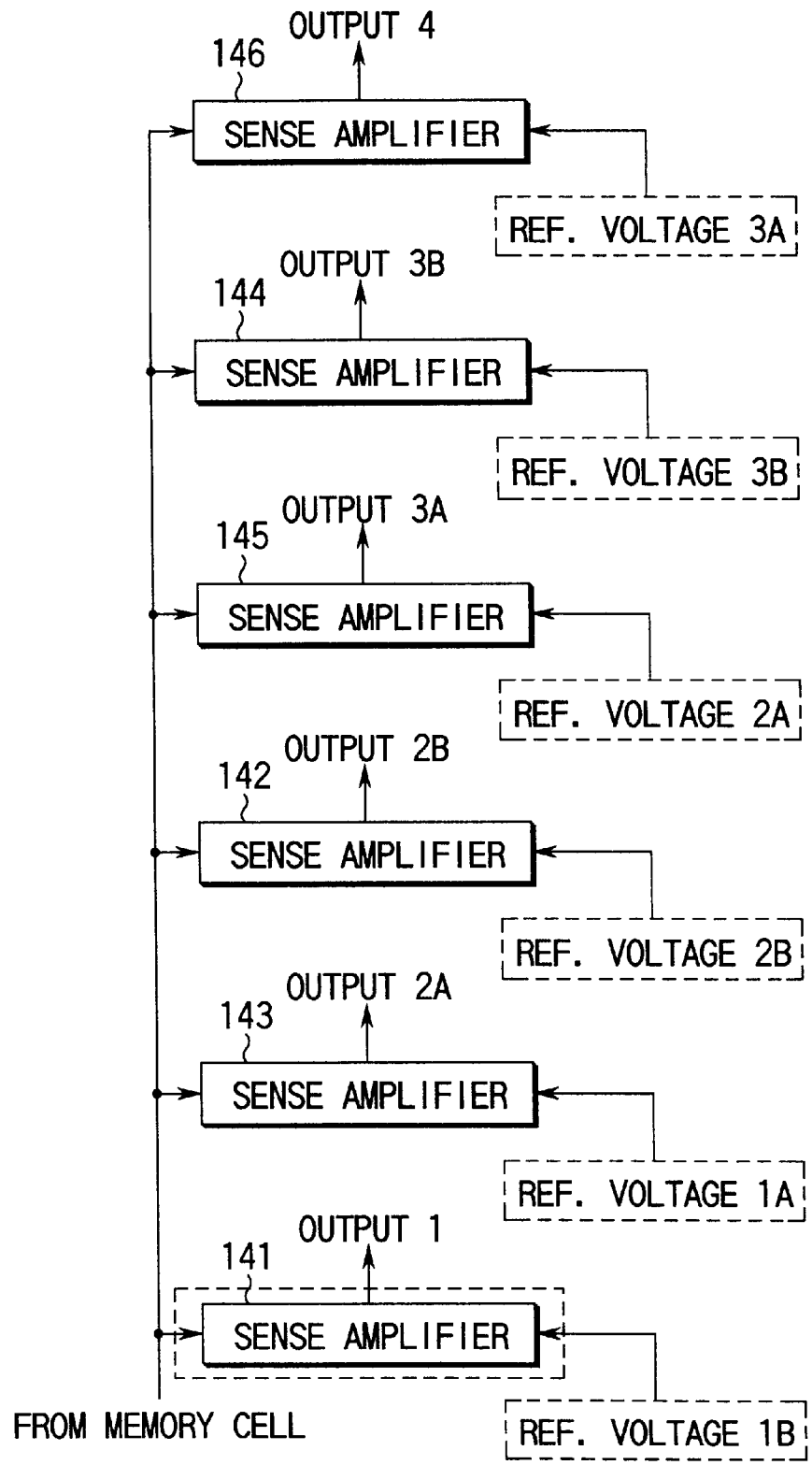
FIG. 45 is a block diagram showing the sense amplifier unit of a read system according to a ninth embodiment of the present invention.

FIG. 45 shows the sense amplifier unit of a read system according to the ninth embodiment. The ninth embodiment uses six sense amplifiers 141 to 146 and six reference voltages 1A, 1B, 2A, 2B, 3A, and 3B. In reading out data stored in the memory cell, the six sense amplifiers 141 to 146 commonly receive a bit line voltage (a column line voltage, and in this example, the voltage at the connection point of a load transistor Lt and a bit line voltage clamp transistor CT shown in FIG. 1) corresponding to the data read out from the memory cell.

In the data read operation from a memory cell MC, second reference voltage 1B, fourth reference voltage 2B, first reference voltage 1A, sixth reference voltage 3B, third reference voltage 2A, and fifth reference voltage 3A are supplied to the six sense amplifiers 141 to 146, respectively.

In the data read from the memory cell MC, each of the six sense amplifiers 141 to 146 compares the two inputs with each other to detect data.

Figures 46, 47:
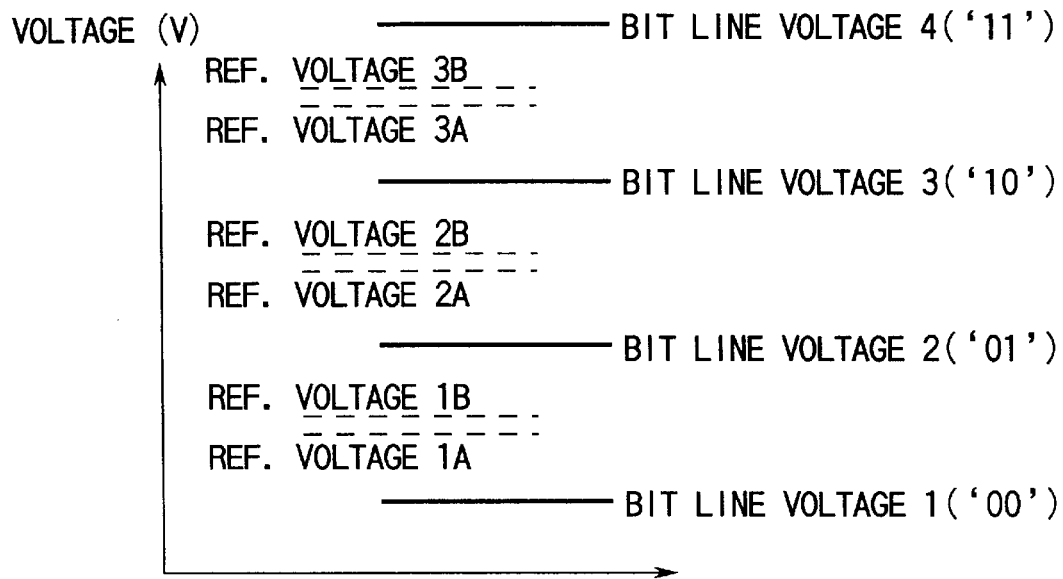
FIG. 46 is a chart showing the relationship in magnitude between a plurality of reference voltages 1A, 1B, 2A, 2B, 3A, and 3B and bit line voltages 1 to 4 depending on the memory cell threshold voltages in the ninth embodiment.
FIG. 47 is a table showing the relationship between bit line voltages, sense amplifier outputs, and stored data in the ninth embodiment.

FIG. 46 shows the relationship in magnitude between six reference voltages 1A, 1B, 2A, 2B, 3A, and 3B in FIG. 45 and bit line voltages 1 to 4 determined in accordance with memory cell threshold voltages Vth1 to Vth4.

The reference voltages are set to increase in the order of first reference voltage 1A, second reference voltage 1B, third reference voltage 2A, fourth reference voltage 2B, fifth reference voltage 3A, and sixth reference voltage 3B.

The operation of the ninth embodiment will be briefly described next.

In a data erase from the memory cell, the bit line voltage after the erase operation is set to be lower than first reference voltage 1A.

In a data write operation, for a memory cell for which the threshold voltage Vth2 is to be set, the write operation is stopped upon detecting that the bit line voltage is set between reference voltages 1B and 2A. For a memory cell for which the threshold voltage Vth3 is to be set, the write operation is stopped upon detecting that the bit line voltage is set between reference voltages 2B and 3A. For a memory cell for which the threshold voltage Vth4 is to be set, the write operation is stopped upon detecting that the bit line voltage is set to be higher than third reference voltage 3B.

In other words, in a verify read operation for checking after the data write operation in the memory cell whether predetermined data has been written, the data is read out by detecting whether the bit line voltage is between second reference voltage 1B and third reference voltage 2A or between fourth reference voltage 2B and fifth reference voltage 3A, or higher than sixth reference voltage 3B.

In a read operation, however, data is read out by detecting whether the bit line voltage is set to be lower than second reference voltage 1B, between first reference voltage 1A and fourth reference voltage 2B, between third reference voltage 2A and sixth reference voltage 3B, or higher than fifth reference voltage 3A.

For example, assume that data is to be read out from a memory cell having the threshold voltage Vth2. In the read mode, it is detected that the bit line voltage is between first reference voltage 1A and fourth reference voltage 2B. In the verify mode, it is detected that the bit line voltage is between second reference voltage 1B and third reference voltage 2A (narrower voltage range than that in the read mode).

Assume that data is to be read out from a memory cell having the threshold voltage Vth3. In the read mode, it is detected that the bit line voltage is between third reference voltage 2A and sixth reference voltage 3B. In the verify mode, it is detected that the bit line voltage is between fourth reference voltage 2B and fifth reference voltage 3A (narrower voltage range than that in the read).

In the above example, reference voltages 2A and 2B are commonly used both in the data read from the memory cell having the threshold voltage Vth2 and in the data read from the memory cell having the threshold voltage Vth3. However, as far as reference voltages having the same voltage level relationship as described above is used, the reference voltages need not be commonly used, as a matter of course.

The data read operation in the ninth embodiment will be described next in detail with reference to FIGS. 45 and 46 and a truth table shown in FIG. 47.

In the read operation, the bit line voltage from the memory cell and second reference voltage 1B are input to the first sense amplifier 141. When the bit line voltage is lower than first reference voltage 1B, output 1 from the sense amplifier 141 is set at "0"; otherwise, output 1 from the sense amplifier 141 is set at "1".

The bit line voltage from the memory cell and first reference voltage 1A are input to the second sense amplifier 143. When the bit line voltage is lower than first reference voltage 1A, output 2A from the sense amplifier 143 is set at "0"; otherwise, output 2A from the sense amplifier 143 is set at "1".

The bit line voltage from the memory cell and fourth reference voltage 2B are input to the third sense amplifier 142. When the bit line voltage is lower than second reference voltage 2B, output 2B from the sense amplifier 142 is set at "0"; otherwise, output 2B from the sense amplifier 142 is set at "1".

The bit line voltage from the memory cell and third reference voltage 2A are input to the fourth sense amplifier 145. When the bit line voltage is lower than second reference voltage 2A, output 3A from the sense amplifier 145 is set at "0"; otherwise, output 3A from the sense amplifier 145 is set at "1".

The bit line voltage from the memory cell and sixth reference voltage 3B are input to the fifth sense amplifier 144. When the bit line voltage is lower than third reference voltage 3B, output 3B from the sense amplifier 144 is set at "0"; otherwise, output 3B from the sense amplifier 144 is set at "1".

The bit line voltage from the memory cell and fifth reference voltage 3A are input to the sixth sense amplifier 146. When the bit line voltage is lower than third reference voltage 3A, output 4 from the sense amplifier 146 is set at "0"; otherwise, output 4 from the sense amplifier 146 is set at "1".

One data D1 of 2-bit data stored in one memory cell is determined as "1" when the bit line voltage is between reference voltages 2A and 3B or higher than third reference voltage 3A. The other data D2 is determined as "1" when the bit line voltage is between reference voltages 1A and 2B or higher than third reference voltage 3A. The 2-bit data stored in one memory cell are obtained by formulas below:

D1=(output 3A)·(/output 3B)+(output 4)

D2=(output 2A)·(/output 2B)+(output 4)

As is apparent from these formulas, output 1 is not used to detect data stored in the memory cell, so the first sense amplifier 141 is not required.

However, in the verify read operation after the erase operation, the first sense amplifier 141 is required to detect that the bit line voltage is lower than first reference voltage 1A. However, in the verify read operation, if the second sense amplifier 143 is used to detect that the bit line voltage becomes lower than first reference voltage 1A, the first sense amplifier 141 is unnecessary.

In the read mode, when the first sense amplifier 141 is not used, first reference voltage 1A to be supplied to the second sense amplifier 143 becomes close to bit line voltage 1, so the read margin may decrease. Such a case wherein the voltage difference from another reference voltage may decrease is represented by * in the truth table shown in FIG. 47.

When a memory cell having an offset gate shown in FIG. 8B is used, electrons can be sufficiently removed from the floating gate in the data erase mode, so the voltage difference between bit line voltage 1 and first reference voltage 1A can be made sufficiently large. When bit line voltage 4 is to be set in use of the memory cell shown in both FIGS. 8A and 8B, the margin can be increased by sufficiently injecting electrons to prevent ON in the selected state.

Sufficient care must be taken for electron injection of setting bit line voltage 2 or 3. Output 1 from the first sense amplifier 141 can be used for an improvement.

The formulas of the 2-bit data (D1 and D2) according to this improvement are as follows:

$$D1 = (\text{output}2B) \cdot (/\text{output}3B) +$$
$$(\text{output}3A) \cdot (/\text{output}3B) +$$
$$(\text{output}3A) \cdot (/\text{output}4) +$$
$$(\text{output}3B) + (\text{output}4)$$

$$D2 = (\text{output}1) \cdot (/\text{output}2B) +$$
$$(\text{output}2A) \cdot (/\text{output}2B) +$$
$$(\text{output}2A) \cdot (/\text{output}3A) +$$
$$(\text{output}3B) + (\text{output}4)$$

In the data read from the memory cell, when the bit line voltage is stabilized, the bit line voltage is not between reference voltages 1A and 1B, between reference voltages 2A and 2B, or between reference voltages 3A and 3B.

Therefore, when bit line voltage 3 or 4 is to be detected to detect that the stored data D1 is "1", detection can be performed in accordance with the above formulas. More specifically, it is detected that bit line voltage 3 is higher than second reference voltage 2B and lower than third reference voltage 3B, higher than second reference voltage 2A and lower than third reference voltage 3B, or higher than second reference voltage 2A and lower than third reference voltage 3A, thereby determining the data D1 as "1". Alternatively, it is detected that bit line voltage 4 is higher than third reference voltage 3A or third reference voltage 3B, thereby determining the data D1 as "1".

In addition, when bit line voltage 2 or 4 is to be detected to detect that the stored data D2 is "1", it is detected that bit line voltage 2 is higher than first reference voltage 1B and lower than second reference voltage 2B, higher than first reference voltage 1A and lower than second reference voltage 2B, or higher than first reference voltage 1A and lower than second reference voltage 2A, or that bit line voltage 4 is higher than fifth reference voltage 3A or sixth reference voltage 3B, thereby determining the data D2 as "1".

With this arrangement, data can be read out while setting the largest voltage difference between the bit line voltage and the reference voltage.

Figure 48:
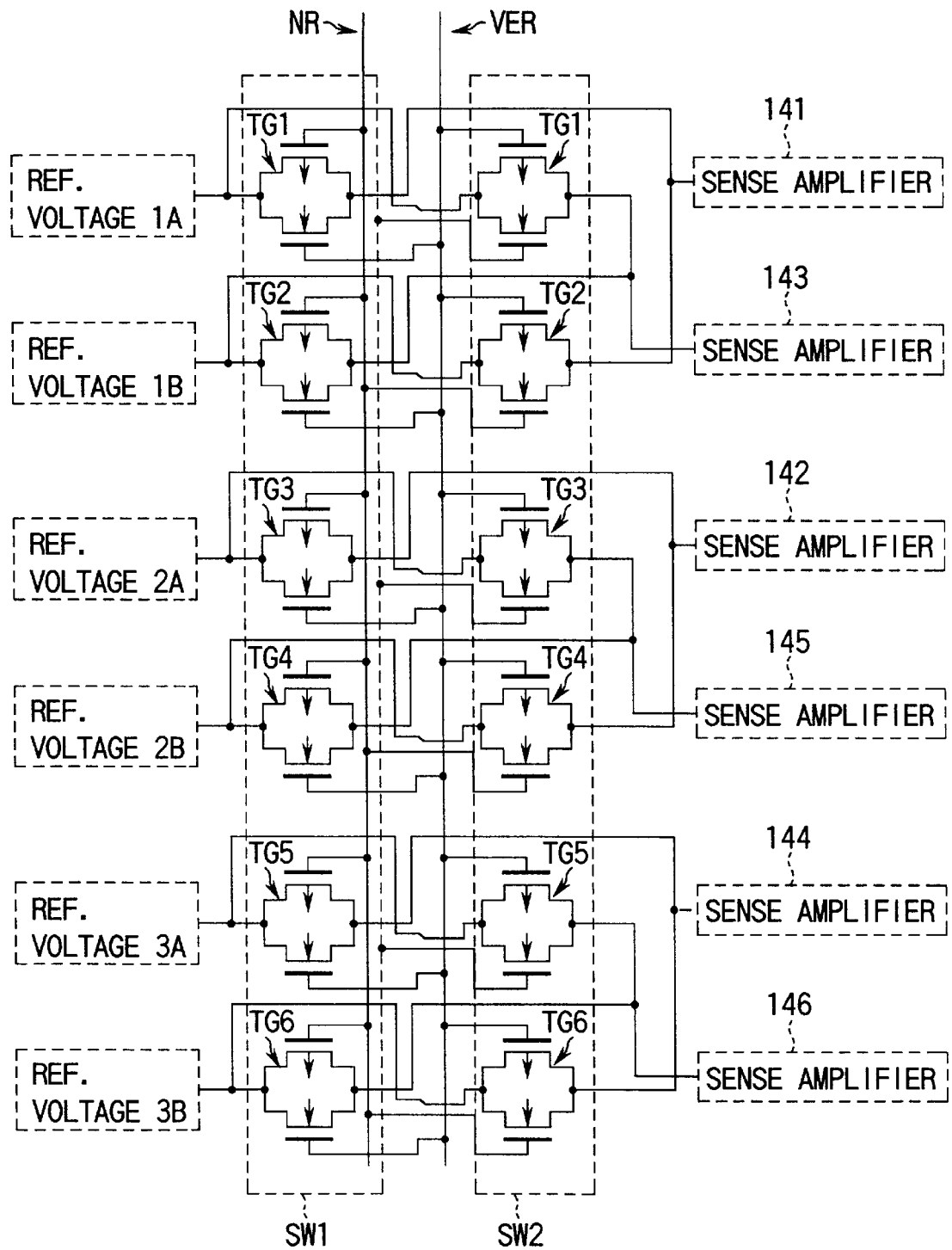
FIG. 48 is a circuit diagram showing a reference voltage switching circuit as an example of a reference voltage controller for changing a reference voltage to be supplied to the sense amplifier unit between a verify mode and a read mode in the ninth embodiment.

FIG. 48 shows a reference voltage switching circuit for switching the reference voltage and supplying it to the sense amplifier as an example of a reference voltage controller for changing the reference voltage to be supplied to the sense amplifier unit between the verify mode and the read mode in the ninth embodiment.

In the reference voltage switching circuit shown in FIG. 48, each of switching circuits SW1 and SW2 includes first to sixth CMOS transfer gates TG1 to TG6. Each of reference voltages 1A, 1B, 2A, 2B, 3A, and 3B is input to one terminal of a corresponding one of the first to sixth CMOS transfer gates TG1 to TG6, respectively.

Each of the first to sixth CMOS transfer gates TG1 to TG6 of the switching circuit SW1 is turned on when a signal NR is at "0", and a signal VER is at "1" (in the verify read mode) to supply the output from the other terminal to a corresponding one of the sense amplifiers 141 to 146.

To the contrary, each of the first to sixth CMOS transfer gates of the switching circuit SW2 is turned on when the signal NR is at "1", and the signal VER is at "0" (in the read mode) to supply the output from the other terminal to a corresponding one of the sense amplifiers 141 to 146.

The operation of the reference voltage switching circuit in FIG. 48 will be described next.

In the read mode, the signal NR is set at "1", and the signal VER is set at "0" to turn off the switching circuit SW1 and on the switching circuit SW2. Through the switching circuit SW2, reference voltage 1B is supplied to the sense amplifier 141, reference voltage 2B is supplied to the sense amplifier 142, reference voltage 1A is supplied to the sense amplifier 143, reference voltage 3B is supplied to the sense amplifier 144, reference voltage 2A is supplied to the sense amplifier 145, and reference voltage 3A is supplied to the sense amplifier 146.

In the verify mode, the signal NR is set at "0", and the signal VER is set at "1" to turn on the switching circuit SW1 and off the switching circuit SW2. Through the switching circuit SW1, reference voltage 1A is supplied to the sense amplifier 141, reference voltage 1B is supplied to the sense amplifier 143, second reference voltage 2A is supplied to the sense amplifier 142, second reference voltage 2B is supplied to the sense amplifier 145, third reference voltage 3A is supplied to the sense amplifier 144, and third reference voltage 3B is supplied to the sense amplifier 146.

Figure 49:
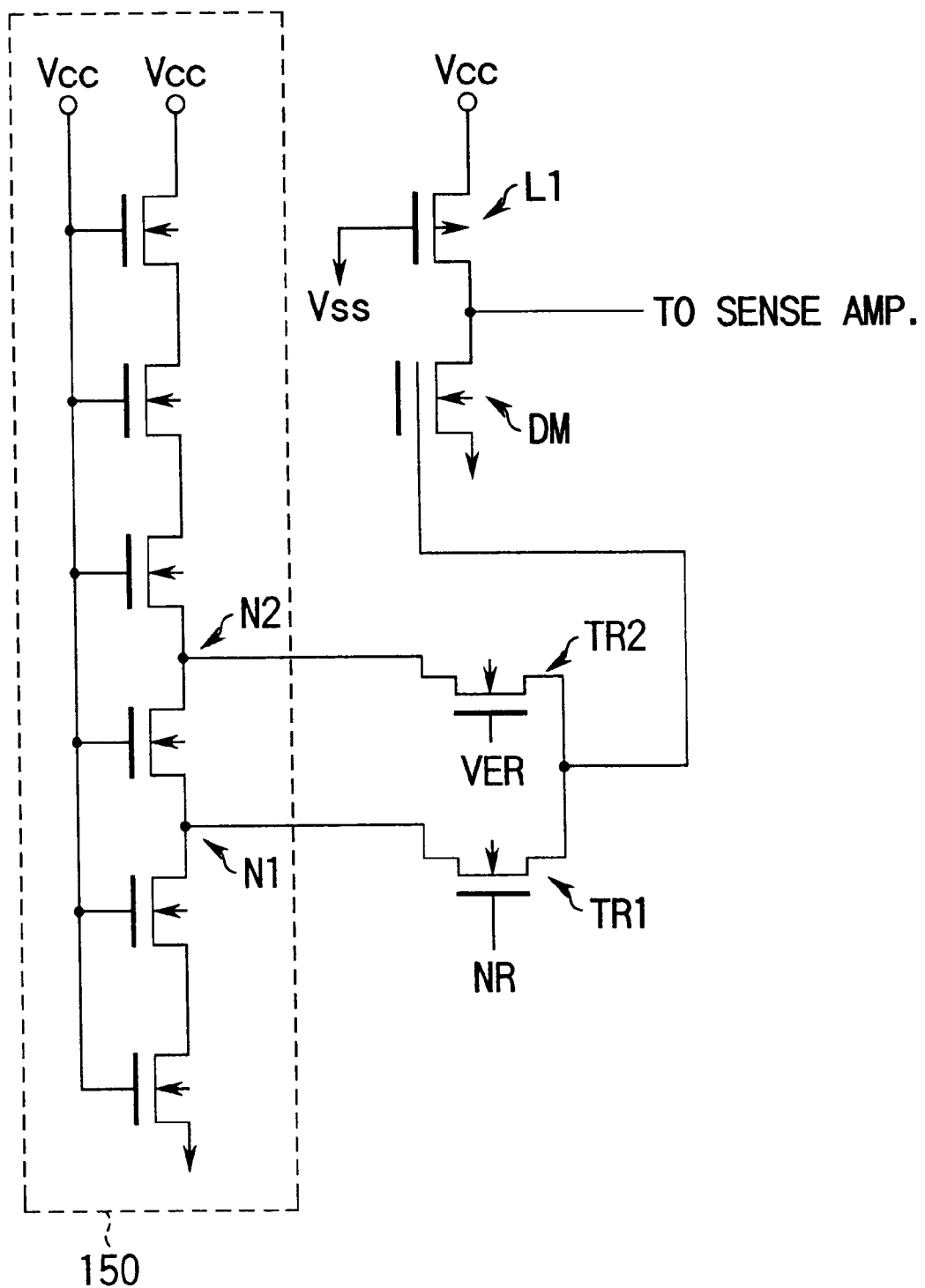
FIG. 49 is a circuit diagram showing a reference voltage changing circuit as another example of the reference voltage controller for changing the reference voltage to be supplied to the sense amplifier unit between a verify mode and a read mode in the ninth embodiment.

FIG. 49 shows, as another example of a reference voltage controller in the ninth embodiment, a reference voltage changing circuit which changes the reference voltage itself to be supplied to the sense amplifier between the verify mode and the read mode.

In the reference voltage changing circuit shown in FIG. 49, reference numeral 150 denotes a voltage divider constituted by connecting, e.g., a plurality of NMOS transistors in series between the power supply voltage and the ground voltage. Of the series connection points of the transistors, voltages at two nodes N1 and N2 (divided voltages) are selectively used.

The voltage at the node N1 is output through a transistor TR1 which is turned on when the signal NR is at "1" (in the read mode). The voltage at the node N2 is output through a transistor TR2 which is turned on when the signal VER is at "1" (in the verify mode).

The voltage output through the transistor TR1 or TR2 is supplied to the gate electrode (electrode corresponding to the floating gate of a memory cell) of a dummy cell DM. The source of this dummy cell DM is grounded, and the drain is connected to a load transistor L1, so the reference voltage output from the connection point between the dummy cell DM and the load transistor L1 is supplied to the sense amplifier.

The operation of the reference voltage changing circuit in FIG. 49 will be described next.

The reference voltage changing circuit in FIG. 49 changes the voltage to be supplied to the gate electrode of the dummy cell DM between the read mode and the verify mode, thereby changing the reference voltage.

The channel region of a memory cell is substantially controlled by the voltage of the floating gate. When a voltage is directly supplied to the gate electrode corresponding to the floating gate of the dummy cell DM equivalent to the memory cell, as shown in FIG. 49, the dummy cell DM can have the same voltage state as that of the floating gate of the selected memory cell. Therefore, the reference voltage can be properly generated in correspondence with the charge storage state of the floating gate of the memory cell.

To generate reference voltage 1A, a voltage between the voltage of the floating gate of the memory cell at bit line voltage 1 and that at bit line voltage 2 is supplied to the gate electrode of the dummy cell DM.

To generate reference voltage 1B, a voltage between the voltage of the floating gate of the memory cell at bit line voltage 1 and that at bit line voltage 2 and lower than the gate voltage at reference voltage 1A is supplied to the gate electrode of the dummy cell DM.

To generate second reference voltage 2A, a voltage between the voltage of the floating gate of the memory cell at bit line voltage 2 and that at bit line voltage 3 is supplied to the gate electrode of the dummy cell DM.

To generate second reference voltage 2B, a voltage between the voltage of the floating gate of the memory cell at bit line voltage 2 and that at bit line voltage 3 and lower than the gate voltage at second reference voltage 2A is supplied to the gate electrode of the dummy cell DM.

To generate third reference voltage 3A, a voltage between the voltage of the floating gate of the memory cell at bit line voltage 3 and that at bit line voltage 4 is supplied to the gate electrode of the dummy cell DM.

To generate third reference voltage 3B, a voltage between the voltage of the floating gate of the memory cell at bit line voltage 3 and that at bit line voltage 4 and lower than the gate voltage at third reference voltage 3A is supplied to the gate electrode of the dummy cell DM.

In FIG. 49, the reference voltage is supplied to the sense amplifier 142 in FIG. 45 in the ninth embodiment. In the read mode, the signal NR is set at "1", and the signal VER is set at "0" to turn on the transistor TR1 and off the transistor TR2. The voltage at the node N1 of the voltage divider 150 is supplied to the gate electrode corresponding to the floating gate of the dummy cell DM through the transistor TR1, so second reference voltage 2B is output from the connection point between the dummy cell DM and the load transistor L1 and supplied to the sense amplifier 142.

In the verify mode, the signal NR is set at "0", and the signal VER is set at "1" to turn off the transistor TR1 and on the transistor TR2. The voltage at the node N2 of the voltage divider 150, which is higher than that at the node N1, is supplied to the gate electrode corresponding to the floating gate of the dummy cell DM through the transistor TR2, so second reference voltage 2A lower than second reference voltage 2B by a predetermined value is output from the connection point between the dummy cell DM and the load transistor L1 and supplied to the sense amplifier 142. For the remaining sense amplifiers as well, the voltage at a corresponding node of the voltage divider is supplied through the switching-controlled transistor, so that a predetermined voltage is supplied to the gate electrode corresponding to the floating gate of the dummy cell DM in the read or verify to obtain a desired reference voltage.

Figure 2:
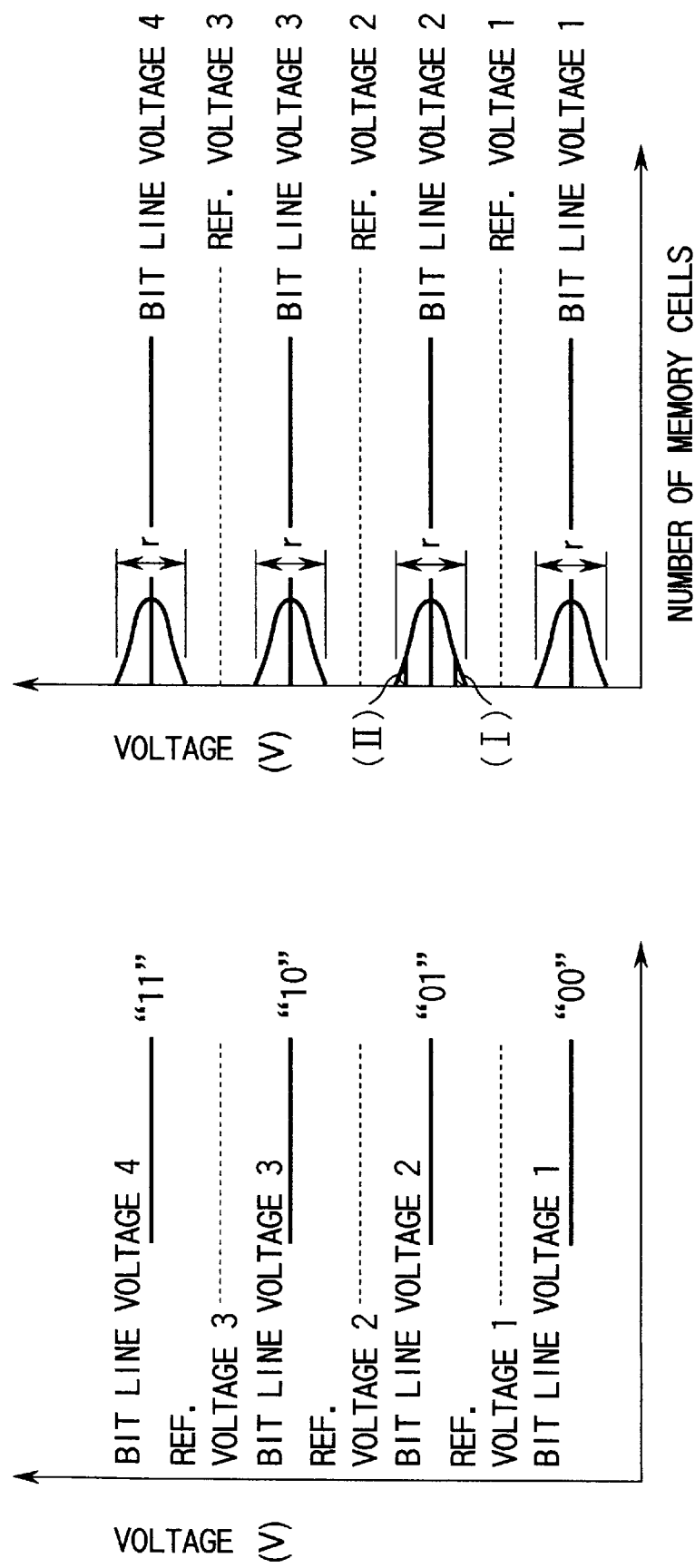
FIGS. 2A and 2B are charts showing the conventional relationship between reference voltages and bit line voltages.

As described above, in the ninth embodiment, when a memory cell having the threshold voltage Vth2 or Vth3 is to be detected, whether the bit line voltage is lower or higher than constant second reference voltage 2 is not detected, unlike the prior art shown in FIG. 2A. As shown in FIG. 46, when a memory cell having the threshold voltage Vth2 is to be detected, it is detected whether the bit line voltage is lower than second reference voltage 2B. When a memory cell having the threshold voltage Vth3 is to be detected, it is detected whether the bit line voltage is higher than second reference voltage 2A lower than second reference voltage 2B.

Since difference reference voltages are used to detect a memory cell having the threshold voltage Vth2 or Vth3, the voltage difference between the reference voltage and the bit line voltage can be increased. Therefore, the read rate can be increased, and the read margin can also be increased.

As described above, according to the ninth embodiment, the voltage difference between the reference voltage and the bit line voltage is larger in the read mode than that in the verify mode. Therefore, the read margin in the read mode can be increased as compared to the prior art.

Tenth Embodiment

Figure 50:
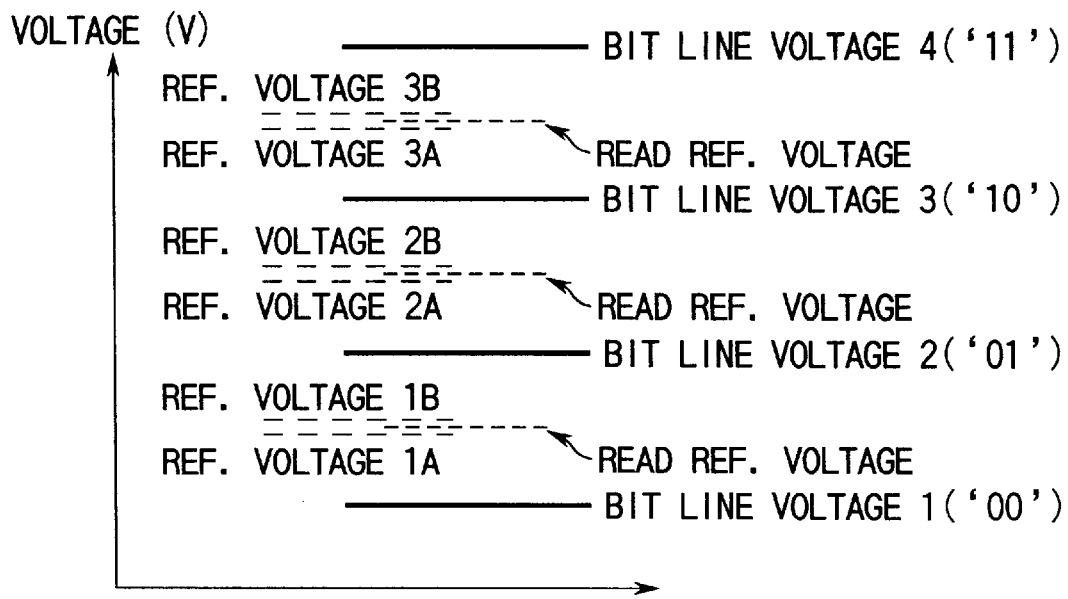
FIG. 50 is a chart showing a state wherein a reference voltage to be supplied to a sense amplifier unit changes between a verify mode and a read mode in a tenth embodiment of the present invention.

In the tenth embodiment, as shown in FIG. 50, in a verify mode, reference voltages 1A, 1B, 2A, 2B, 3A, and 3B are used to perform the verify operation and detect whether the bit line voltage has been set at a predetermined voltage, as in the ninth embodiment. In the read mode, reference voltages are set between reference voltages 1A and 1B, between reference voltages 2A and 2B, and between reference voltages 3A and 3B, and these three reference voltages are used to read data.

In this arrangement as well, the difference between the bit line voltage and the reference voltage can be increased as compared to the prior art, as in the ninth embodiment, so the read margin can be made large. Since three sense amplifiers suffice in the read mode, the current consumption at the sense amplifier unit can be reduced, as in the prior art.

Eleventh Embodiment

Figure 51:
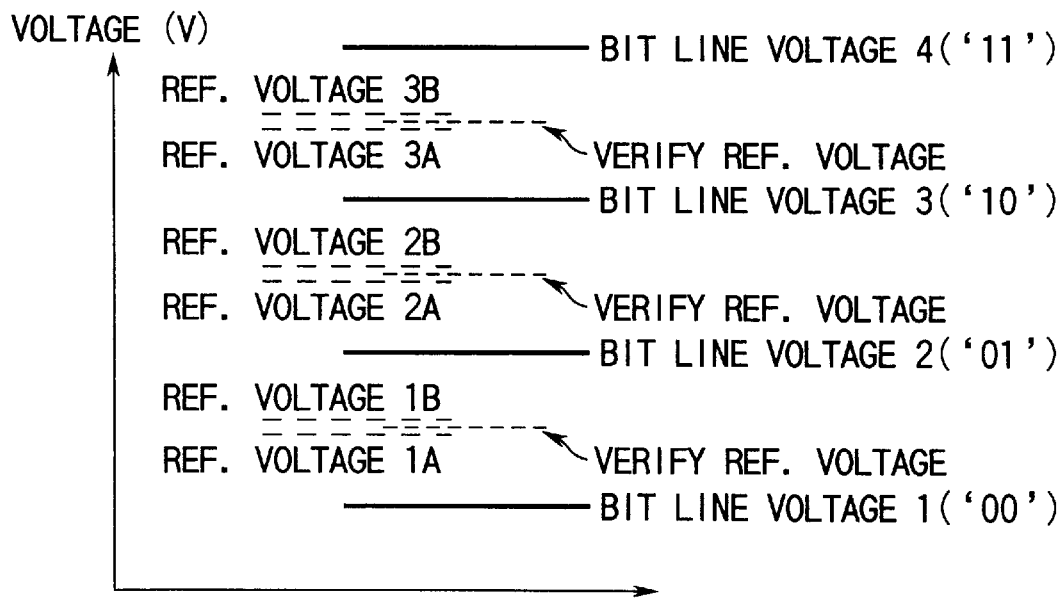
FIG. 51 is a chart showing a state wherein a reference voltage to be supplied to a sense amplifier unit changes between a verify mode and a read mode in an eleventh embodiment of the present invention.

In the eleventh embodiment, as shown in FIG. 51, in a read mode, reference voltages 1A, 1B, 2A, 2B, 3A, and 3B are used to perform the read, as in the ninth embodiment. In the verify mode, reference voltages are set between reference voltages 1A and 1B, between reference voltages 2A and 2B, and between reference voltages 3A and 3B, and these three reference voltages are used to detect whether the bit line voltage has been set at a predetermined voltage.

In this arrangement as well, the difference between the bit line voltage and the reference voltage in the read can be increased as compared to the prior art, as in the ninth embodiment, so the read margin can be made large.

Figure 11:
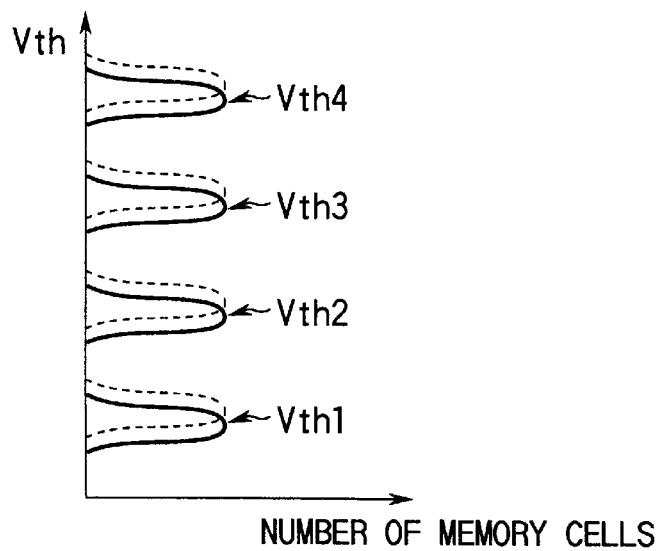
FIG. 11 is a chart for explaining the distribution of the threshold voltages of the nonvolatile memory cell shown in FIG. 1.

As shown in FIG. 11, the memory cell threshold voltage after the data erase operation and the write operation varies in a certain distribution for a threshold voltage to be set because of the variation in characteristics of memory cells. This distribution itself changes depending on each chip, as indicated by the broken lines. The twelfth embodiment for solving this problem will be described below.

Twelfth Embodiment

Figure 52:
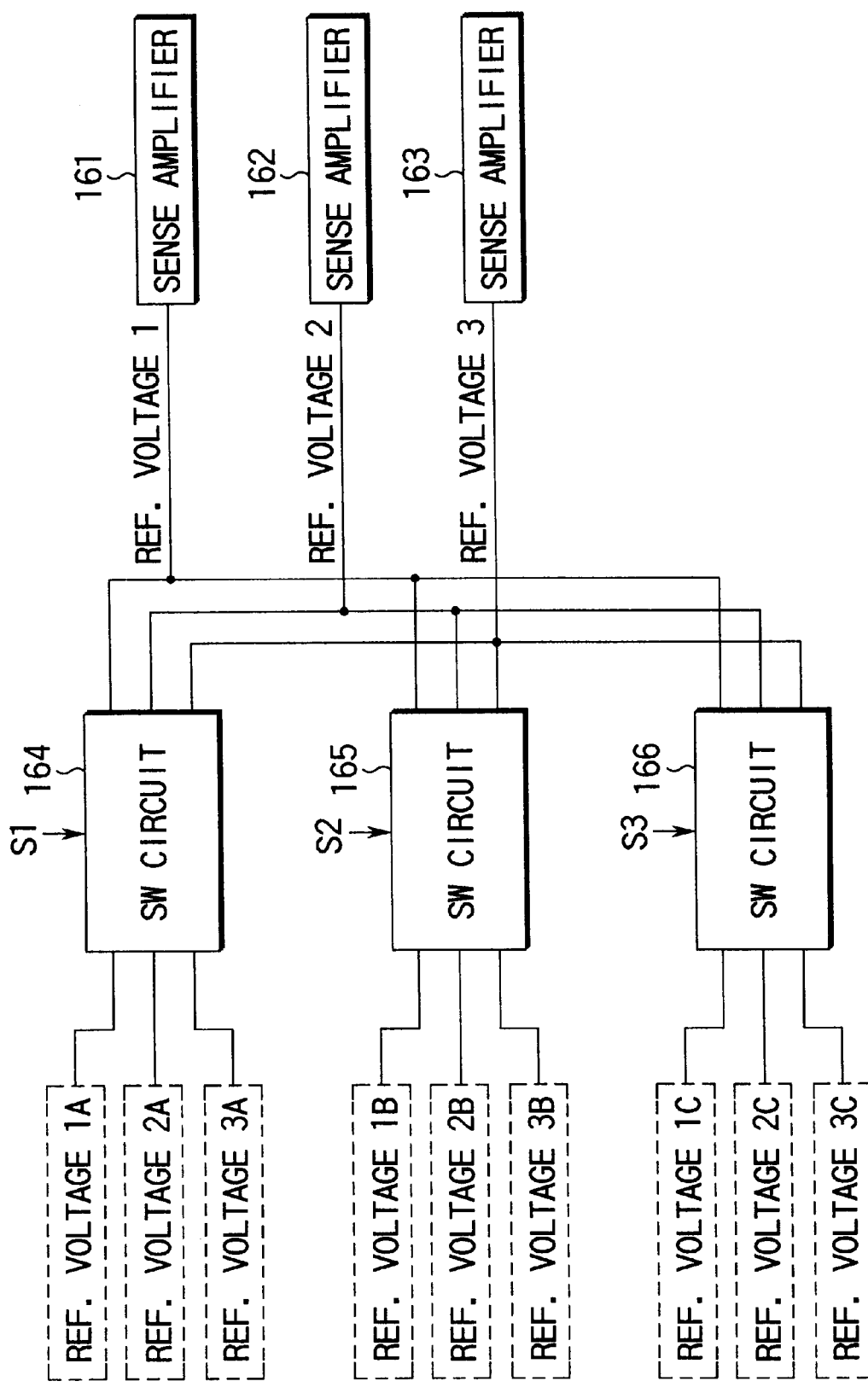
FIG. 52 is a block diagram showing the sense amplifier unit of a read system according to a twelfth embodiment of the present invention.

FIG. 52 shows the sense amplifier of a read system according to the twelfth embodiment.

For the sense amplifier unit shown in FIG. 52, three sets of different reference voltages are prepared. One of the three sets of reference voltages is selected by three switching circuits 164, 165, and 166 under the control of signals S1 to S3 and supplied to three sense amplifiers 161, 162, and 163 to read out data.

When the signal S1 is at "1", and both the signals S2 and S3 are at "0", the switching circuit 164 is selected, so reference voltages 1A, 2A, and 3A are supplied to the sense amplifiers 161, 162, and 163, respectively, through the switching circuit 164.

When the signal S2 is at "1", and both the signals S1 and S3 are at "0", the switching circuit 165 is selected, so reference voltages 1B, 2B, and 3B are supplied to the sense amplifiers 161, 162, and 163, respectively, through the switching circuit 165.

When the signal S3 is at "1", and both the signals S1 and S2 are at "0", the switching circuit 166 is selected. The reference voltages 1C, 2C, and 3C are supplied to the sense amplifiers 161, 162, and 163, respectively, through the switching circuit 166.

Figure 53:
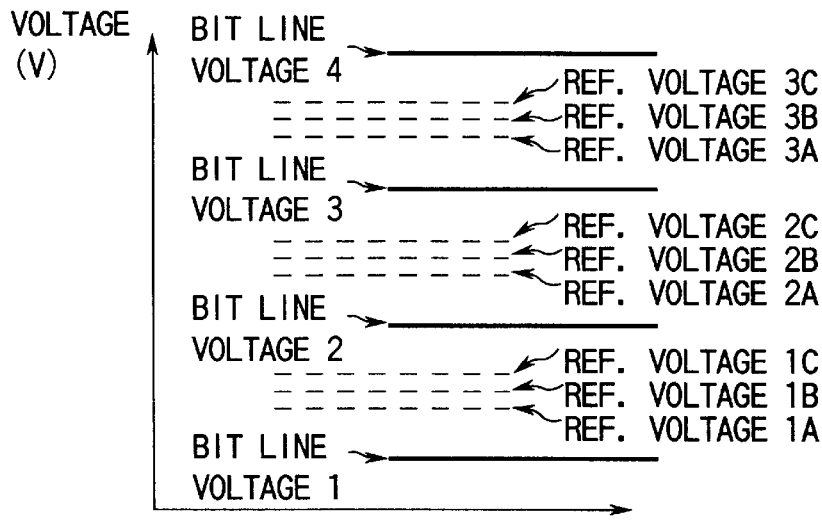
FIG. 53 is a chart for explaining the relationship in magnitude between a plurality of reference voltages to be supplied to sense amplifiers 1, 2, and 3 shown in FIG. 52.

FIG. 53 shows the relationship in magnitude between the reference voltages. The magnitudes of reference voltages 1A, 1B, and 1C to be supplied to the sense amplifier 161 as reference voltage 1 increase in this order. More specifically, reference voltage 1 to be supplied through the switching circuit 164 is the lowest in reference voltages 1, 2, and 3. Second reference voltage 2 to be supplied through the switching circuit 165 is the second highest in reference voltages 1, 2, and 3. Third reference voltage 3 to be supplied through the switching circuit 166 is the highest in reference voltages 1, 2, and 3.

The signals S1 to S3 may be set at "0" or "1" by connecting fuse devices (not shown) and cutting corresponding fuse devices. Alternatively, the signals S1 to S3 may be set by preparing the same transistor (not shown) as the memory cell and tuning on/off electron injection into the floating gate of the transistor.

In FIG. 52, three sets of different reference voltages are prepared. However, not the three sets of reference voltages but a plurality of sets of reference voltages may be prepared.

As described above, according to the twelfth embodiment, a plurality of (n) sets of reference voltages are prepared. The distribution or variation in bit line voltage corresponding to stored data is checked in units of chips, and an optimum set of reference voltages is selected in accordance with the plurality of signals S1 to Sn and supplied to the sense amplifiers. With this arrangement, since an optimum reference voltages can be supplied for each chip, the data read rate increases.

Thirteenth Embodiment

Figure 54:
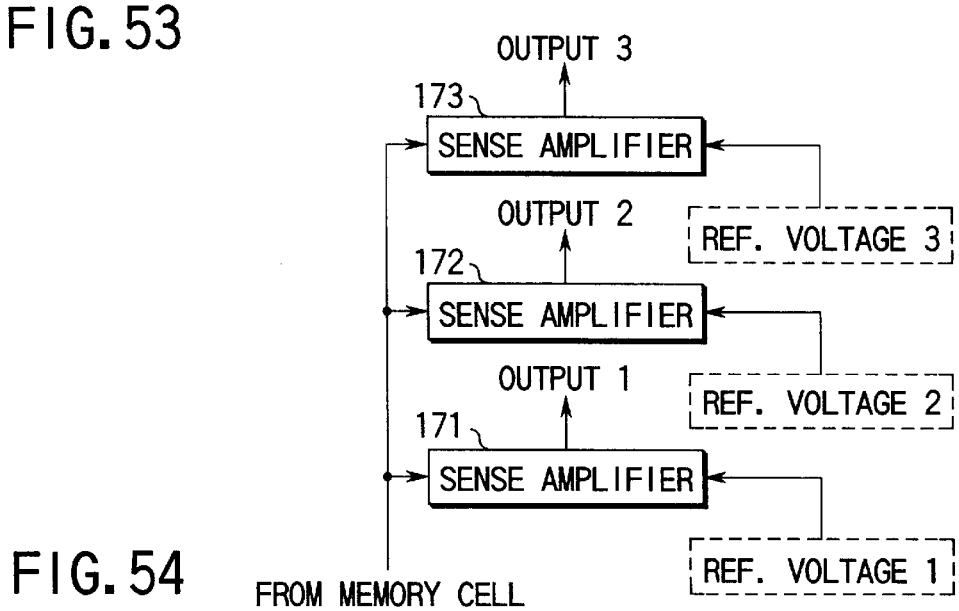
FIG. 54 is a block diagram showing the sense amplifier unit of a read system according to a thirteenth embodiment of the present invention.

FIG. 54 shows the sense amplifier unit of a read system according to the thirteenth embodiment.

Figure 55:
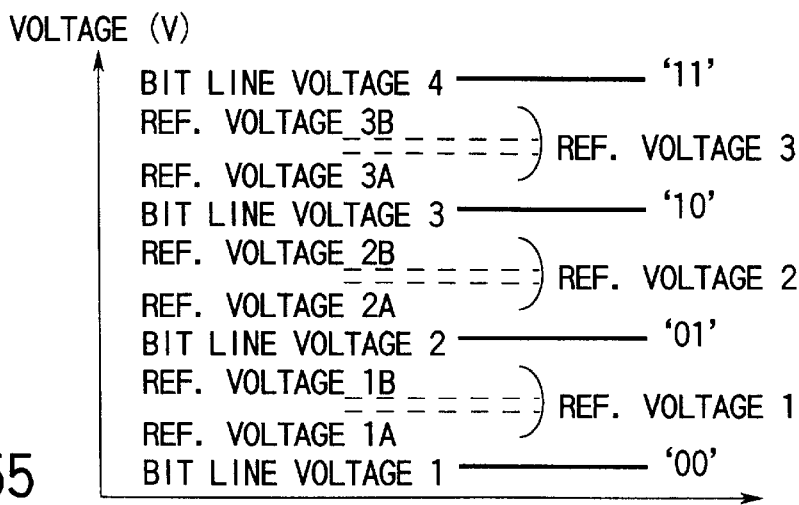
FIG. 55 is a chart for explaining the relationship in magnitude between reference voltages 1, 2, and 3 shown in FIG. 54 and bit line voltages 1, 2, 3, and 4.

FIG. 55 shows the relationship in magnitude between reference voltages 1, 2, and 3 in FIG. 54 and bit line voltages 1, 2, 3, and 4.

In the thirteenth embodiment, three sense amplifiers 171, 172, and 173 and six reference voltages 1A, 1B, 2A, 2B, 3A, and 3B are used. Reference voltages 1, 2, and 3 to be supplied to the sense amplifiers 171, 172, and 173 are changed in accordance with the bit line voltage in a read mode, thereby increasing the read margin.

In a verify mode, the same reading method as in the above embodiments may be used, or the conventional reading method may be used.

The reading method according to the thirteenth embodiment in the read mode will be described next. When bit line voltage 1 is to be detected, reference voltage 1B shown in FIG. 55 is supplied to the sense amplifier 171 as reference voltage 1, second reference voltage 2B shown in FIG. 55 is supplied to the sense amplifier 172 as second reference voltage 2, and third reference voltage 3B shown in FIG. 55 is supplied to the sense amplifier 173 as third reference voltage 3.

Bit line voltage 1 is compared with reference voltage 2B by the sense amplifier 171, so the voltage difference between the bit line voltage and the reference voltage can be increased. More specifically, when data is to be output from the memory cell, the margin can be increased with respect to the variation in power supply voltage due to a current for charging/discharging the external terminal.

If a new memory cell is selected, and the bit line voltage changes from bit line voltage 1 to bit line voltage 2, the bit line is charged. When the bit line voltage becomes higher than reference voltage 1B, the logic level of output 1 from the sense amplifier 171 changes from "0" to "1". On the basis of this change, reference voltage 1 to be supplied to the sense amplifier 171 is changed to reference voltage 1A.

Therefore, when the bit line voltage is set at bit line voltage 2, the voltage difference between bit line voltage 2 and reference voltage 1 (reference voltage 1A) can be increased.

As described above, the variation in power supply increases when data is output from the memory cell. If the difference between the reference voltage and the bit line voltage is small, a nd they change in opposite voltage directions due to the variation in power supply, erroneous data is output.

The difference between the reference voltage and the bit line voltage is preferably large, as described above. In the thirteenth embodiment, the output from the sense amplifier unit changes, and reference voltage 1 changes from 1B to 1A until the change in output from the sense amplifier is transmitted to, e.g., an output buffer circuit (not shown) and data is output from the output buffer circuit, thereby increasing the difference between the reference voltage and the bit line voltage. Therefore, the read margin can be increased.

Reference voltages 2 and 3 which are supplied to the sense amplifiers 172 and 173 at bit line voltage 2 do not change after detection of bit line voltage 1.

When bit line voltage 2 is to change to bit line voltage 1, the bit line is discharged. When the bit line voltage becomes lower than reference voltage 1A, the logic level of output 1 from the sense amplifier 171 changes. On the basis of this change, reference voltage 1 to be supplied to the sense amplifier 171 changes to reference voltage 1B.

When bit line voltage 2 is to change to bit line voltage 3, the bit line is charged. When the bit line voltage becomes higher than second reference voltage 2B, the logic level of output 2 from the sense amplifier 172 changes. On the basis of this change, second reference voltage 2 to be supplied to the sense amplifier 172 changes to second reference voltage 2A. At this time, reference voltages to be supplied to the sense amplifier 171 and 173 do not change.

When bit line voltage 3 is to change to bit line voltage 2, the bit line is discharged. When the bit line voltage becomes lower than second reference voltage 2A, the logic level of output 2 from the sense amplifier 172 changes. On the basis of this change, second reference voltage 2 to be supplied to the sense amplifier 172 changes to second reference voltage 2B.

When bit line voltage 3 is to change bit line voltage 4, the bit line is charged. When the bit line voltage becomes higher than third reference voltage 3B, the logic level of output 3 from the sense amplifier 173 changes. On the basis of this change, third reference voltage 3 to be supplied to the sense amplifier 173 changes to third reference voltage 3A. At this time, reference voltages to be supplied to the sense amplifiers 171 and 172 doe not change.

The relationship between outputs 1 to 3 from the sense amplifiers 171 to 173 and data (D1 and D2) stored in the memory cell is the same as that shown in FIG. 4.

Figure 56:
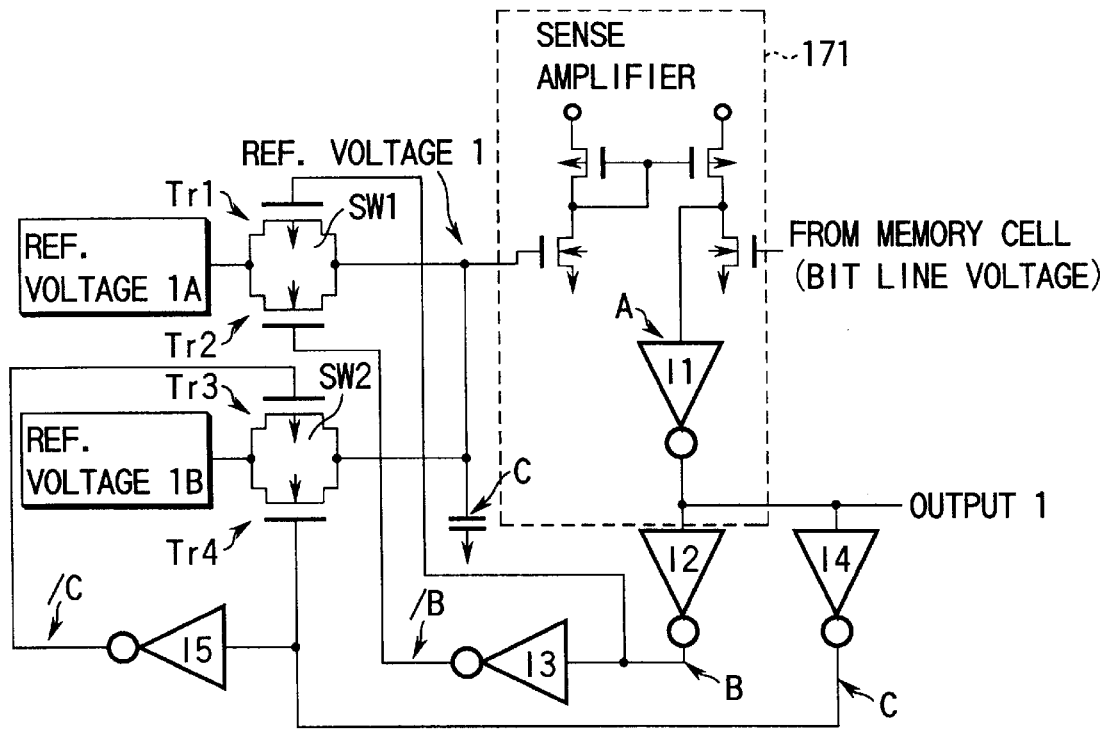
FIG. 56 is a circuit diagram showing an example of a circuit for supplying a reference voltage to the sense amplifier unit shown in FIG. 54.

FIG. 56 shows a circuit for supplying the reference voltage to the sense amplifier unit in the thirteenth embodiment.

In the reference voltage supply circuit shown in FIG. 56, the sense amplifier 171 has a differential type voltage comparator constituted by a pair of NMOS transistors having gates to which the bit line voltage and the reference voltage are input, and a PMOS current mirror circuit connected as a load for these NMOS transistors. The output from the voltage comparator, which is obtained by comparing the bit line voltage with reference voltage 1, is output through an inverter I1.

The output from the inverter I1 is inverted by an inverter I2 into a signal B or inverted by an inverter I4 into a signal C.

Reference voltage 1A is input to one terminal of a first switching circuit SW1 constituted by a PMOS transistor Tr1 and an NMOS transistor Tr2. Reference voltage 1B is input to one terminal of a second switching circuit SW2 constituted by a PMOS transistor Tr3 and an NMOS transistor Tr4. The first switching circuit SW1 is controlled by the signal B and a signal obtained by inverting the signal B by an inverter I3. The second switching circuit SW2 is controlled by the signal C and a signal obtained by inverting the signal C by an inverter I5. In this example, when the signal B is at level "0", the first switching circuit SW1 is turned on, and when the signal C is at level "1", the second switching circuit SW2 is turned on.

FIG. 56 shows only a circuit portion associated with the read operation.

FIG. 56 shows the sense amplifier 171 and the reference voltage switching circuit for switching and supplying corresponding reference voltage 1. The sense amplifiers 172 and 173 and corresponding reference voltage switching circuits can also have the same arrangement as described above.

The operation of the reference voltage switching circuit shown in FIG. 56 will be described next.

When the bit line voltage is bit line voltage 1, the bit line voltage is lower than reference voltage 1. Therefore, a node A of the differential sense amplifier 171 is at "1", and output 1 from the sense amplifier 171, i.e., the output from the inverter I1 to which the voltage at the node A is input is at "0". The outputs B and C from the inverters I2 and I4 to which output 1 is input are at "1". The output /B from the inverter I3 to which the output B is input is at "0". The output /C from the inverter I5 to which the output C is input is also at "0".

With this operation, the transistors Tr1 and Tr2 are turned off, and the transistors Tr3 and Tr4 are turned on. Reference voltage 1B is supplied to the sense amplifier 171 as reference voltage 1 through the transistors Tr3 and Tr4 in the ON state.

Next, the bit line is charged, and the bit line voltage becomes higher than reference voltage 1B. The node A changes to "0", and output 1, i.e., the output from the inverter I1 to which the voltage at the node A is input changes to "1". The outputs B and C from the inverters I2 and I4 to which output 1 is input change to "0". The output /B from the inverter I3 to which the output B is input changes to "1". The output /C from the inverter I5 to which the output C is input also changes to "1".

With this operation, the transistors Tr1 and Tr2 are turned on, and the transistors Tr3 and Tr4 are turned off. Reference voltage 1A is supplied to the sense amplifier 171 as reference voltage 1 through the transistors Tr1 and Tr2 in the ON state.

When bit line voltage 2 is to change to bit line voltage 1, the bit line is discharged. When the bit line voltage becomes lower than reference voltage 1A, output 1 from the sense amplifier 17 changes to "0". The outputs B and C from the inverters I2 and I4 to which output 1 is input change to "1". The output /B from the inverter I3 to which the output B is input changes to "0". The output /C from the inverter I5 to which the output C is input also changes to "0".

With this operation, the transistors Tr1 and Tr2 are turned off, and the transistors Tr3 and Tr4 are turned on. Reference voltage 1B is supplied to the sense amplifier 171 as reference voltage 1 through the transistors Tr3 and Tr4 in the ON state.

When bit line voltage 2 is to change to bit line voltage 3, the bit line is charged. However, since the bit line voltage is higher than reference voltage 1, output 1 from the sense amplifier 171 is kept at "1", so that reference voltage 1A is supplied to the sense amplifier 171 as reference voltage 1 through the transistors Tr1 and Tr2.

As described above, in the circuit shown in FIG. 56, the transistors Tr1 and Tr2 are controlled by the outputs from the inverters I2 and I3, respectively, and the transistors Tr3 and Tr4 are controlled by the outputs from the inverters I5 and I4, respectively. The reason for this is as follows. Since the inverters have different circuit threshold voltages, the transistors Tr1 to Tr4 are not simultaneously turned off, i.e., transistors Tr1 to Tr4 are prevented from being simultaneously turned off to prevent reference voltage 1 from electrically floating, and the ON period of the transistors Tr1 and Tr2 temporarily overlaps that of the transistors Tr3 and Tr4.

In the circuit shown in FIG. 56, to stabilize reference voltage 1, a capacitor C is inserted between the reference voltage input node and ground node of the sense amplifier 171. However, this capacitor C can be omitted.

Figure 57:
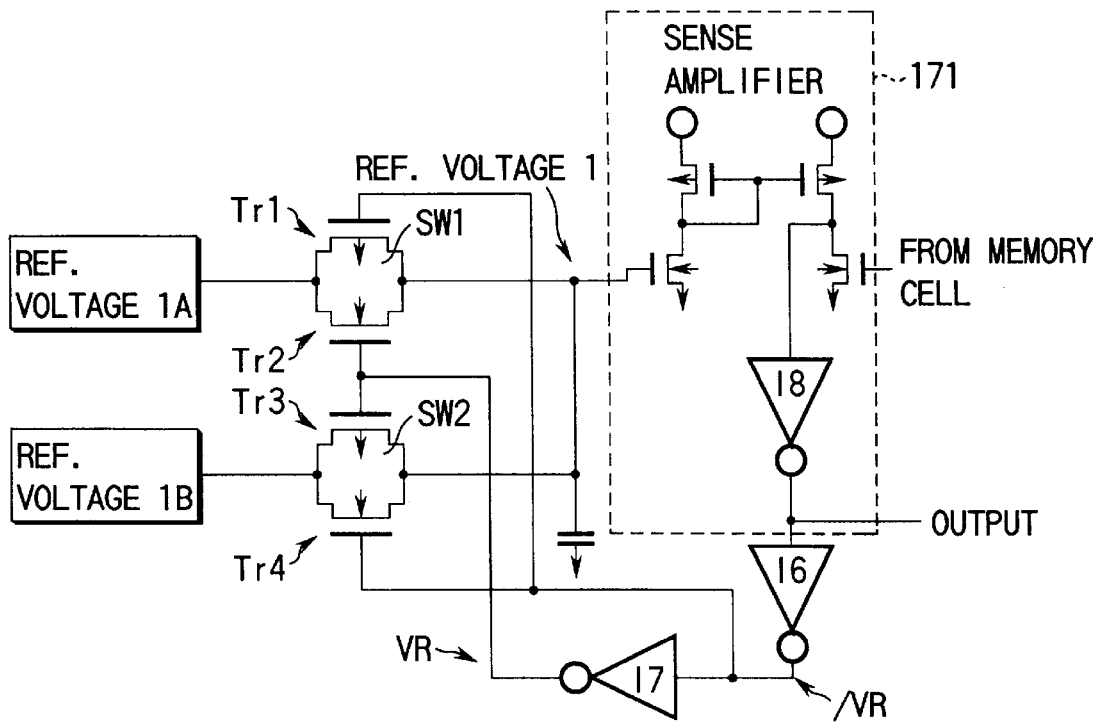
FIG. 57 is a circuit diagram showing another example of the circuit for supplying a reference voltage to the sense amplifier unit shown in FIG. 54.

FIG. 57 shows another example of the circuit for supplying the reference voltage to the sense amplifier unit in the thirteenth embodiment.

In the reference voltage supply circuit shown in FIG. 57, the sense amplifier 171 has a differential type voltage comparator constituted by a pair of NMOS transistors having gates to which the bit line voltage and the reference voltage are input, and a PMOS current mirror circuit connected as a load for these NMOS transistors. The output from the voltage comparator, which is obtained by comparing the bit line voltage with reference voltage 1, is output through an inverter I8.

The output from the inverter I8 is inverted by an inverter I6 into a signal /VR.

Reference voltage 1A is input to one terminal of the first switching circuit SW1 constituted by the PMOS transistor Tr1 and the NMOS transistor Tr2. Reference voltage 1B is input to one terminal of the second switching circuit SW2 constituted by the PMOS transistor Tr3 and the NMOS transistor Tr4. The first and second switching circuits SW1 and SW2 are complementarily ON/OFF-controlled by the signal /VR and a signal VR obtained by inverting the signal /VR through an inverter I7. In this example, when the signal /VR is at level "0", the first switching circuit SW1 is turned on. When the signal /VR is at level "1", the second switching circuit SW2 is turned on.

That is, in the reference voltage switching circuit shown in FIG. 57, instead of controlling the transistors Tr1, Tr2, Tr3, and Tr4 by the outputs from different inverters, like the reference voltage switching circuit shown in FIG. 56, the transistors Tr1 and Tr4 are controlled by the output from the inverter I6, and the transistors Tr2 and Tr3 are controlled by the output from the inverter I7. With this arrangement, the number of inverters can be reduced as compared to the reference voltage switching circuit shown in FIG. 56.

FIG. 57 shows only a circuit portion associated with the read operation.

FIG. 57 shows the sense amplifier 171 and the reference voltage switching circuit for switching and supplying corresponding reference voltage. The sense amplifiers 172 and 173 and corresponding reference voltage switching circuits can also have the same arrangement as described above.

The operation of the reference voltage switching circuit shown in FIG. 57 will be described next.

Let Vthn be the threshold voltages of the N-channel transistors Tr2 and Tr4, and Vthp (Vthp is a negative value) be the threshold voltages of the P-channel transistors Tr1 and Tr3. Also, let /VR be the output signal from the inverter I6, and VR be the output signal from the inverter I7. As for reference voltage 1A, when VR−Vthn≧reference voltage 1A, reference voltage 1=reference voltage 1A.

If VR−Vthn<reference voltage 1A, and the reference voltage 1 is higher than VR−Vthn, the transistor Tr2 is turned off. When reference voltage 1 is lower than VR−Vthn, reference voltage 1 is increased to VR−Vthn, so the transistor Tr2 is turned off.

When /VR−Vthp<reference voltage 1A, reference voltage 1=reference voltage 1A.

If /VR−Vthp≧reference voltage 1A, and reference voltage 1 is lower than /VR−Vthp, the transistor Tr1 is turned off. When reference voltage 1 is higher than /VR−Vthp, the reference voltage 1 is decreased to /VR−Vthp, so the transistor Tr1 is turned off.

As for reference voltage 1B, when /VR−Vthn≧reference voltage 1B, reference voltage 1=reference voltage 1B.

If /VR−Vthn<reference voltage 1B, and the reference voltage 1 is higher than /VR−Vthn, the transistor Tr4 is turned off. When reference voltage 1 is lower than /VR−Vthn, reference voltage 1 is increased to /VR−Vthn, so the transistor Tr4 is turned off.

When VR−Vthp<reference voltage 1B, reference voltage 1=reference voltage 1B.

If VR−Vthp≧reference voltage 1B, and reference voltage 1 is lower than VR−Vthp, the transistor Tr3 is turned off. When reference voltage 1 is higher than VR−Vthp, the reference voltage 1 is decreased to VR−Vthp, so the transistor Tr3 is turned off.

Reference voltage 1 does not electrically float when VR−Vthn≧reference voltage 1A, /VR−Vthp<reference voltage 1A, /VR−Vthn≧reference voltage 1B, or VR−Vthp<reference voltage 1B. VR will be considered. Reference voltage 1 does not electrically float when VR≧reference voltage 1A+Vthn, or VR<reference voltage 1B+Vthp. Reference voltage 1 does not electrically float when /VR<reference voltage 1A+Vthp, or /VR≧reference voltage 1B+Vthn.

Figure 58:
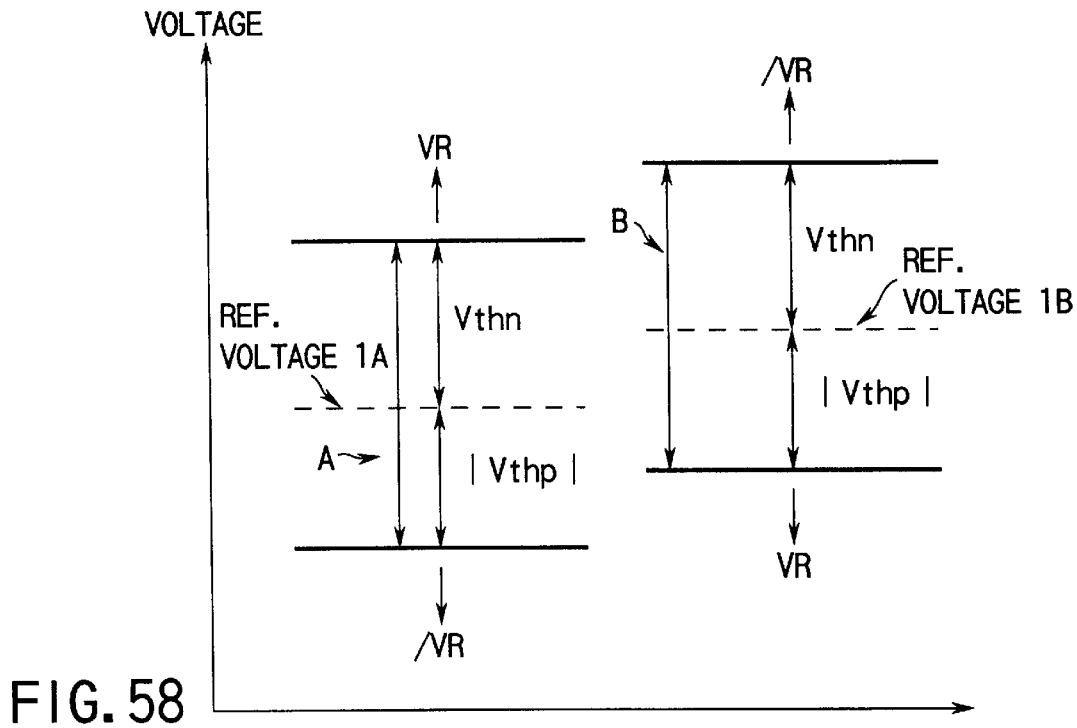
FIG. 58 is a chart for explaining the range of a region A or B where signals /VR and VR shown in FIG. 57 may electrically float.

More specifically, when the signal VR or /VR is in a region A or B in FIG. 58, reference voltage 1 may electrically float. However, as far as the time is short, no problem is posed. Therefore, it is desired that the response speed of the inverters I6 and I7 are determined so as to quickly change the signals VR and /VR.

Figure 59:
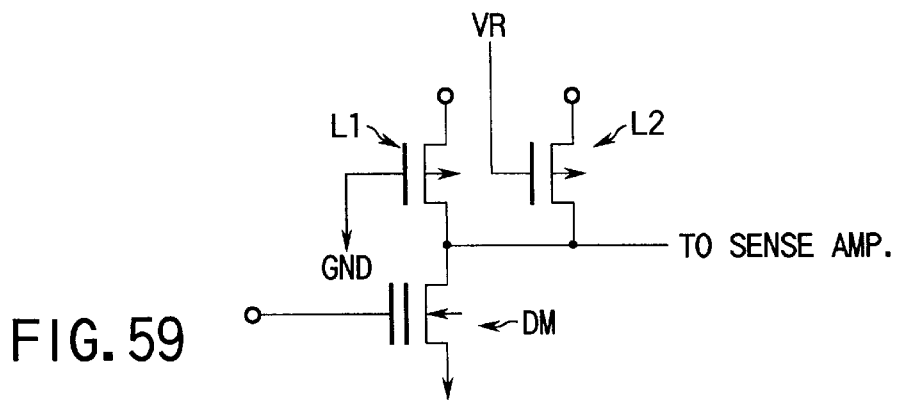
FIG. 59 is a circuit diagram showing still another example of the circuit for supplying a reference voltage to the sense amplifier unit shown in FIG. 54.

FIG. 59 shows still another example of the circuit for supplying the reference voltage to the sense amplifier unit in the thirteenth embodiment.

In the reference voltage supply circuit shown in FIG. 59, reference symbol DM denotes a reference voltage generation dummy cell formed by a transistor equivalent to a memory cell; and L1 and L2, PMOS transistors for a load transistor connected to the dummy cell DM. A signal output to the connection node between the dummy cell DM and the load transistor is supplied to the sense amplifier unit.

In this case, the first load transistor L1 and the second load transistor L2 are used as the load transistors for the dummy cell DM. The gate of the first load transistor L1 is connected to the ground voltage. The signal VR is supplied to the gate of the second load transistor L2. This signal VR is obtained by the same method as that for the signal VR in FIG. 57.

More specifically, in the reference voltage supply circuit shown in FIG. 59, instead of switching reference voltage 1A and reference voltage 1B by a switching circuit and supplying reference voltage 1 to the sense amplifier 171, like the reference voltage supply circuit shown in FIG. 56 or 57, the reference voltage is supplied by the dummy cell DM formed by a transistor equivalent to the memory cell and the first and second load transistors L1 and L2.

FIG. 59 shows the reference voltage switching circuit for supplying the reference voltage corresponding to the sense amplifier 171. The reference voltage switching circuits corresponding to the sense amplifiers 172 and 173 can also have the same arrangement as described above.

The operation of the reference voltage supply circuit shown in FIG. 59 will be described next.

When the signal VR is at "0", the second load transistor L2 is turned on, so that the two load transistors L1 and L2 serve as the load transistors for the memory cell. At this time, a reference voltage corresponding to reference voltage 1B is generated as reference voltage 1.

When the signal VR is at "1", the second load transistor L2 is turned off, so only the first load transistor L1 serves as the load transistor for the memory cell. At this time, a reference voltage corresponding to reference voltage 1A which is lower than that when both the first and second load transistors L1 and L2 are turned on is generated as reference voltage 1.

More specifically, for bit line voltage 1, since the signal VR is at "0", the second load transistor L2 is turned on to supply a reference voltage corresponding to reference voltage 1B to the sense amplifier 171 as reference voltage 1.

When the bit line voltage exceeds reference voltage 1 (reference voltage 1B), the signal VR changes to "1" to turn off the second load transistor L2. Reference voltage 1 is switched to a reference voltage corresponding to reference voltage 1A lower than reference voltage 1B and supplied to the sense amplifier 171.

When the reference voltage supply circuit shown in FIG. 59 is used, the reference voltage does not electrically float. Therefore, the electrically floating state need not particularly be taken into consideration.

In the examples shown in FIGS. 56 to 59, the reference voltage is changed in correspondence with a change in bit line voltage such that the difference between the bit line voltage and the reference voltage increases. These arrangements can be applied not only to a device which stores 2-bit data in one memory cell but also a device which stores 1-bit data in one memory cell, as a matter of course.

In the ninth to thirteenth embodiments, 2-bit data is stored in one memory cell. However, data having an arbitrary number of bits may be stored in one memory cell, as a matter of course.

A memory for storing 1.5-bit data in one nonvolatile memory cell will be described next.

Fourteenth Embodiment

Figure 60:
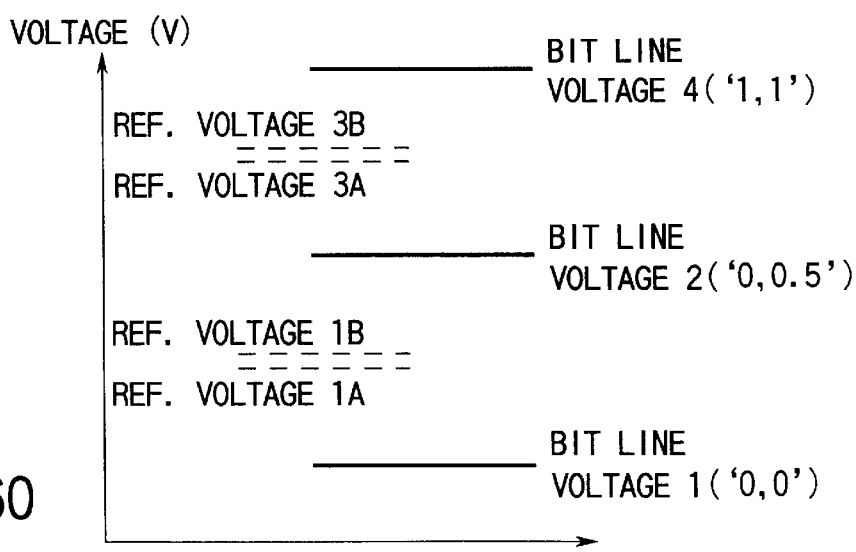
FIG. 60 is a block diagram showing the sense amplifier unit of a read system according to the fourteenth embodiment.

FIG. 60 shows the relationship in magnitude between a bit line voltage and a reference voltage used in a sense amplifier unit to store 1.5-bit data in one memory cell in the fourteenth embodiment.

In the fourteenth embodiment, four reference voltages 1A, 1B, 3A, and 3B are used to discriminate three bit line voltages (bit line voltages 1, 2, and 3). That is, the threshold voltage of one memory cell is set at one of three bit line voltages.

When two memory cells are used, eight of nine combinations of the threshold voltages of the two memory cells can be selected to store 3-bit data (D1, D2, and D3).

In the fourteenth embodiment as well, a data read operation may be performed by a method similar to the ninth to thirteenth embodiments.

As has been described above, according to the present invention, a nonvolatile semiconductor memory device capable of minimizing the difference in read rate between selected memory cells, a method of verifying data written in this nonvolatile semiconductor memory device, a nonvolatile semiconductor memory device capable of minimizing the write time for writing data to be stored using a plurality of threshold voltages, and a method of writing data in this nonvolatile semiconductor memory device are provided.

In addition, a nonvolatile semiconductor memory device capable of shortening the time for writing data in a memory cell and also precisely setting the threshold voltage even in storing data of a plurality of bits in one memory cell is obtained.

Furthermore, when at least 2-bit data are stored in one memory cell, the data read operation is divisionally performed in at least two steps. Since the current supply capability of the load transistor for the memory cell can be optimized for each read operation, control can be performed to increase the voltage difference between the reference voltage to be supplied to the sense amplifier and the bit line voltage, so the read margin can be increased.

In addition, the voltage difference between the reference voltage and the bit line voltage in the read mode is made larger than that in the verify mode. Therefore, the data read margin in the read mode can be increased as compared to the prior art. Furthermore, since the reference voltage can be set in correspondence with the write state of a chip after the manufacture of the chip, an optimum reference voltage can be supplied in units of chips.

In the nonvolatile semiconductor memory device of the present invention, the reference voltage to be supplied to the sense amplifier in correspondence with the bit line voltage is changed such that the voltage difference between the bit line voltage and the reference voltage is increased, so the margin in the read mode can also be further increased.

The present invention is not limited to the above-described embodiments, and various changes and modifications can be made within the spirit and scope of the invention.

I claim:

1. A nonvolatile semiconductor memory device comprising:

a memory cell array having row lines and column lines and formed of a plurality of memory cells, each having a drain, a source, a floating gate, and a control gate, and storing data of a plurality of bits by storing different numbers of electrons in said floating gate, the control gates of the memory cells in a row being commonly connected to one of said row lines, and the memory cells in a column being commonly connected to one of said column lines; and source voltage setting means for changing a voltage of the sources of said memory cell array in correspondence with data to be written in a data write operation.

2. A device according to claim 1, in which said source voltage setting means comprises a transistor having a drain connected to said sources of said memory cell array and a source connected to a reference voltage, said transistor having a resistance value changing in correspondence with the data to be written in the data write operation.

3. A device according to claim 1, in which the data of the plurality of bits to be written in said memory cell have different addresses.

4. A device according to claim 1, in which the data of the plurality of bits to be written in said memory cell has a plurality of output bits.

5. A device according to claim 1, in which the data of the plurality of bits to be written in said memory cell have the same address.

6. A device according to claim 1, in which a plurality of said memory cell array are provided.

7. A device according to claim 6, in which the plurality of memory cell array sections have the same output bits.

8. A device according to claim 6, in which data are simultaneously written in the plurality of memory cell array blocks.

9. A nonvolatile semiconductor memory device comprising:

a memory cell array having a plurality of memory cell blocks, each memory cell block including plural memory cells arranged in a matrix, each memory cell including a drain, a source, a floating gate, and a control gate, storing data of a plurality of bits by storing different amounts of electrons in said floating gate, the control gates of memory cells of one row being commonly connected to one of a plurality of row lines, the drains of memory cells of one column being commonly connected to one of a plurality of column lines, and the sources of said memory cells being commonly connected; and source voltage setting means for changing a voltage of said source in correspondence with data to be written in a data write operation, said source voltage setting means being arranged for each memory cell block.

10. A device according to claim 9, in which the data of the plurality of bits to be written in said memory cell have different addresses.

11. A device according to claim 9, in which the data of the plurality of bits to be written in said memory cell has a plurality of output bits.

12. A device according to claim 9, in which a plurality of said memory cell array are provided.

13. A device according to claim 9, in which corresponding memory cell blocks in a plurality of memory cell arrays store identical bit output data.

14. A device according to claim 9, in which data are simultaneously written in said plurality of memory cell blocks in said memory cell array.

15. A nonvolatile semiconductor memory device comprising:
a memory cell array having row lines and column lines and formed of a plurality of memory cells, each having a drain, a source, a charge storage portion, and a control gate, and storing data of a plurality of bits by storing different numbers of electrons in said charge storage portion, the control gates of the memory cells in a same row being commonly connected to one of said row lines, and the memory cells in a same column being commonly connected to one of said column lines; and
program means for writing data simultaneously in at least two memory cells connected to the same row line, when two threshold voltages are to be set to said at least two memory cells, the program means first sets a threshold voltage to one of said at least two memory cells corresponding to a lower threshold voltage and then sets a threshold voltage to another one of said at least two memory cells corresponding to a higher threshold voltage, and the program means injects electrons into the charge storage portion of the memory cell corresponding to the higher threshold voltage as well as injects electrons into the charge storage portion of the memory cell corresponding to the lower threshold voltage.

16. A device according to claim 15, in which said program means supplies a voltage corresponding to data when writes data into said memory cell.

17. A device according to claim 15, which further comprises erase means for changing the data stored in said memory cells to predetermined data, before said program means selectively writes data into the memory cells.

18. A device according to claim 15, in which said program means applies a first voltage to the row line and injects electrons the charge storage portion of the memory cell corresponding to the lower threshold voltage as well as the memory cell corresponding to the higher threshold voltage when the threshold voltage is set to the memory cell corresponding to the lower threshold voltage, and then applies a second voltage which is higher than the first voltage to the row line and injects electrons the charge storage portion of the memory cell corresponding to the higher threshold voltage when the threshold voltage is set to the memory cell corresponding to the higher threshold voltage.

19. A nonvolatile semiconductor memory device comprising:
a memory cell array section including plural memory cell arrays, each array having row lines and column lines and formed of a plurality of memory cells, each having a drain, a source, a charge storage portion, and a control gate, and storing data of a plurality of bits by storing different numbers of electrons in said charge storage portion, the control gates of the memory cells in a same row being commonly connected to one of said row lines, and the memory cells in a same column being commonly connected to one of said column lines;
plural output circuits, connected to said plural memory cell arrays, for outputting data stored in said memory cell to an external of the memory device; and
program means, in response to data written to the memory cell, for writing data simultaneously in memory cells of said plural memory cell arrays, when two threshold voltages are to be set to said memory cells of said plural memory cell arrays, the program means first sets a threshold voltage to the memory cell corresponding to a lower threshold voltage and then sets a threshold voltage to the memory cell corresponding to a higher threshold voltage, and the program means injects electrons into the charge storage portion of the memory cell corresponding to the higher threshold voltage as well as injects electrons into the charge storage portion of the memory cell corresponding to the lower threshold voltage.

20. A device according to claim 19, in which corresponding row lines of said plural memory cell arrays are connected to each other.

21. A device according to claim 19, in which said program means supplies a voltage corresponding to data when writes data into said memory cell.

22. A device according to claim 20, in which said program means supplies a voltage corresponding to data when writes data into said memory cell.

23. A device according to claim 19, in which said program means supplies a first voltage to the control gate of the memory cell corresponding to the lower threshold voltage and to the control gate of the memory cell corresponding to the higher threshold voltage to inject electrons into the storage portion of the memory cell corresponding to the lower threshold voltage and to the storage portion of the memory cell corresponding to the higher threshold voltage when the threshold voltage is to be set to said memory cell corresponding to the lower threshold voltage, and then supplies a second voltage which is higher in voltage than the first voltage to the control gate of the memory cell corresponding to the higher threshold voltage to inject electrons into the storage portion of the memory cell corresponding to the higher threshold voltage when the threshold voltage is to be set to said memory cell corresponding to the higher threshold voltage.

24. A device according to claim 20, in which said program means supplies a first voltage to the control gate of the memory cell corresponding to the lower threshold voltage and to the control gate of the memory cell corresponding to the higher threshold voltage to inject electrons into the storage portion of the memory cell corresponding to the lower threshold voltage and to the storage portion of the memory cell corresponding to the higher threshold voltage when the threshold voltage is to be set to said memory cell corresponding to the lower threshold voltage, and then supplies a second voltage which is higher in voltage than the first voltage to the control gate of the memory cell corresponding to the higher threshold voltage to inject electrons into the storage portion of the memory cell corresponding to the higher threshold voltage when the threshold voltage is to be set to said memory cell corresponding to the higher threshold voltage.

25. A device according to claim 21, in which said program means supplies a first voltage to the control gate of the memory cell corresponding to the lower threshold voltage and to the control gate of the memory cell corresponding to the higher threshold voltage to inject electrons into the storage portion of the memory cell corresponding to the lower threshold voltage and to the storage portion of the memory cell corresponding to the higher threshold voltage when the threshold voltage is to be set to said memory cell corresponding to the lower threshold voltage, and then supplies a second voltage which is higher in voltage than the first voltage to the control gate of the memory cell corresponding to the higher threshold voltage to inject electrons into the storage portion of the memory cell corresponding to the higher threshold voltage when the threshold voltage is to be set to said memory cell corresponding to the higher threshold voltage.

26. A device according to claim 22, in which said program means supplies a first voltage to the control gate of the memory cell corresponding to the lower threshold voltage and to the control gate of the memory cell corresponding to the higher threshold voltage to inject electrons into the storage portion of the memory cell corresponding to the lower threshold voltage and to the storage portion of the memory cell corresponding to the higher threshold voltage when the threshold voltage is to be set to said memory cell corresponding to the lower threshold voltage, and then supplies a second voltage which is higher in voltage than the first voltage to the control gate of the memory cell corresponding to the higher threshold voltage to inject electrons into the storage portion of the memory cell corresponding to the higher threshold voltage when the threshold voltage is to be set to said memory cell corresponding to the higher threshold voltage.

27. A device according to any one of claims 19 to 26, which further comprises erase means for changing the data stored in said memory cells to predetermined data, before said program means selectively writes data into the memory cells.

* * * * *